(12) United States Patent
Takaya et al.

(10) Patent No.: US 6,713,162 B2
(45) Date of Patent: Mar. 30, 2004

(54) ELECTRONIC PARTS

(75) Inventors: Minoru Takaya, Tokyo (JP); Toshikazu Endo, Tokyo (JP)

(73) Assignee: TDK Corporation, Tokyo (JP)

( * ) Notice: Subject to any disclaimer, the term of this patent is extended or adjusted under 35 U.S.C. 154(b) by 370 days.

(21) Appl. No.: 09/749,472

(22) Filed: Dec. 28, 2000

(65) Prior Publication Data

US 2002/0009577 A1 Jan. 24, 2002

(30) Foreign Application Priority Data

May 31, 2000 (JP) ........................................ 2000-163418

(51) Int. Cl.$^7$ ................................................. B32B 3/00
(52) U.S. Cl. .................... 428/209; 428/212; 428/293.4; 428/402; 428/403; 428/404; 428/692; 428/694 BA; 333/184; 333/185; 336/200; 336/232
(58) Field of Search ............................... 428/209, 402.1, 428/212, 403, 293.41, 404, 684 BA, 632; 333/184, 185; 336/200, 232

(56) References Cited

U.S. PATENT DOCUMENTS

| | | | |
|---|---|---|---|
| 5,490,422 A | * | 2/1996 | Tabota et al. ............ 73/514.34 |
| 5,723,395 A | * | 3/1998 | Suzuki et al. ............... 501/134 |
| 5,892,668 A | | 4/1999 | Okamoto et al. |
| 5,945,892 A | | 8/1999 | Kato et al. |
| 6,008,151 A | * | 12/1999 | Sasaki et al. ................. 501/17 |
| 6,108,192 A | * | 8/2000 | Sugimoto et al. ........ 361/321.1 |
| 6,147,573 A | * | 11/2000 | Kumagai et al. ........... 333/185 |
| 6,235,221 B1 | * | 5/2001 | Suzuki et al. ............... 252/514 |
| 6,239,715 B1 | * | 5/2001 | Belton ..................... 340/691.3 |

FOREIGN PATENT DOCUMENTS

| | | | |
|---|---|---|---|
| EP | 0 844 625 | | 5/1998 |
| JP | 1192620 | * | 7/1999 |
| JP | 11-317311 | | 11/1999 |

\* cited by examiner

Primary Examiner—Leszek Kiliman
(74) Attorney, Agent, or Firm—Oblon, Spivak, McClelland, Maier & Neustadt, P.C.

(57) ABSTRACT

Using plural layers selected from among composite resin substrates having a fully high or low dielectric constant, composite resin substrates having a fully high magnetic permeability, and composite resin substrate layers having a fully high Q value, the invention provides a multilayer electronic part of small size having high performance and improved overall electrical characteristics. The multilayer electronic part includes constituent layers of at least two types formed of composite materials and a conductor layer formed on at least one composite material layer, wherein the conductor layer constructs a predetermined electric circuit.

7 Claims, 45 Drawing Sheets

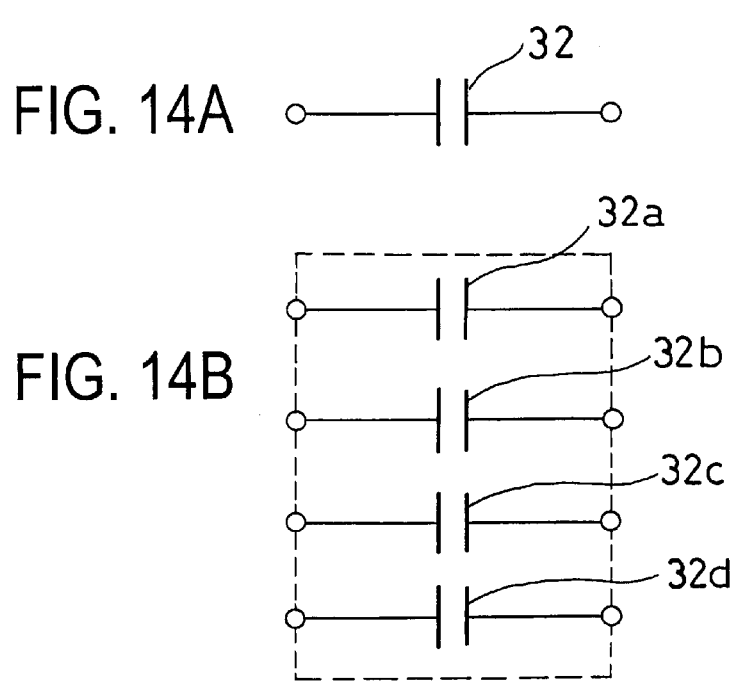
FIG. 14A
FIG. 14B
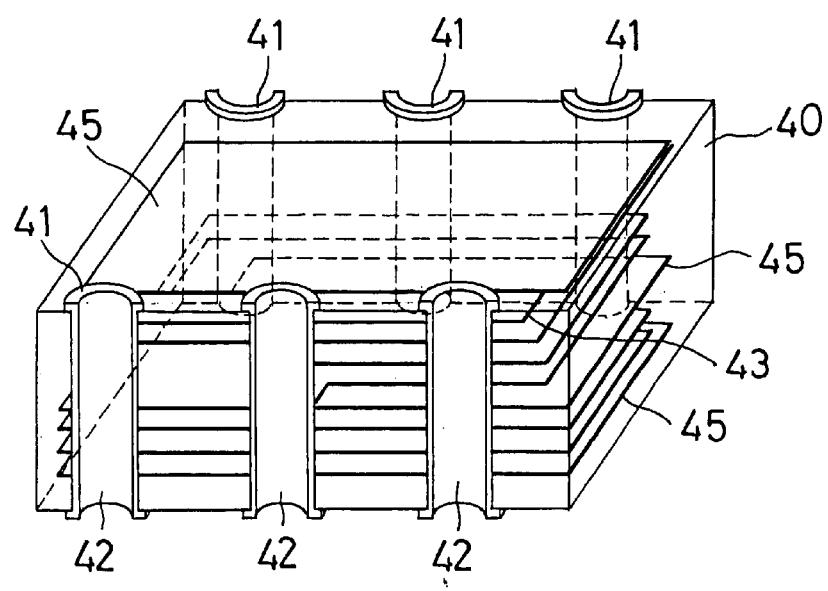
FIG. 15

FIG. 32
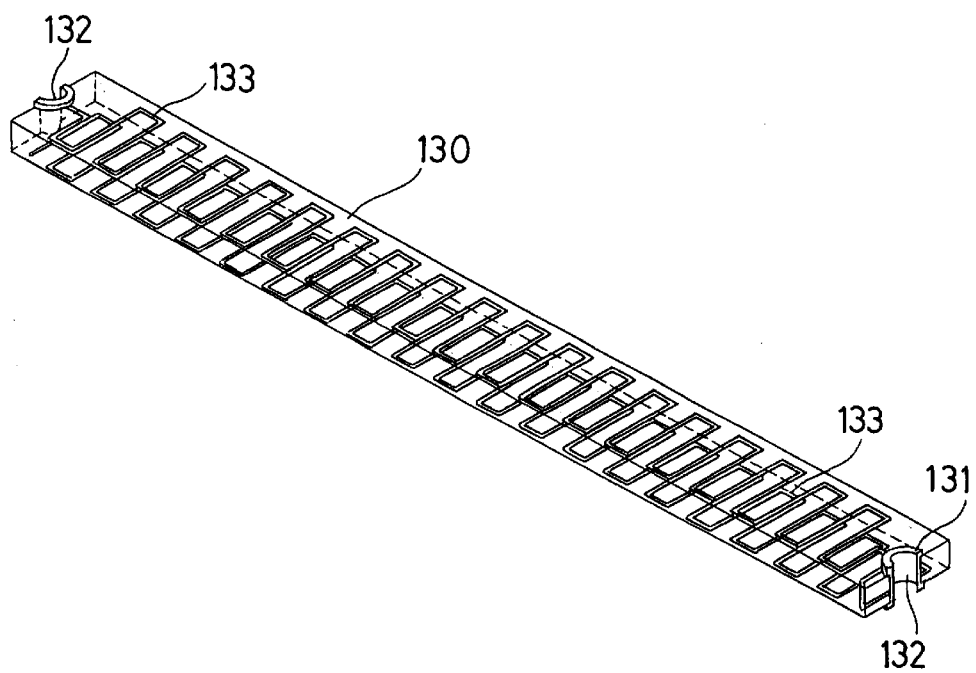
FIG. 33A
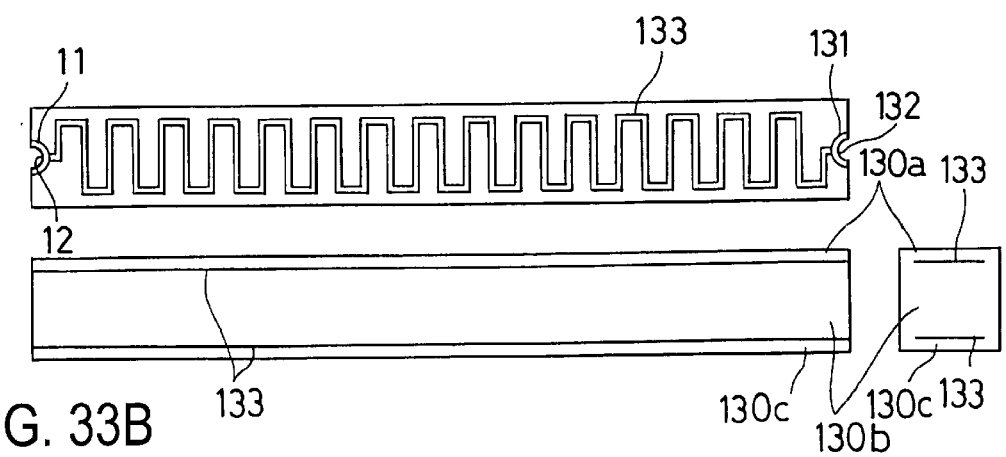
FIG. 33B
FIG. 33C

ELECTRONIC PARTS

This invention relates to electronic parts and multilayer circuits using prepreg and substrate, and more particularly, to such electronic parts suitable for operation in a high frequency region of at least 100 MHz and for use in magnetic characteristics-utilizing applications and magnetic shields.

BACKGROUND OF THE INVENTION

In the field of electronic equipment for communication, commercial and industrial applications, the current mounting technology seeks further miniaturization and higher density packaging. Concomitant with this trend, materials are required to have better heat resistance, dimensional stability, electrical characteristics and moldability.

Known electronic parts or multilayer substrates for high frequency operation include sintered ferrite and sintered ceramics which are laminated and molded into substrate form. Laminating such materials into multilayer substrates has been practiced in the art because of the advantage of potential miniaturization.

The use of sintered ferrite and sintered ceramics, however, gives rise to several problems. A number of steps are involved in firing and thick film printing. Sintered materials suffer from inherent defects including cracks and warp caused by firing. Cracks are also induced by the differential thermal expansion between sintered material and printed circuit board. It is thus increasingly required to replace the sintered materials by resinous materials.

With resinous materials as such, however, a satisfactory dielectric constant is arrived at with great difficulty, and little improvement in magnetic permeability is achievable. Then, electronic parts utilizing resinous materials as such fail to provide satisfactory characteristics and become large in size, rendering it difficult to reduce the size and thickness of electronic parts.

It is also known from JP-A 8-69712 and JP-A 11-192620 to mix resinous materials with ceramic powder into composite materials. These composite materials, however, have unsatisfactory high-frequency characteristics and magnetic characteristics.

Also, JP-B 6-14600 discloses the sheeting technique of forming plural materials into layers, followed by lamination. This method involves a number of steps. The operating frequency of the multilayer part referred to in this patent is several megahertz at maximum. No study is made on the performance of the multilayer part in the high-frequency region of at least 100 MHz.

SUMMARY OF THE INVENTION

An object of the invention is to provide a multilayer electronic part having the advantages of small size, excellent performance and improved overall electrical characteristics, using plural layers selected from among composite resin substrates having a sufficiently high or low dielectric constant, composite resin substrates having a sufficiently high dielectric constant, and composite resin substrate layers having a sufficiently high Q value.

According to the invention, there is provided a multilayer electronic part comprising constituent layers of at least two types formed of hybrid or composite materials and a conductor layer formed on at least one composite material layer, the conductor layer constructing a predetermined electric circuit.

The multilayer electronic part is typically used in a frequency band of at least 100 MHz. Preferably the constituent layers include a layer containing at least reinforcing fibers. Also preferably, the constituent layers include at least one layer containing at least one flame retardant.

In a first preferred embodiment, the constituent layers include at least one first composite dielectric layer in which a dielectric powder having a dielectric constant (or relative permittivity) of 5 to 10,000 and a dielectric dissipation factor of 0.00002 to 0.01 is dispersed in an amount of 10 to 65% by volume such that the first composite dielectric layer has a dielectric constant of 5 to 20 and a dielectric dissipation factor of 0.0025 to 0.0075.

In a second preferred embodiment, the constituent layers include at least one second composite dielectric layer in which a dielectric powder having a dielectric constant of 20 to 20,000 and a dielectric dissipation factor of 0.01 to 0.0001 is dispersed in an amount of 10 to 65% by volume such that the second composite dielectric layer has a dielectric constant of 10 to 40 and a dielectric dissipation factor of 0.0075 to 0.025.

In a third preferred embodiment, the constituent layers include at least one composite magnetic layer in which a magnetic powder is dispersed in an amount of 10 to 65% by volume such that the composite magnetic layer has a magnetic permeability of 3 to 20.

According to the invention, multilayer substrates are constructed using a composite material of at least a resin and a magnetic powder and a composite material of at least a resin and a dielectric powder. There can be obtained magnetic substrates having a low dielectric constant and excellent high-frequency characteristics and dielectric substrates having excellent high-frequency characteristics. As a consequence, a multilayer electronic part having excellent overall high-frequency characteristics is obtainable.

BRIEF DESCRIPTION OF THE DRAWINGS

FIGS. 14A and 14B are equivalent circuit diagrams of the capacitors.

FIGS. 15 to 17 illustrate a balun transformer as one exemplary electronic part of the invention.

FIGS. 32 to 34 illustrate an antenna as one exemplary electronic part of the invention.

DESCRIPTION OF THE PREFERRED EMBODIMENT

Figure 1:
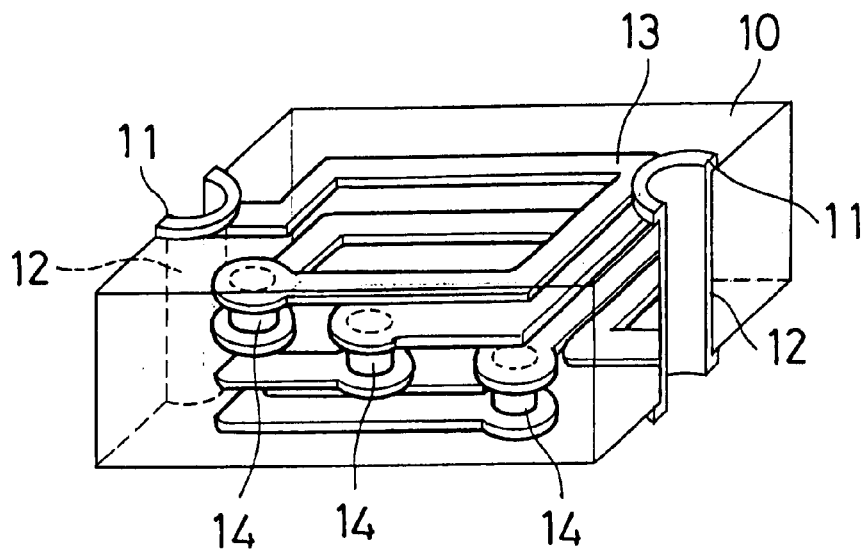
FIGS. 1 and 2 illustrate an inductor as one exemplary electronic part of the invention.

The multilayer electronic part of the invention includes at least two different constituent layers formed of hybrid or composite materials and a conductor layer formed on at least one composite material layer. A predetermined electric circuit is constructed by the conductor layer.

This construction enables to adjust a dielectric constant $\epsilon$ and to provide a lower dielectric constant so that the part is suited for use in the high-frequency region of at least 100 MHz, and especially 100 MHz to 10 GHz. The composite magnetic material layers are suitable for use in magnetic characteristic-utilizing applications and as magnetic shields. On the other hand, the composite dielectric material layers can provide a relatively high Q and $\epsilon$ value in the high-frequency band, and yields a composite dielectric material substrate suited for use in the application where such characteristics are required, for example, such electronic parts as strip lines, impedance matching circuits, delay circuits, and antennas. High strength is another advantage.

When substrates or multilayer electronic parts are fabricated using the composite magnetic material layers or composite dielectric material layers, the invention enables bonding with copper foil without a need for adhesive, patterning, and lamination. Such patterning and lamination can be conducted through the same steps as conventional substrate manufacturing steps, contributing to a cost reduction and efficient manufacture. Electronic parts using the thus fabricated substrates have a high strength and improved high-frequency characteristics.

The invention is now described in further detail.

The resin used in the multilayer electronic part is not critical. A proper choice may be made among resin materials having good moldability, processability, adhesion during stacking, and electrical characteristics. Specifically, thermosetting resins and thermoplastic resins are preferred.

The thermosetting resins which can be used herein include epoxy resins, phenolic resins, unsaturated polyester resins, vinyl ester resins, polyimide resins, polyphenylene ether (or oxide) resins, bismaleimide triazine (or cyanate) resins, fumarate resins, and polybutadiene resins. The thermoplastic resins which can be used herein include aromatic polyester resins, polyphenylene sulfide resins, polyethylene terephthalate resins, polybutylene terephthalate resins, polyethylene sulfide resins, polyether ether ketone resins, polytetrafluoroethylene resins, and graft resins. Among these, phenolic resins, epoxy resins, low dielectric constant epoxy resins, polybutadiene resins, and BT resins are preferred as the base resin.

These resins may be used alone or in admixture of two or more. Mixtures may have any desired mixing ratio of two or more resin components.

The multilayer electronic part preferably has at least one organic dielectric layer formed of the above resin and having a dielectric constant of 2.4 to 4.5 and a dielectric dissipation factor of 0.002 to 0.03. Such an organic dielectric layer is especially suited in forming inductor devices such as coils since it can minimize the distributed capacitance.

In one preferred embodiment, the multilayer electronic part includes at least one first composite dielectric layer in which a dielectric powder having a dielectric constant of 5 to 10,000 and a dielectric dissipation factor of 0.01 to 0.00002 is dispersed in the resin in an amount of 10 to 65% by volume such that the first composite dielectric layer has a dielectric constant of 5 to 20 and a dielectric dissipation factor of 0.0025 to 0.0075. This embodiment provides an adequate dielectric constant and a high Q value and hence, a reduced transmission loss, and is suitable in forming such electronic circuits as balun (balanced-and-unbalanced) transformers, antennas and power amplifiers.

In another preferred embodiment, the multilayer electronic part includes at least one second composite dielectric layer in which a dielectric powder having a dielectric constant of 20 to 20,000 and a dielectric dissipation factor of 0.05 to 0.0001 is dispersed in the resin in an amount of 10 to 65% by volume such that the second composite dielectric layer has a dielectric constant of 10 to 40 and a dielectric dissipation factor of 0.0075 to 0.025. This embodiment provides an adequate Q value and a high dielectric constant, and is suitable in forming such electronic circuits as capacitors, patch antennas, voltage controlled oscillators (VCO) and power amplifiers.

In a further preferred embodiment, the multilayer electronic part includes at least one composite magnetic layer in which a magnetic powder is dispersed in the resin in an amount of 10 to 65% by volume such that the composite magnetic layer has a magnetic permeability of 3 to 20. This embodiment provides a low dielectric constant while keeping an adequate magnetic permeability, allowing the part to be used in the high-frequency region of at least 100 MHz, and especially 100 MHz to 10 GHz. These features, combined with the content of magnetic powder which can be increased, enable use as electronic parts utilizing magnetic characteristics and magnetic shields for electronic parts.

The above-mentioned constituent layers differ in at least one of dielectric constant, Q value, and magnetic permeability. It suffices that at least two layers which differ in at least one parameter be included. For example, among the constituent layers of the above-mentioned three classes, one exemplary combination is at least two layers which belong to one same class, but differ in at least one parameter, another exemplary combination is at least two layers which belong to different classes (and naturally differ in at least one parameter), and so forth. Such layers are properly combined so as to meet the particular construction and function of an electronic part.

Any ceramic powder may be used herein insofar as it has a greater dielectric constant and Q value in the high-frequency region than the resin serving as a dispersing medium. It is acceptable to use two or more types of ceramic powders.

Preferably, a ceramic powder having a dielectric constant of 10 to 20,000 and a dielectric dissipation factor of up to 0.05 is used.

Where it is desired to provide a relatively high dielectric constant, the following materials are preferably used. Preferred materials include titanium-barium-neodymium base ceramics, titanium-barium-tin base ceramics, lead-calcium base ceramics, titanium dioxide base ceramics, barium titanate base ceramics, lead titanate base ceramics, strontium titanate base ceramics, calcium titanate ceramics, bismuth titanate base ceramics, magnesium titanate base ceramics, $CaWO_4$ base ceramics, $Ba(Mg,Nb)O_3$ base ceramics, $Ba(Mg,Ta)O_3$ base ceramics, $Ba(Co,Mg,Nb)O_3$ base ceramics, and $Ba(Co,Mg,Ta)O_3$ base ceramics. The titanium dioxide base ceramics include one consisting of titanium dioxide and those ceramics containing minor amounts of additives in addition to titanium dioxide, while they should maintain the crystalline structure of titanium dioxide. The same applies to the remaining ceramics. Of the titanium dioxide base ceramics, those having the rutile structure are preferred.

Where it is desired to provide a high Q without excessively increasing a dielectric constant, the following materials are preferably used. Preferred materials include silica, alumina, zirconia, potassium titanate whiskers, calcium titanate whiskers, barium titanate whiskers, zinc oxide whiskers, chopped glass, glass beads, carbon fibers, and magnesium oxide (or talc).

These materials may be used alone or in admixture of two or more. Mixtures may have any desired mixing ratio of two or more components.

The ceramic powder or particles should preferably have a mean particle size of 0.1 to 100 μm, especially 0.2 to 100 μm, so that ceramic particles are effectively milled with the resin. Too small a particle size corresponds to a greater surface area, which may increase the viscosity and thixotropy upon dispersion and mixing, obstructing high loading of ceramic particles and smooth milling with the resin. Too large a particle size may interfere with uniform dispersion and mixing, and allow for substantial settlement, resulting in a heterogeneous system. Then a composition having a larger content of ceramic powder of such large particle size may fail to form a consolidated layer when molded.

The content of ceramic powder is generally from 10% by volume to 65% by volume provided that the total of the resin and ceramic powder is 100% by volume. Preferably, the content of ceramic powder is 20 to 60% by volume.

The ceramic powder in the first composite dielectric layer should have a high Q and a moderate dielectric constant. Specifically, the ceramic powder should preferably have a dielectric constant of 5 to 10,000 and a dielectric dissipation factor of 0.01 to 0.00002 at 2 GHz, and further preferably a Q value of 250 to 50,000. With this choice, a composite dielectric material having a high Q and dielectric constant is obtainable.

The ceramic powder is contained in the first composite dielectric layer such that the first composite dielectric layer in its entirety has a dielectric constant of 5 to 20 and a dielectric dissipation factor of 0.0025 to 0.0075.

The ceramic powder may also be single crystal sapphire (or similar) powder or polycrystalline alumina powder. Of these and the above-mentioned powders, preferred types of ceramic powder are powders of dielectrics based on the following compositions. The compositions are shown together with their dielectric constant $\epsilon$ and Q at 2 GHz.

| Composition | $\epsilon$ | Q |
|---|---|---|
| $Mg_2SiO_4$ | 7 | 20,000 |
| $Al_2O_3$ | 9.8 | 40,000 |
| $MgTiO_3$ | 17 | 22,000 |
| $ZnTiO_3$ | 26 | 800 |
| $Zn_2TiO_4$ | 15 | 700 |
| $TiO_2$ | 104 | 15,000 |
| $CaTiO_3$ | 170 | 1,800 |
| $SrTiO_3$ | 255 | 700 |
| $SrZrO_3$ | 30 | 1,200 |
| $BaTi_2O_5$ | 42 | 5,700 |
| $BaTi_4O_9$ | 38 | 9,000 |
| $Ba_2Ti_9O_{20}$ | 39 | 9,000 |
| $Ba_2(Ti,Sn)_9O_{20}$ | 37 | 5,000 |
| $ZrTiO_4$ | 39 | 7,000 |
| $(Zr,Sn)TiO_4$ | 38 | 7,000 |
| $BaNd_2Ti_5O_{14}$ | 83 | 2,100 |
| $BaSm_2TiO_{14}$ | 74 | 2,400 |
| $Bi_2O_3$-$BaO$-$Nd_2O_3$-$TiO_2$ | 88 | 2,000 |
| $PbO$-$BaO$-$Nd_2O_3$-$TiO_2$ | 90 | 5,200 |
| $(Bi_2O_3,PbO)$-$BaO$-$Nd_2O_3$-$TiO_2$ | 105 | 2,500 |
| $La_2Ti_2O_7$ | 44 | 4,000 |
| $Nd_2Ti_2O_7$ | 37 | 1,100 |
| $(Li,Sm)TiO_3$ | 81 | 2,050 |
| $Ba(Mg_{1/3}Ta_{2/3})O_3$ | 25 | 35,000 |
| $Ba(Zn_{1/3}Ta_{2/3})O_3$ | 30 | 14,000 |
| $Ba(Zn_{1/3}Nb_{2/3})O_3$ | 41 | 9,200 |
| $Sr(Zn_{1/3}Nb_{2/3})O_3$ | 40 | 4,000 |

Preferred among others are those dielectrics based on the compositions: $TiO_2$, $CaTiO_3$, $SrTiO_3$, $BaO$—$Nd_2O_3$—$TiO_2$, $Bi_2O_3$—BaO—$Nd_2O_3$—$TiO_2$, $BaTi_4O_9$, $Ba_2Ti_9O_{20}$, $Ba_2(Ti,Sn)_9O_{20}$, MgO—$TiO_2$, ZnO—$TiO_2$, MgO—$SiO_2$, and $Al_2O_3$.

The first composite dielectric layer contains the resin and ceramic powder as main components. The content of ceramic powder is generally from 10% by volume to 65% by volume provided that the total of the resin and ceramic powder is 100% by volume. Preferably, the content of ceramic powder is 20 to 60% by volume.

A ceramic powder content of more than 65% by volume may fail to provide a consolidated layer and rather result in a substantial drop of Q as compared with ceramic powder-free compositions. With less than 10% by volume, ceramic powder may fail to exert the desired effect.

By properly selecting the respective components within the above range, the first composite dielectric layer can have a greater dielectric constant than that of the resin alone, that is, have a dielectric constant as desired and a high Q.

The ceramic powder in the second composite dielectric layer should have a very high dielectric constant.

The ceramic powder should preferably have a dielectric constant of 20 to 20,000 and a dielectric dissipation factor of 0.05 to 0.0001. By dispersing such ceramic powder in the resin, a composite dielectric material having a higher dielectric constant is obtainable.

Any desired ceramic powder may be used in the second composite dielectric layer as long as the second composite dielectric layer in its entirety has a dielectric constant of 10 to 40 and a dielectric dissipation factor of 0.0075 to 0.025 in the high-frequency region, especially at 2 GHz. It is acceptable to use two or more ceramic powders. Preferred types of ceramic powder are powders of dielectrics based on the following compositions. The compositions are shown together with their dielectric constant $\epsilon$ at 2 GHz.

| Composition | $\epsilon$ |
|---|---|
| $BaTiO_3$ | 1,500 |
| $(Ba,Pb)TiO_3$ | 6,000 |
| $Ba(Ti,Zr)O_3$ | 9,000 |
| $(Ba,Sr)TiO_3$ | 7,000 |

Preferred among others are those dielectrics based on the compositions: $BaTiO_3$ and $Ba(Ti,Zr)O_3$.

The ceramic powder may also be a single crystal or polycrystalline powder.

The ceramic powder or particles should preferably have a mean particle size of 0.2 to 100 μm so that ceramic particles are effectively milled with the resin. Particles with too small a particle size may be difficult to mill with the resin. Too large a particle size may interfere with uniform dispersion and mixing. Then a composition having a larger content of ceramic powder of such large particle size may fail to form a consolidated layer when molded.

The second composite dielectric layer contains the resin and ceramic powder as main components. The content of ceramic powder is generally from 10% by volume to 65% by volume provided that the total of the resin and ceramic powder is 100% by volume. Preferably, the content of ceramic powder is 20 to 60% by volume.

In the third embodiment, the layers contain a magnetic powder, typically ferrite or ferromagnetic metal. Examples of the ferrite are Mn—Mg—Zn, Ni—Zn, Mn—Zn base systems, with the Mn—Mg—Zn and Ni—Zn base systems being preferred.

Exemplary ferromagnetic metals are iron carbonyl, iron-silicon base alloys, iron-aluminum-silicon base alloys (trade name: Sendust), iron-nickel base alloys (trade name: Permalloy), and amorphous alloys including iron and cobalt base alloys.

Means for dividing these materials into particles may be well-known techniques such as grinding and granulation.

The magnetic powder or particles should preferably have a particle size of 0.01 to 100 μm, especially 0.01 to 50 μm, and a mean particle size of 1 to 50 μm. Magnetic particles with a size in this range are effectively dispersed, achieving a better effect. Too small a particle size corresponds to a greater specific surface area, which may obstruct high loading of magnetic particles. Too large a particle size may allow particles to settle in forming a paste, failing to achieve uniform dispersion. When a composition of such large particles is formed into thin-wall substrates or prepregs, few may have a smooth surface. Since it is practically difficult to divide the material into particles of an extremely small size, the lower limit of particle size is about 0.01 μm.

Preferably the magnetic powder has a uniform distribution of particle size. If desired, a fraction of particles having a uniform particle size is collected by sieving. The magnetic particles may have any desired shape including spherical, flat and elliptic shapes. A choice may be made depending on a particular application. If desired, magnetic particles may be subjected on their surface to such treatment as oxidation, coupling or coating of organic insulating material.

It is acceptable to use two or more magnetic powders which differ in type or particle size distribution. Such different magnetic powders may be mixed in any desired ratio. The type, particle size and mixing ratio of magnetic powder may be determined depending on a particular application.

The magnetic powder preferably has a magnetic permeability μ of 10 to 1,000,000. It is preferred that the magnetic powder in bulk form have greater insulation because substrates formed therefrom are improved in insulation.

The resin and magnetic powder are preferably mixed in such a ratio that the composite magnetic layer in its entirety has a magnetic permeability of 3 to 20. At the stage of a paste to be applied to glass cloth, the content of magnetic powder is 10 to 65% by volume, especially 20 to 60% by volume, based on the total of resin and magnetic powder. A magnetic powder content within this range ensures that the composite magnetic layer in its entirety has a magnetic permeability of 3 to 20, achieving the desired effect. Too large a magnetic powder content may make it difficult to form a slurry for coating and hence, to form a substrate or prepreg. Too small a magnetic powder content may fail to provide the desired magnetic permeability, detracting from magnetic characteristics.

The flame retardant used herein may be selected from a variety of flame retardants which are conventionally used for rendering substrates flame retardant. Exemplary flame retardants include halides such as halogenated phosphates and brominated epoxy resins, organic compounds such as phosphate amides, and inorganic substances such as antimony trioxide and aluminum hydride.

The reinforcing fibers used herein, typically in the form of glass cloth, may be selected from a variety of known reinforcements depending on a particular purpose and application. Commercially available reinforcements may be used without further treatment. Exemplary reinforcing fibers are E glass cloth ($\epsilon$=7, tan δ=0.003 at 1 GHz), D glass cloth ($\epsilon$=4, tan δ=0.0013 at 1 GHz) and H glass cloth ($\epsilon$=11, tan δ=0.003 at 1 GHz), from which a choice may be made depending on the desired electrical characteristics. Reinforcing fibers may be subject to coupling treatment in order to enhance interlayer adhesion. The glass cloth preferably has a thickness of up to 100 μm, more preferably 20 to 60 μm, and a weight of up to 120 g/m², especially 20 to 70 g/m².

Preferably the resin and glass cloth are mixed in a weight ratio of from 4/1 to 1/1. A mixing ratio within this range ensures to exert the desired effect. With a lower ratio or a smaller content of epoxy resin, the resulting composite material may lose adhesion to copper foil and form a less flat substrate. Inversely, with a higher ratio or a larger content of epoxy resin, the choice of glass cloth which can be used may become difficult and it may become difficult to ensure the strength of a thin-wall substrate.

The metal foil used herein as the conductor layer may be selected from metals having good electrical conductivity such as gold, silver, copper and aluminum. Of these, copper is especially preferred.

The metal foil may be formed by well-known methods such as electrolysis and rolling. Electrolytic foil is preferably used where it is desired to provide a foil peel strength. Rolled foil which is least affected by the skin effect due to surface irregularities is preferably used where high-frequency characteristics are important.

The metal foil preferably has a gage of about 8 to 70 μm, especially about 12 to 35 μm.

Prepreg sheets from which electronic parts are fabricated are prepared by mixing the ceramic powder, magnetic powder and optional flame retardant with the resin in a predetermined blend ratio, and milling the ingredients in a solvent into a slurry, followed by coating and drying to B stage. The solvent used herein for adjusting the viscosity of the paste for ease of coating is preferably a volatile solvent, especially a polar neutral solvent. Milling may be effected by well-known techniques such as ball milling and agitation. A prepreg sheet can be fabricated by coating the paste onto a metal foil or impregnating glass cloth with the paste.

Drying of the prepreg sheet to B stage may be appropriately adjusted depending on the contents of ceramic powder, magnetic powder, and optional flame retardant. After drying, the B stage prepreg sheet preferably has a thickness of about 50 to 300 μm and can be adjusted to an optimum thickness depending on the intended application and required characteristics (including pattern width, precision and dc resistance).

Figure 63A:
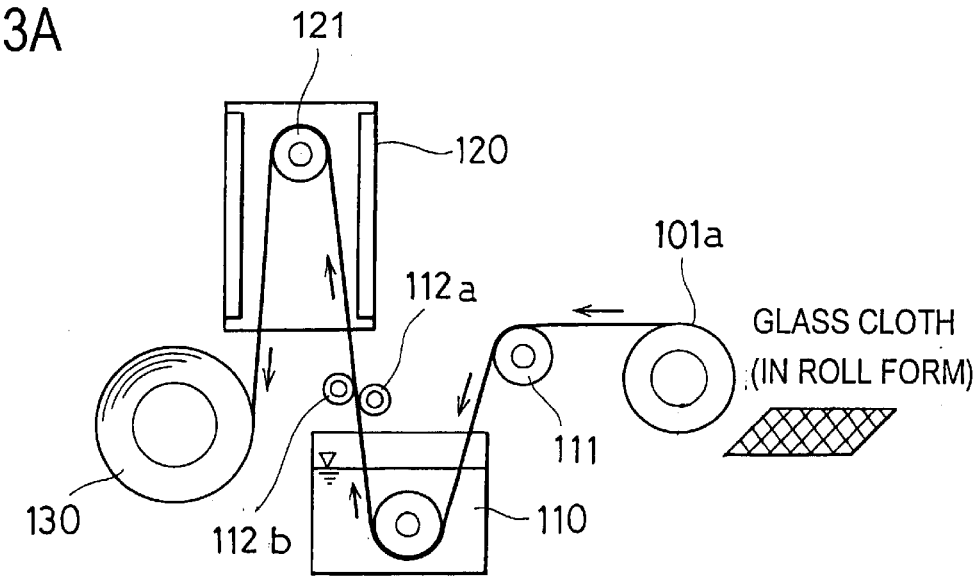
FIGS. 63A to 63D illustrate steps of a process for forming a copper foil-clad substrate.

The prepreg sheet can be fabricated by the method shown in FIGS. 63A to 63D or 64A to 64D. The method of FIGS. 63A to 63D are rather suitable for mass manufacture whereas the method of FIGS. 64A to 64D is easy to control the film thickness and relatively easy to adjust the characteristics. In the method of FIGS. 63A to 63D, as shown in FIG. 63A, a glass cloth 101a wound in roll form is unraveled from the roll 101a and carried into a coating tank 110 via a guide roller 111. The coating tank 110 contains a slurry having the resin, ceramic powder, magnetic powder and optional flame retardant dispersed in a solvent. As the glass cloth passes through the coating tank 110, it is immersed in the slurry so that it is coated with the slurry while interstices are filled therewith.

Past the coating tank 110, the glass cloth is carried into a drying furnace 120 via guide rollers 112a and 112b. In the drying furnace 120, the resin-impregnated glass cloth is dried at a predetermined temperature for a predetermined time whereby it is B-staged. After turning around a guide roller 121, the glass cloth is wound on a take-up roll 130.

Figure 63B:
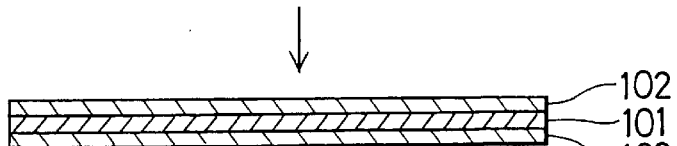

The glass cloth is then cut into sections of a predetermined size. As shown in FIG. 63B, there is obtained a prepreg sheet having the glass cloth 101 sandwiched between the layers 102 of the resin containing the ceramic powder, magnetic powder and optional flame retardant.

Figure 63C:
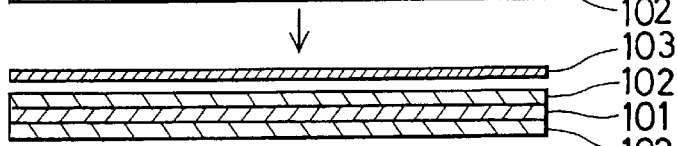
Figure 63D:
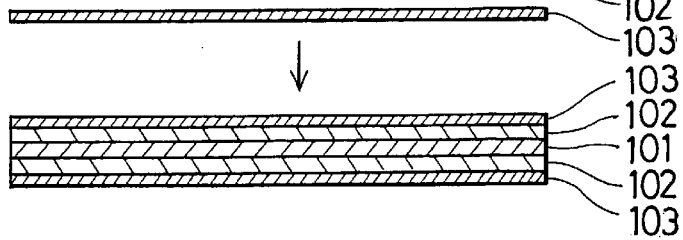

Then as shown in FIG. 63C, metal foils 103 such as copper foils are placed on opposite surface of the prepreg sheet. Laminating press yields a double side metal foil-clad substrate as shown in FIG. 63D. Laminating press may be effected in plural stages under different conditions. Where the metal foils are not attached, the sandwich structure of prepreg sheet may be lamination pressed without placing metal foils thereon.

Figure 64A:
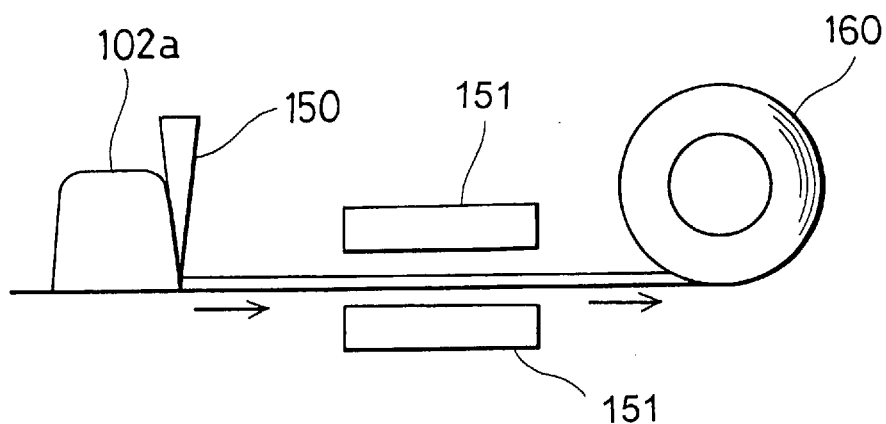
FIGS. 64A to 64D illustrate steps of another process for forming a copper foil-clad substrate.

Next, the method of FIGS. 64A to 64D is described. As shown in FIG. 64A, a slurry 102a having the resin, ceramic powder, magnetic powder and optional flame retardant dispersed in a solvent is coated onto a metal foil such as a copper foil by means of a doctor blade 150 which can maintain a constant clearance.

Figure 64B:
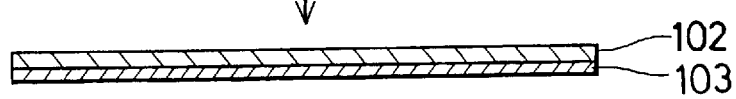

The coated foil is then cut into sections of a predetermined size. As shown in FIG. 64B, there is obtained a prepreg sheet in which the layer 102 of the resin containing the ceramic powder, magnetic powder and optional flame retardant is disposed on one surface of the metal foil 103.

Figure 64C:
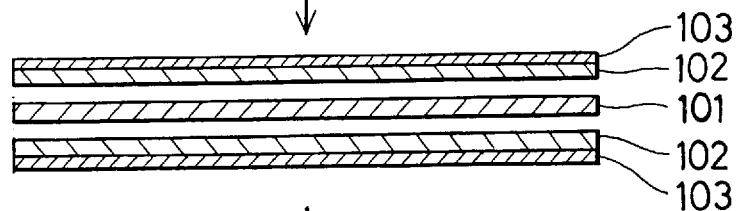
Figure 64D:
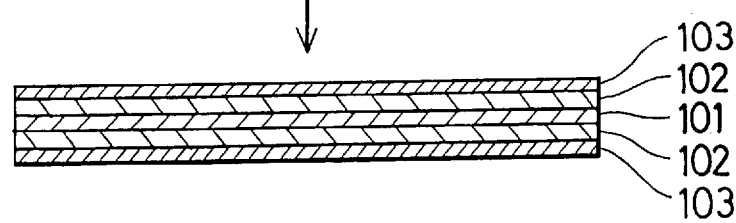

As shown in FIG. 64C, two such prepreg sheets (102, 103) are placed on opposite surfaces of a glass cloth 101 such that the resin layers 102 face inside. Laminating press yields a double side metal foil-clad substrate as shown in FIG. 64D. The heat and pressure conditions may be the same as above.

Besides the above-mentioned coating methods, the substrate or prepreg by which the electronic part is constructed may be prepared by another method, for example, by milling the ingredients and molding the solid mixture. This method using the solid mixture is easy to provide a thickness and suitable for forming relatively thick substrates or prepregs.

Milling may be effected by well-known techniques using ball mills, agitators and kneaders. A solvent may be used during the milling, if necessary. The mixture may be pelletized or powdered, if necessary.

The prepreg sheet thus obtained generally has a thickness of about 0.05 to 5 mm. The thickness of the prepreg sheet may be determined as appropriate depending on the desired plate thickness and the contents of dielectric powder and magnetic powder.

As in the preceding methods, metal foils such as copper foils are placed on opposite surfaces of the resulting prepreg sheet, followed by laminating press. This yields a double side metal foil-clad substrate. Laminating press may be effected in plural stages under different conditions. Where the metal foils are not attached, the prepreg sheet may be lamination pressed without placing metal foils thereon.

The thus obtained substrate or organic composite material serving as a molding material has improved high-frequency characteristics of magnetic permeability and dielectric constant. It also has improved insulating characteristics or withstands well as an insulator. In the case of copper foil-clad substrates to be described later, the bond strength of the substrate to the copper foil is high enough. The substrate also has improved heat resistance, especially solder heat resistance.

A copper foil-clad substrate can be formed by placing copper foils over the prepreg sheet, followed by laminating press. The copper foils used herein typically have a thickness of about 12 to 35 μm.

The copper foil-clad substrates include double side patterned substrates and multilayer substrates.

Figure 65:
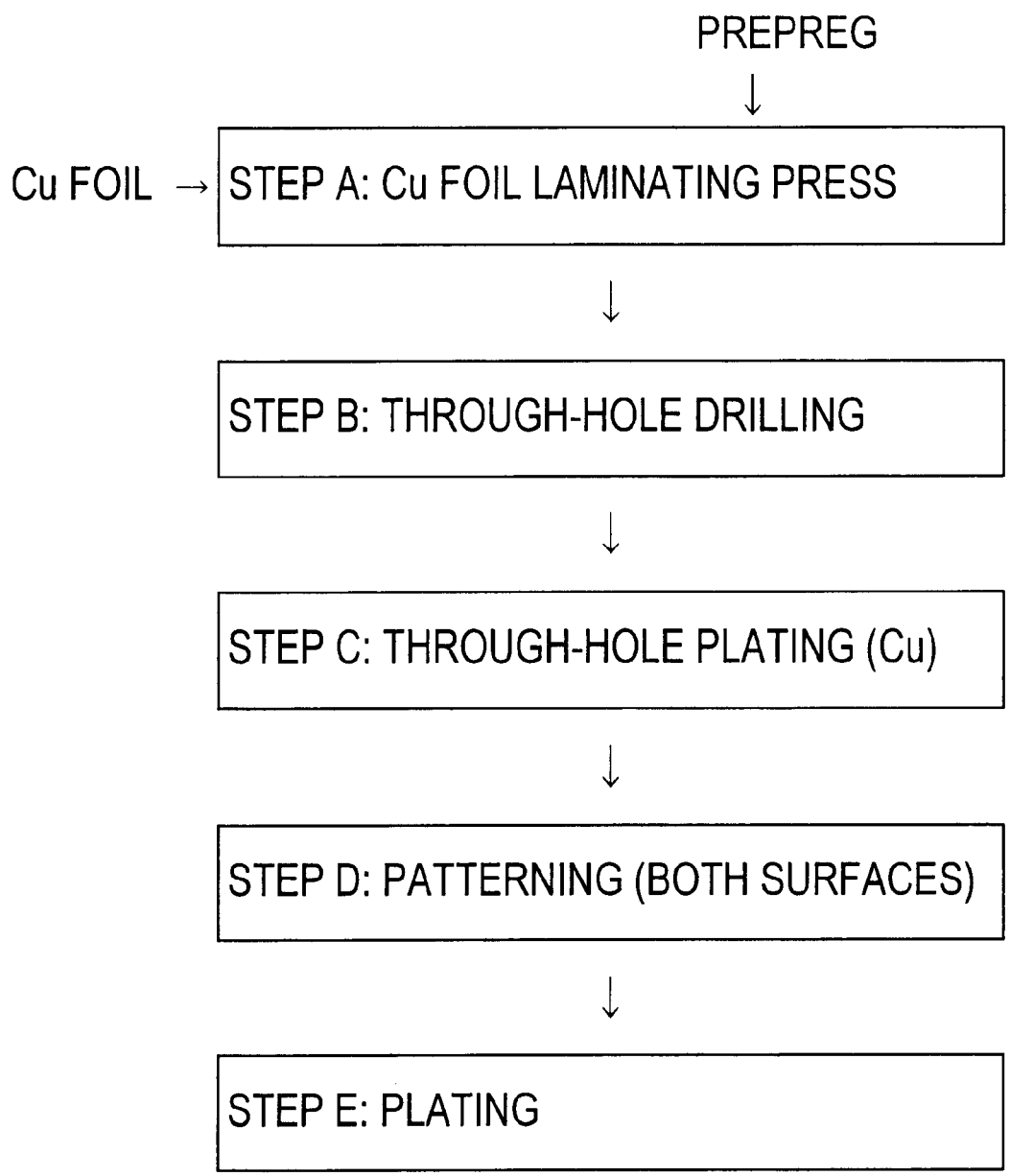
FIG. 65 illustrates steps of a further process for forming a copper foil-clad substrate.
Figure 66:
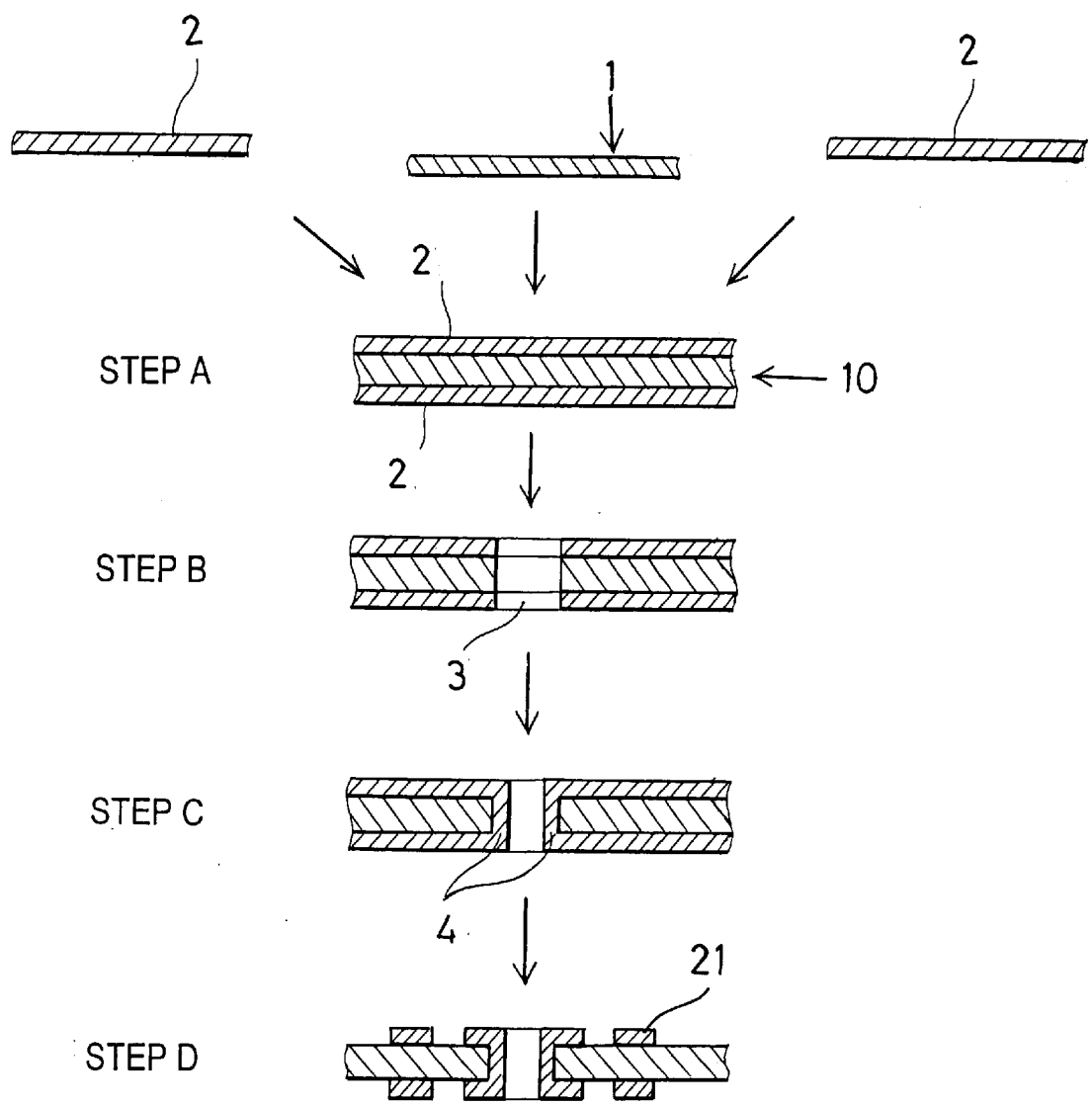
FIG. 66 illustrates steps of a process for forming a multilayer substrate.

FIGS. 65 and 66 illustrate steps of an exemplary process of preparing a double side patterned substrate. As shown in FIGS. 65 and 66, in step A, a prepreg sheet 1 of a predetermined thickness is sandwiched between a pair of copper (Cu) foils 2 of a predetermined thickness and lamination press. In step B, through holes are drilled in the structure 10 (only one through hole 3 shown in FIG. 66). In step C, copper (Cu) is plated to the through hole 3 to form a plating film 4. Then in step D, both the copper foils 2 are patterned to form conductor patterns 21. Thereafter, in step E, plating is effected for connection to external terminals as shown in FIG. 65. The last-mentioned plating may be Ni plating followed by Pd plating, Ni plating followed by Au plating (plating may be either electrolytic or electroless plating), or carried out using a solder leveler.

Figure 67:
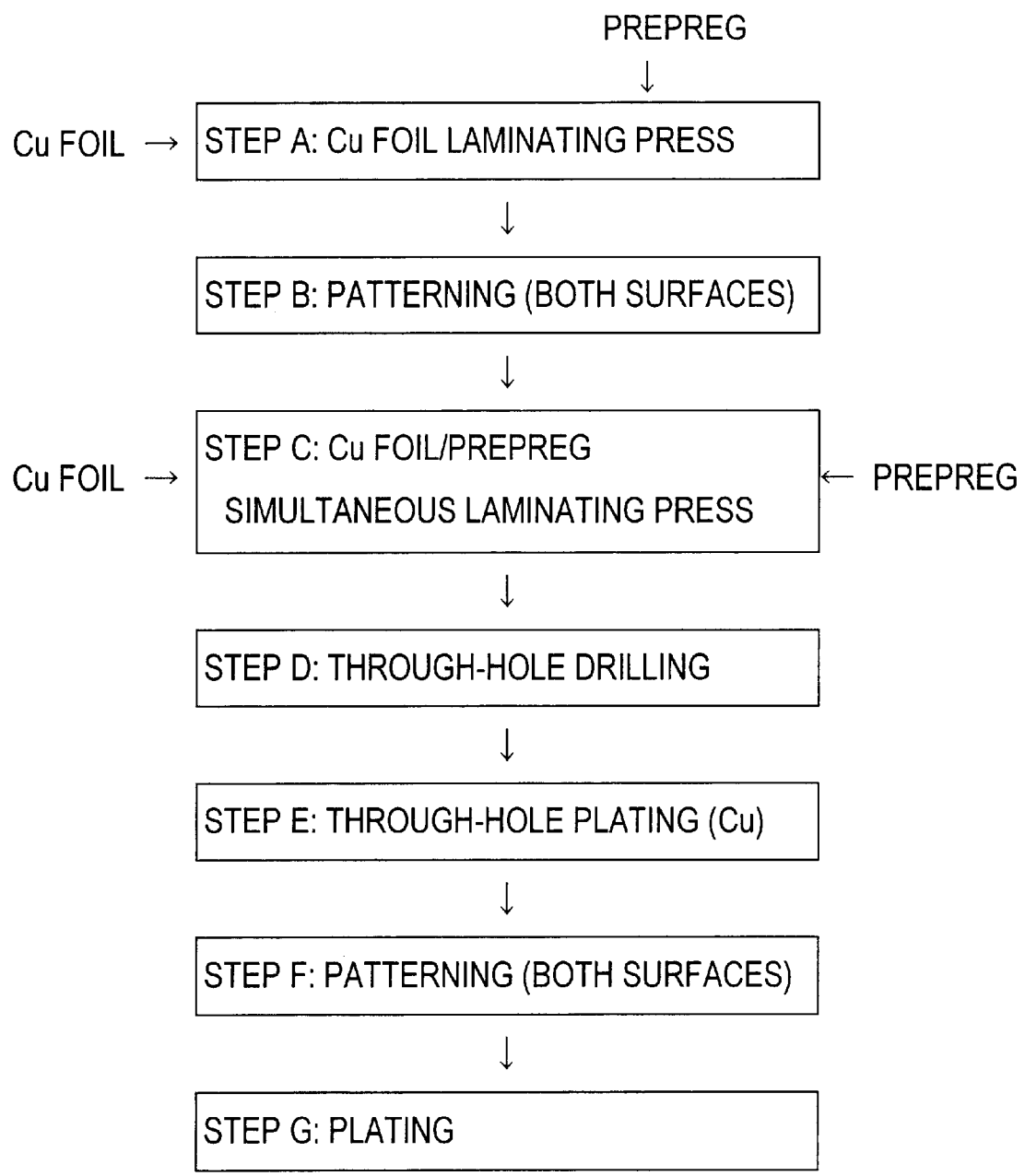
FIGS. 67 and 68 illustrate steps of another process for forming a multilayer substrate.
Figure 68:
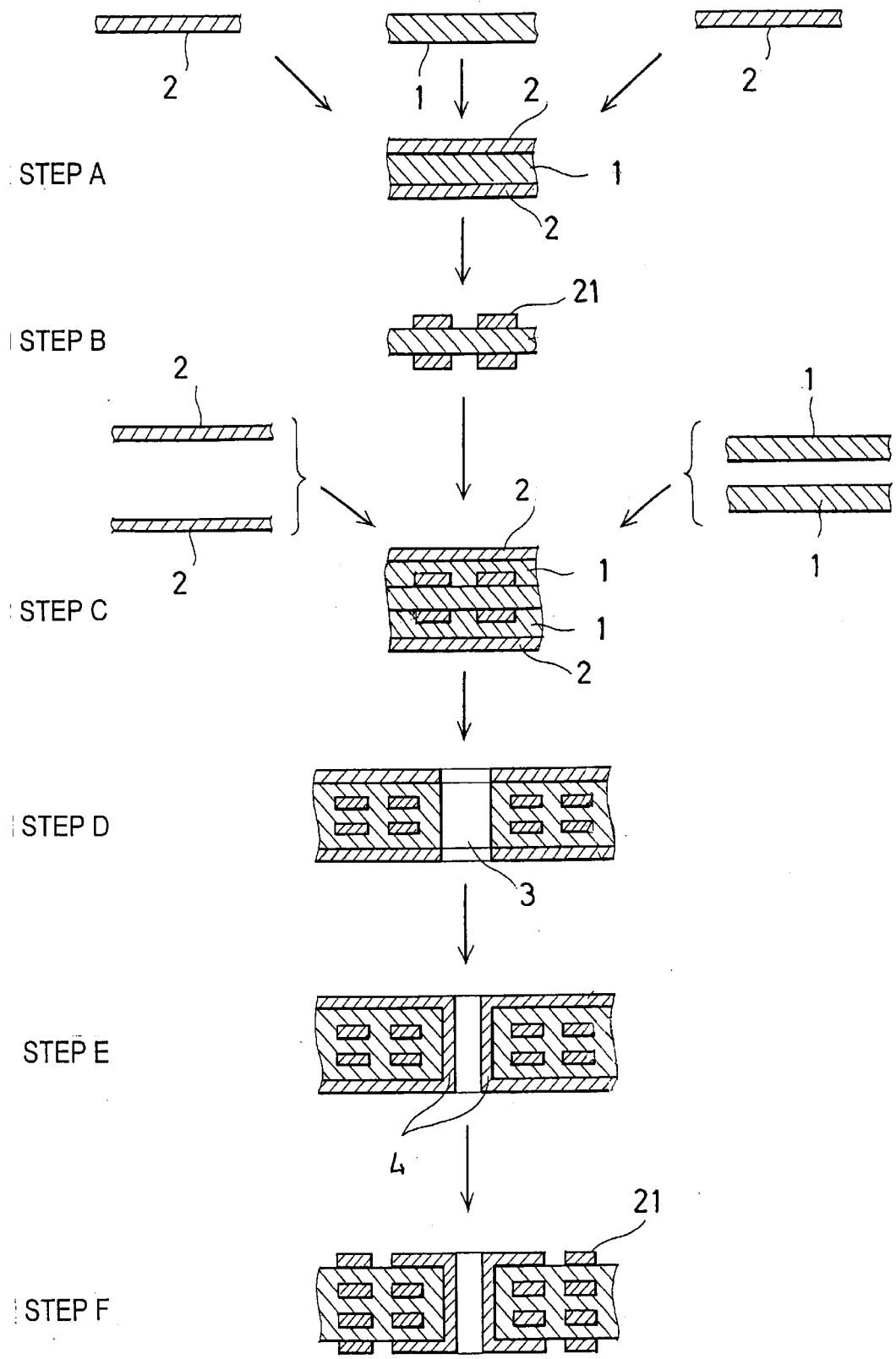

FIGS. 67 and 68 illustrate steps of an exemplary process of preparing a multilayer substrate in which four layers are stacked. As shown in FIGS. 67 and 68, in step A, a prepreg sheet 1 of a predetermined thickness is sandwiched between a pair of copper (Cu) foils 2 of a predetermined thickness and lamination press. Then in step B, both the copper foils 2 are patterned to form conductor patterns 21. In step C, on each of opposite surfaces of the double side patterned substrate thus obtained, a prepreg sheet 1 of a predetermined thickness and a copper foil 2 are placed, followed by simultaneous lamination press. In step D, through holes are drilled in the structure (only one through hole 3 shown in FIG. 68). In step E, copper (Cu) is plated to the through hole 3 to form a plating film 4. Then in step F, both the outside copper foils 2 are patterned to form conductor patterns 21. Thereafter, in step G, plating is effected for connection to external terminals as shown in FIG. 67. The last-mentioned plating may be Ni plating followed by Pd plating, Ni plating followed by Au plating (plating may be either electrolytic or electroless plating), or carried out using a solder leveler.

The invention is not limited to the above-illustrated substrates, and a substrate of any desired structure can be formed. For example, using a substrate serving as a laminating press material, a copper foil-clad substrate and a prepreg, a multilayer structure can be formed while the prepreg serves as a bonding layer.

In the embodiment wherein a prepreg or a substrate serving as a laminating press material is bonded to a copper foil, a paste of composite dielectric material or composite magnetic material obtained by milling the ceramic powder, magnetic powder, optional flame retardant and resin in a high-boiling solvent such as butylcarbitol acetate may be applied onto a patterned substrate by a screen printing or similar technique. This procedure is effective for improving characteristics.

Electronic parts can be fabricated by combining the prepreg, copper foil-clad substrate and multilayer substrate with a device design pattern and other constituent materials.

The electronic parts of the invention find use as capacitors, coils (or inductors), filters, etc. Alternatively, by combining these elements with each other or with wiring patterns, amplifier devices or functional devices, the electronic parts can form antennas, and high-frequency electronic parts such as superposed modules for use in high-frequency electronic circuits such as RF modules, voltage controlled oscillators, and power amplifiers, as well as optical pickups.

EXAMPLE

Experimental examples and working examples of the invention are given below by way of illustration and not by way of limitation.

Experiment 1

There were furnished resins as shown in Table 1. The resins were mixed with dielectric or ceramic powders as shown in Table 1 in a predetermined proportion to form composite materials, which were measured for dielectric constant $\epsilon$ and Q. Additionally, the dielectric powders and resins used as the raw material were also measured for dielectric constant $\epsilon$ and Q. The results are shown in Table 1. The conditions of heat compression molding are shown in Table 2.

TABLE 1

| Resin | $\epsilon$ | Q | Dielectric powder | $\epsilon$ | Q | Content | | | | | | | |
|---|---|---|---|---|---|---|---|---|---|---|---|---|---|
| | | | | | | 20 vol % | | 30 vol % | | 40 vol % | | 50 vol % | |
| | | | | | | $\epsilon$ | Q | $\epsilon$ | Q | $\epsilon$ | Q | $\epsilon$ | Q |
| | | | $BaTiO_3$—$BaZrO_3$ base | 9000 | 130 | 8.49 | 56 | 11.61 | 58 | 16.61 | 60 | 24.24 | 63 |
| Phenolic | 4.2 | 50 | BaO—$TiO_2$—$Nd_2O_3$ base | 95 | 1300 | 7.59 | 57 | 9.9 | 60 | 12.94 | 62 | 16.90 | 64 |
| | | | BaO-4$TiO_2$ base | 45 | 5700 | 7.11 | 58 | 8.72 | 61 | 10.72 | 65 | 13.10 | 68 |
| | | | $BaTiO_3$—$BaZrO_3$ base | 9000 | 130 | 7.97 | 63 | 11.16 | 65 | 15.93 | 66 | 23.21 | 69 |
| Epoxy | 4.0 | 60 | BaO—$TiO_2$—$Nd_2O_3$ base | 95 | 1300 | 7.45 | 65 | 9.6 | 66 | 12.56 | 68 | 16.43 | 69 |
| | | | BaO-4$TiO_2$ base | 45 | 5700 | 6.88 | 66 | 8.49 | 68 | 10.47 | 69 | 12.83 | 71 |
| | | | $BaTiO_3$—$BaZrO_3$ base | 9000 | 130 | 7.24 | 108 | 10.05 | 108 | 14.25 | 110 | 20.62 | 111 |
| Low-$\epsilon$ epoxy | 3.5 | 100 | BaO—$TiO_2$—$Nd_2O_3$ base | 95 | 1300 | 6.75 | 111 | 8.82 | 118 | 11.57 | 126 | 15.19 | 135 |
| | | | BaO-4$TiO_2$ base | 45 | 5700 | 6.34 | 111 | 7.89 | 121 | 9.80 | 130 | 12.10 | 141 |
| | | | $BaTiO_3$—$BaZrO_3$ base | 9000 | 130 | 6.50 | 109 | 8.94 | 109 | 12.56 | 111 | 18.04 | 113 |
| BT resin | 3.0 | 100 | BaO—$TiO_2$—$Nd_2O_3$ base | 95 | 1300 | 6.12 | 110 | 7.99 | 121 | 10.50 | 126 | 13.84 | 134 |
| | | | BaO-4$TiO_2$ base | 45 | 5700 | 5.67 | 113 | 7.25 | 122 | 9.05 | 132 | 11.27 | 140 |
| | | | $BaTiO_3$—$BaZrO_3$ base | 9000 | 130 | 5.74 | 145 | 7.81 | 154 | 10.85 | 165 | 15.44 | 175 |

TABLE 1-continued

| | | | | | Content | | | | | | | | |
|---|---|---|---|---|---|---|---|---|---|---|---|---|---|
| | | | | | 20 vol % | | 30 vol % | | 40 vol % | | 50 vol % | | |
| Resin | $\epsilon$ | Q | Dielectric powder | $\epsilon$ | Q | $\epsilon$ | Q | $\epsilon$ | Q | $\epsilon$ | Q | $\epsilon$ | Q |
| Polybuta diene | 2.5 | 500 | BaO—TiO$_2$—Nd$_2$O$_3$ base | 95 | 1300 | 5.47 | 280 | 7.13 | 285 | 9.36 | 295 | 12.37 | 310 |
| | | | BaO-4TiO$_2$ base | 45 | 5700 | 5.22 | 370 | 6.55 | 380 | 8.24 | 390 | 10.33 | 410 |

TABLE 2

| Resin | Temperature (° C.) | Time (hr) | Pressure (Pa) |
|---|---|---|---|
| Phenolic | 170 | 1.5 | 156.8 × 10$^6$ |
| Epoxy | 180 | 2 | 156.8 × 10$^6$ |
| Low-$\epsilon$ epoxy | 190 | 2 | 156.8 × 10$^6$ |
| BT resin | 180 | 6 | 156.8 × 10$^6$ |
| Polybutadiene | 175 | 3 | 156.8 × 10$^6$ |

As seen from Table 1, the dielectric constant $\epsilon$ and Q of composite material can be adjusted as desired by changing the type of resin and the type and content of dielectric powder blended therein.

ders and resins used as the raw material were also measured for dielectric constant $\epsilon$ and magnetic permeability $\mu$. The results are shown in Table 3.

TABLE 3

| | | | | | | | Content | | | | | | | |
|---|---|---|---|---|---|---|---|---|---|---|---|---|---|---|
| | | | | | | | 50 wt % | | 60 wt % | | 70 wt % | | 80 wt % | |
| Resin | $\epsilon$ | $\mu$ | Magnetic powder | $\mu$ | Shape | | $\mu$ | $\epsilon$ | $\mu$ | $\epsilon$ | $\mu$ | $\epsilon$ | $\mu$ | $\epsilon$ |
| Phenolic | 4.2 | 1 | Mn—Mg—Zn ferrite | 320 | ground 3 μm | | 2.4 | 5.2 | 2.9 | 5.8 | 4.2 | 6.8 | 5.9 | 8.4 |
| | | | Si—Fe | — | flat 10 μm | | 6.2 | 7.3 | 8.5 | 9.0 | 10.8 | 11.9 | 15.7 | 15.0 |
| | | | Iron carbonyl | — | sphere 3 μm | | 2.2 | 5.8 | 2.6 | 6.4 | 3.6 | 8.0 | 4.8 | 9.4 |
| Epoxy | 4.0 | 1 | Mn—Mg—Zn ferrite | 320 | ground 3 μm | | 2.2 | 4.9 | 2.8 | 5.5 | 4.2 | 6.6 | 5.8 | 8.0 |
| | | | Si—Fe | — | flat 10 μm | | 6.0 | 6.8 | 8.5 | 8.8 | 11.0 | 11.5 | 16.0 | 14.5 |
| | | | Mn—Mg—Zn ferrite | — | sphere 3 μm | | 2.1 | 5.4 | 2.5 | 6.2 | 3.7 | 7.8 | 4.9 | 9.2 |
| Low-$\epsilon$ epoxy | 3.5 | 1 | Mn—Mg—Zn ferrite | 320 | ground 3 μm | | 2.3 | 4.8 | 2.8 | 5.4 | 4.3 | 6.4 | 5.9 | 7.7 |
| | | | Si—Fe | — | flat 10 μm | | 5.8 | 6.6 | 8.3 | 8.6 | 10.9 | 11.2 | 15.9 | 14.1 |
| | | | Mn—Mg—Zn ferrite | — | sphere 3 μm | | 2.0 | 5.3 | 2.5 | 6.1 | 3.6 | 7.7 | 4.7 | 9.3 |
| BT resin | 3.0 | 1 | Mn—Mg—Zn ferrite | 320 | ground 3 μm | | 2.0 | 4.7 | 2.9 | 5.3 | 4.2 | 6.3 | 5.8 | 7.4 |
| | | | Si—Fe | — | flat 10 μm | | 5.6 | 6.5 | 8.4 | 8.5 | 11.1 | 10.9 | 15.8 | 13.8 |
| | | | Mn—Mg—Zn ferrite | — | sphere 3 μm | | 2.0 | 5.2 | 2.4 | 6.0 | 3.5 | 7.8 | 4.8 | 9.1 |
| Polybuta diene | 2.5 | 1 | Mn—Mg—Zn ferrite | 320 | ground 3 μm | | 2.1 | 4.5 | 3.0 | 5.2 | 4.1 | 6.0 | 6.0 | 7.0 |
| | | | Si—Fe | — | flat 10 μm | | 5.8 | 6.0 | 8.6 | 8.1 | 10.8 | 10.6 | 16.0 | 13.5 |
| | | | Mn—Mg—Zn ferrite | — | sphere 3 μm | | 2.1 | 5.0 | 2.6 | 5.9 | 3.5 | 3.5 | 4.9 | 9.2 |

Experiment 2

There were furnished resins as shown in Table 3. The resins were mixed with magnetic powders as shown in Table 3 in a predetermined proportion to form composite materials, which were measured for dielectric constant $\epsilon$ and magnetic permeability $\mu$. Additionally, the magnetic pow- As seen from Table 3, the dielectric constant $\epsilon$ and magnetic permeability $\mu$ of composite material can be adjusted as desired by changing the type of resin and the type and content of magnetic powder blended therein.

Example 1

Figure 2:
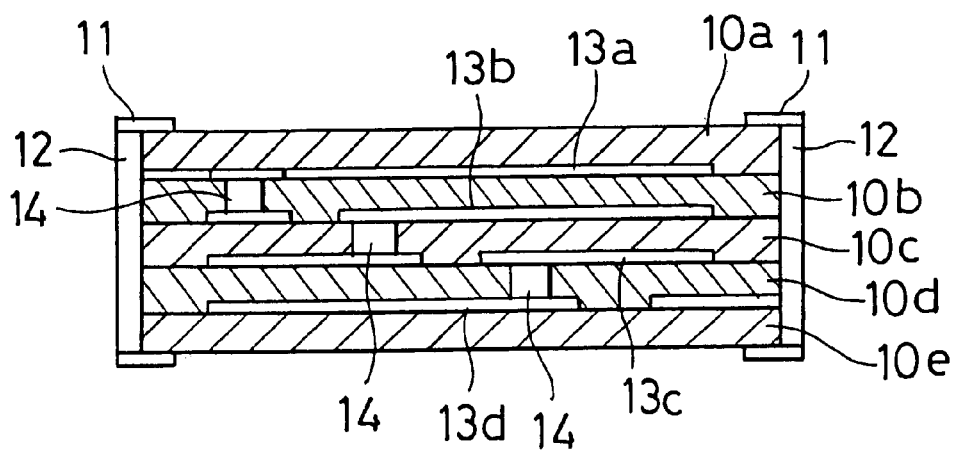

FIGS. 1 and 2 illustrate an inductor according to a first embodiment of the invention. FIG. 1 is a see-through perspective view and FIG. 2 is a cross-sectional view.

In FIGS. 1 and 2, the inductor 10 includes constituent layers (prepregs or substrates) 10a to 10e of composite resin materials, internal conductors (coil patterns) 13 formed on the constituent layers 10b to 10e, and via holes 14 for providing electrical connection to the internal conductors 13. Via holes 14 can be formed by drilling, laser machining, etching or the like. The ends of each coil formed are connected to through-vias 12 formed along end surfaces of the inductor 10 and land patterns 11 formed slightly above or below the through-vias 12. Through-via 12 has a half-cut structure by dicing or V-cutting. This is because when a plurality of devices are formed in a collective substrate which is eventually cut into discrete pieces along lines at the centers of through-vias 12.

The constituent layers 10a to 10e of the inductor 10 should preferably have a dielectric constant of 2.6 to 3.5 because the distributed capacitance must be minimized for the potential application as a high-frequency chip inductor. Use of the above-mentioned organic dielectric layers is thus preferred. Separately, for an inductor constructing a resonance circuit, the distributed capacitance is sometimes positively utilized. In such application, the constituent layers should preferably have a dielectric constant of 5 to 40. Use of the above-mentioned first and second composite dielectric layers is thus preferred. In this way, it becomes possible to reduce the size of device and eliminate capacitive elements. Also in these inductors the material loss should be minimized. By setting the dielectric dissipation factor (tan $\delta$) in the range of 0.0025 to 0.0075, an inductor having a minimized material loss and a high Q is obtainable. Further where a noise removing application is under consideration, the impedance must be maximized at the frequency of noise to be removed. For such application, a magnetic permeability of 3 to 20 is appropriate, and use of the above-mentioned composite magnetic layers is preferred. This drastically improves the effect of removing high-frequency noise. The respective constituent layers may be identical or different as long as constituent layers of at least two different types are included as a whole (the same applies in the following examples), and an optimum combination thereof may be selected.

Figure 10A:
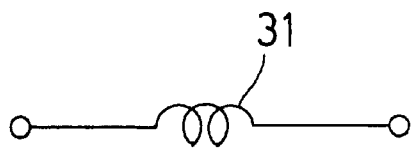
FIGS. 10A and 10B are equivalent circuit diagrams of the inductors.

An equivalent circuit is shown in FIG. 10A. As seen from FIG. 10A, an electronic part (inductor) having a coil 31 is illustrated in the equivalent circuit.

Example 2

Figure 3:
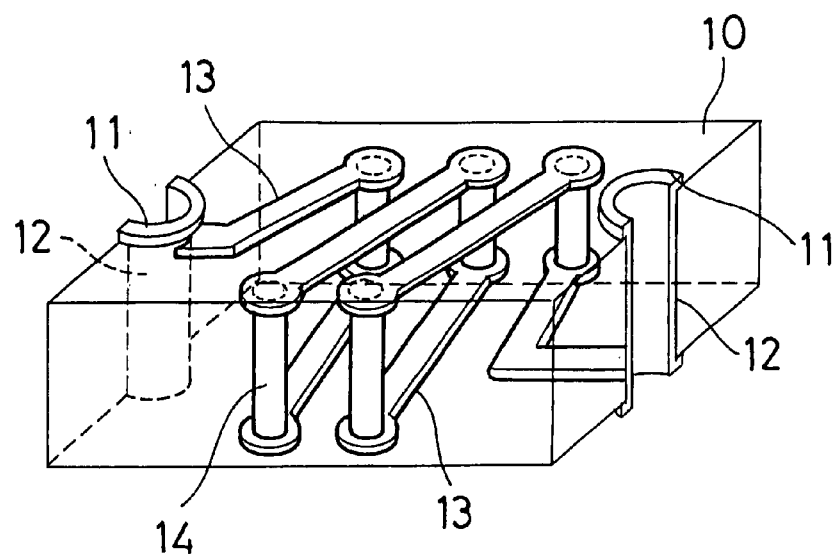
FIGS. 3 and 4 illustrate an inductor as another exemplary electronic part of the invention.
Figure 4:
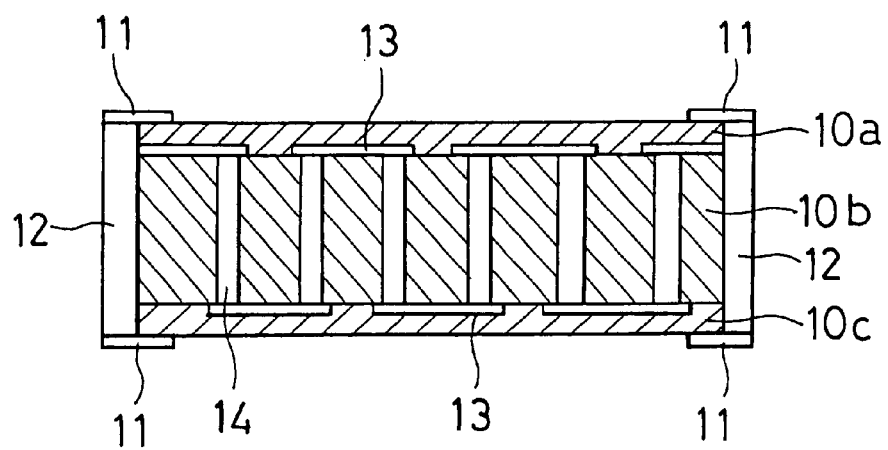

FIGS. 3 and 4 illustrate an inductor according to a second embodiment of the invention. FIG. 3 is a see-through perspective view and FIG. 4 is a cross-sectional view.

In this example, the coil pattern which is wound and stacked in a vertical direction in Example 1 is changed to a helical coil which is wound in a lateral direction. The remaining components are the same as in Example 1. The same components are designated by like numerals and their description is omitted.

Example 3

Figure 5:
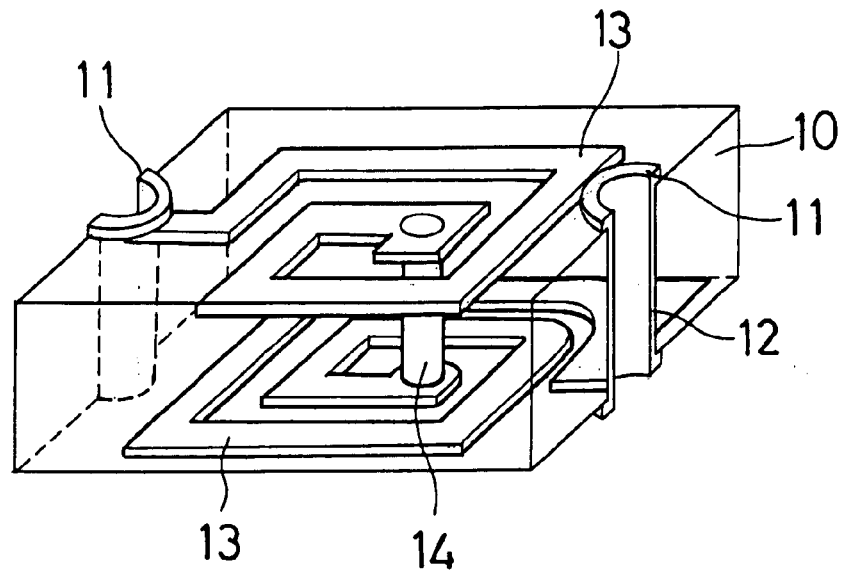
FIGS. 5 and 6 illustrate an inductor as a further exemplary electronic part of the invention.
Figure 6:
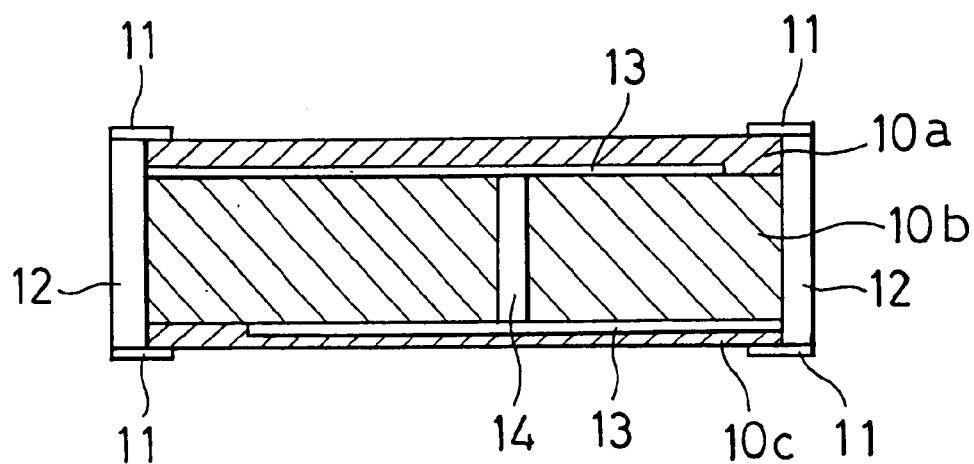

FIGS. 5 and 6 illustrate an inductor according to a third embodiment of the invention. FIG. 5 is a see-through perspective view and FIG. 6 is a cross-sectional view.

In this example, the coil pattern which is wound and stacked in a vertical direction in Example 1 is changed such that upper and lower spiral coils are connected. The remaining components are the same as in Example 1. The same components are designated by like numerals and their description is omitted.

Example 4

Figure 7:
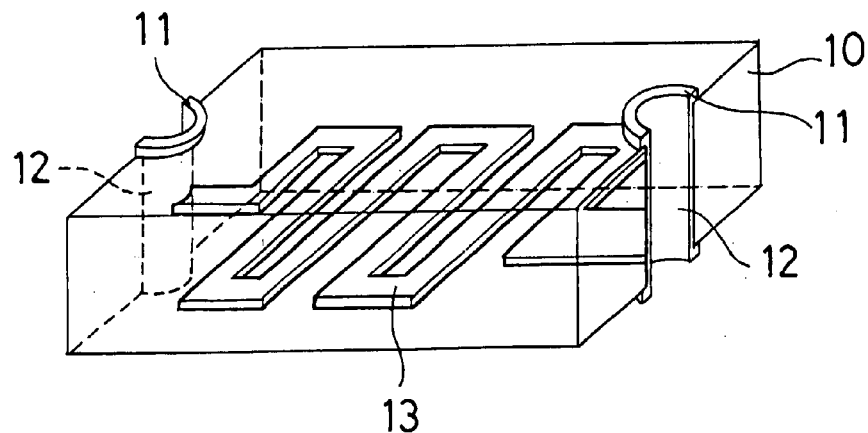
FIGS. 7 and 8 illustrate an inductor as a still further exemplary electronic part of the invention.
Figure 8:
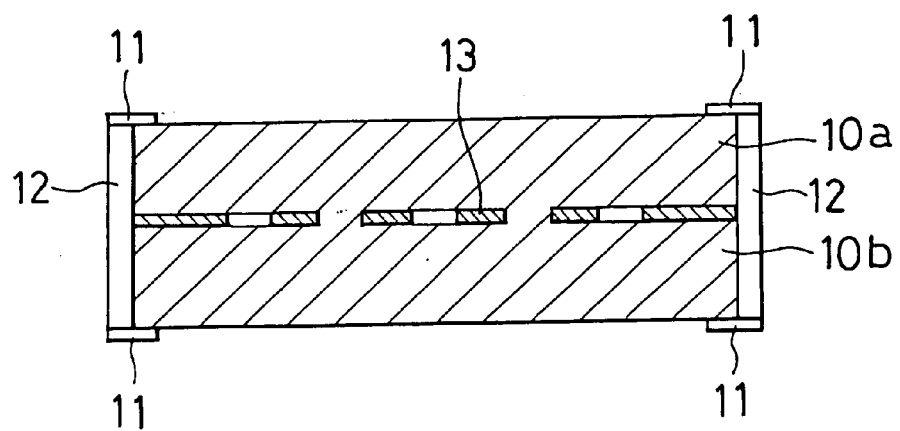

FIGS. 7 and 8 illustrate an inductor according to a fourth embodiment of the invention. FIG. 7 is a see-through perspective view and FIG. 8 is a cross-sectional view.

In this example, the coil pattern which is wound and stacked in a vertical direction in Example 1 is changed to an internal meander coil. The remaining components are the same as in Example 1. The same components are designated by like numerals and their description is omitted.

Example 5

Figure 9:
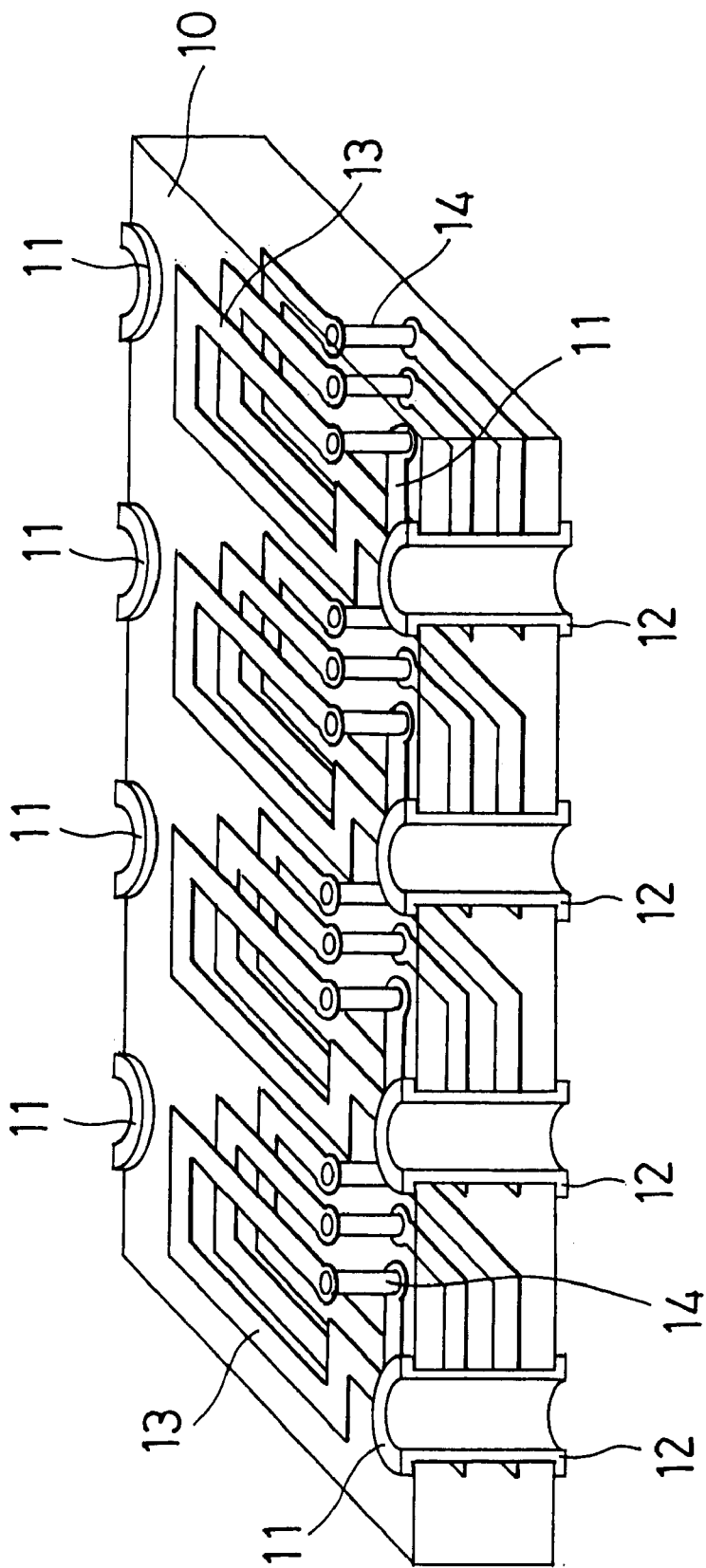
FIG. 9 illustrates an inductor as a yet further exemplary electronic part of the invention.

FIG. 9 is a see-through perspective view of an inductor according to a fifth embodiment of the invention.

Figure 10B:
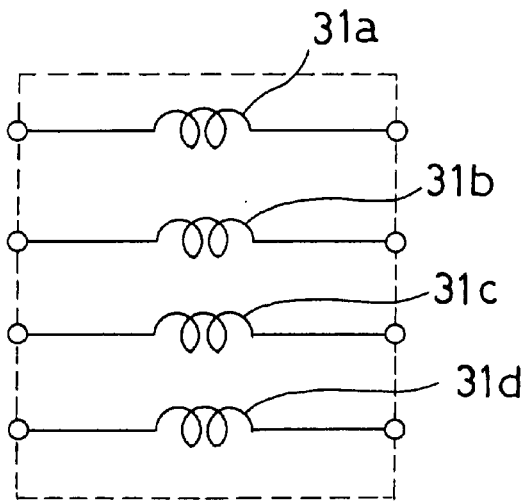

In this example, the single coil in Example 1 is changed to an array of four juxtaposed coils. This array achieves a space saving. The remaining components are the same as in Example 1. The same components are designated by like numerals and their description is omitted. The equivalent circuit is shown in FIG. 10B. As shown in FIG. 10B, an electronic part (inductor array) having four coils 31a to 31d is illustrated in the equivalent circuit.

Example 6

Figure 11:
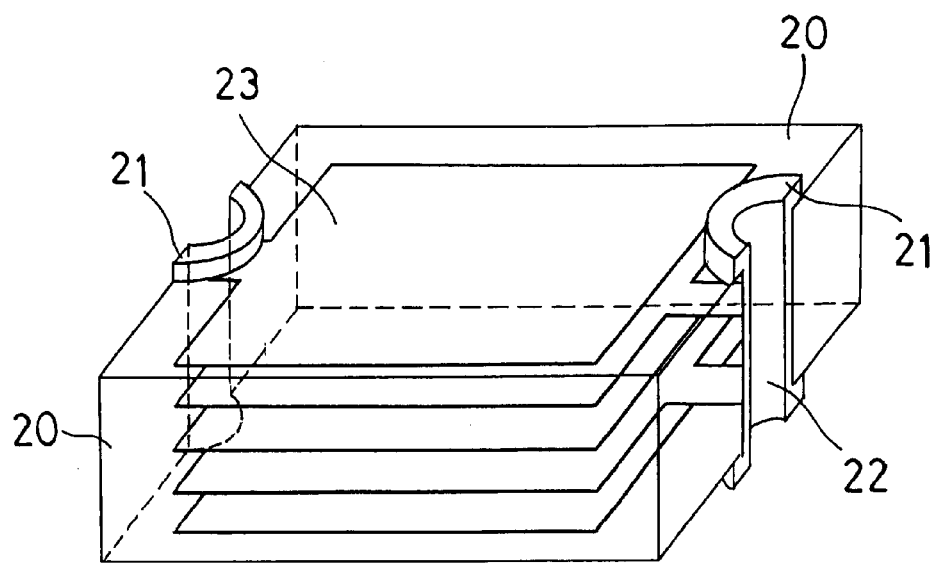
FIGS. 11 and 12 illustrate a capacitor as one exemplary electronic part of the invention.
Figure 12:
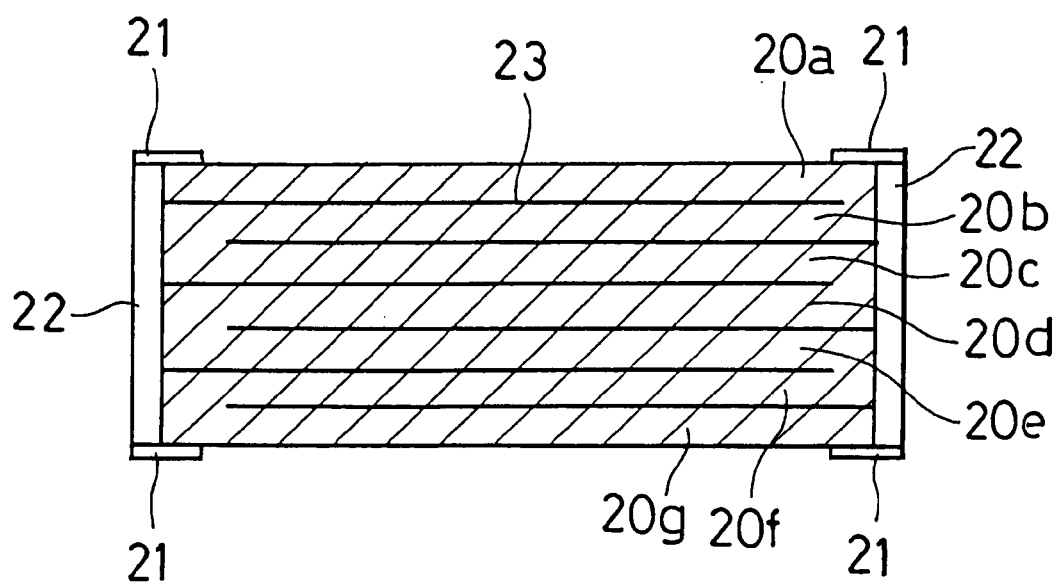

FIGS. 11 and 12 illustrate a capacitor according to a sixth embodiment of the invention. FIG. 11 is a see-through perspective view and FIG. 12 is a cross-sectional view.

In FIGS. 11 and 12, the capacitor 20 includes constituent layers (prepregs or substrates) 20a to 20g of composite resin materials, internal conductors (internal electrode patterns) 23 formed on the constituent layers 20b to 20g, through-vias 22 formed along end surfaces of the capacitor 20 and alternately connected to the internal conductors 23, and land patterns 21 formed slightly above or below the through-vias 22.

The constituent layers 20a to 20g of the capacitor 20 should preferably have a dielectric constant of 2.6 to 40 and a dielectric dissipation factor of 0.0025 to 0.0075 when the diversity and precision of capacitance are considered. Then a choice may be made among the above-mentioned organic dielectric layers or the above-mentioned first and second composite dielectric layers. This enables to provide a wider range of capacitance and afford even a low capacitance at a high precision. It is also required that the material loss be minimized. By setting the dielectric dissipation factor (tan $\delta$) in the range of 0.0075 to 0.025, a capacitor having a minimized material loss is obtainable. The respective constituent layers may be identical or different and an optimum combination thereof may be selected.

The equivalent circuit is shown in FIG. 14A. As shown in FIG. 14A, an electronic part (capacitor) having a capacitance 32 is illustrated in the equivalent circuit.

Example 7

Figure 13:
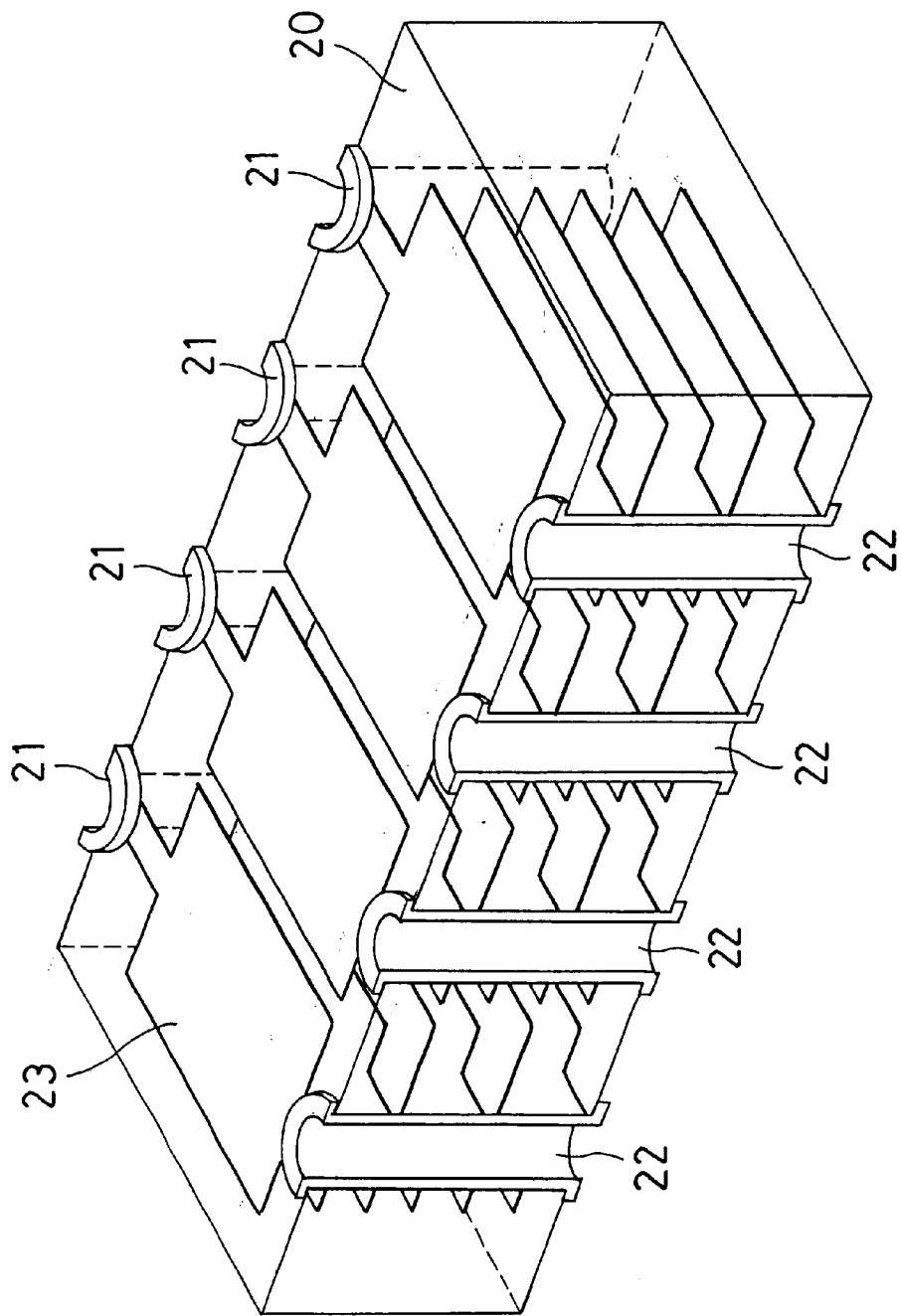
FIG. 13 illustrates a capacitor as another exemplary electronic part of the invention.

FIG. 13 is a see-through perspective view of a capacitor according to a seventh embodiment of the invention.

In this example, the single capacitor in Example 6 is changed to an array of four juxtaposed capacitors. When capacitors are formed in an array, it sometimes occurs to provide different capacitances at a high precision. To this end, the above-mentioned ranges of dielectric constant and dielectric dissipation factor are preferable. The remaining components are the same as in Example 6. The same components are designated by like numerals and their description is omitted. The equivalent circuit is shown in FIG. 14B. As shown in FIG. 14B, an electronic part (capacitor array) having four capacitors 32a to 32d is illustrated in the equivalent circuit.

Example 8

Figure 16:
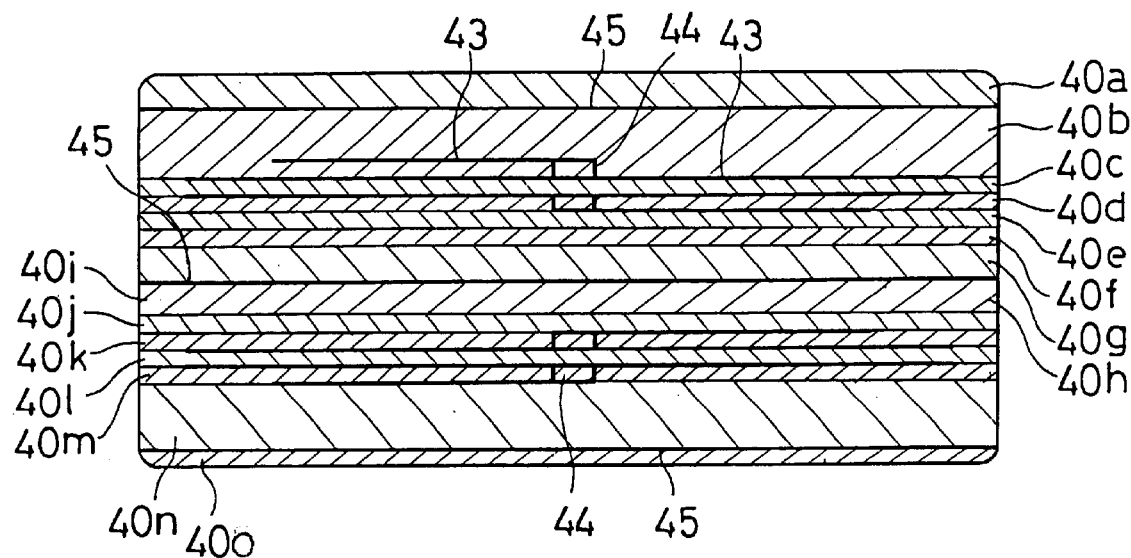
Figure 17:
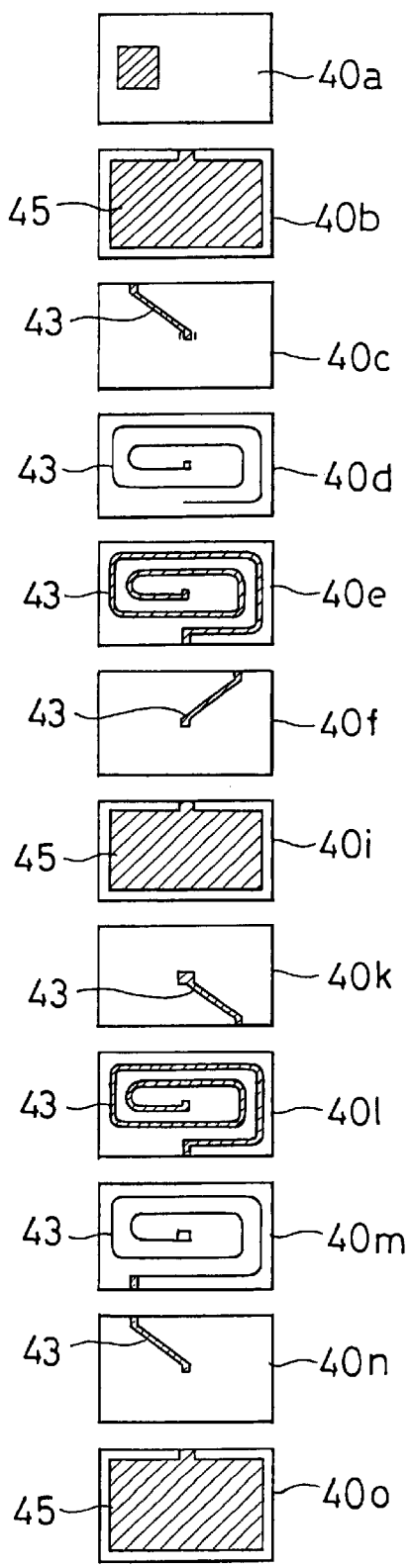
Figure 18:
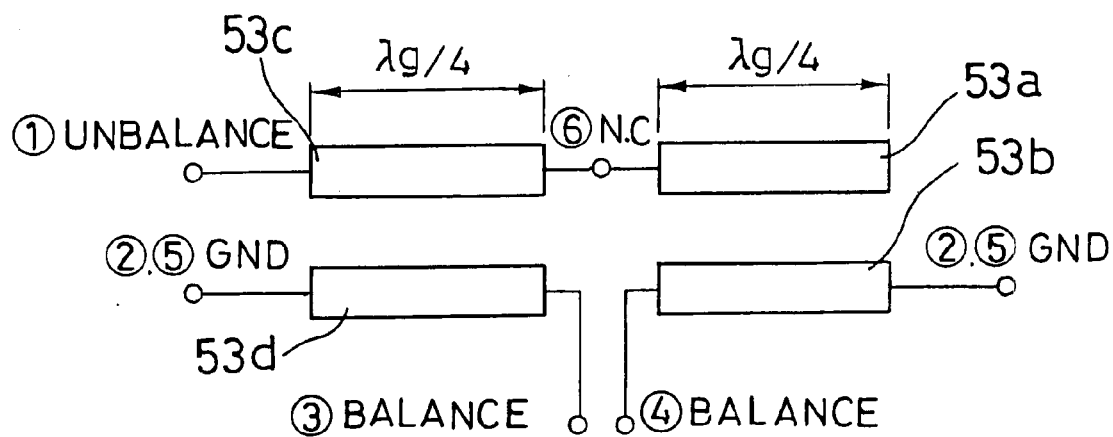
FIG. 18 is an equivalent circuit diagram of the balun transformer.

FIGS. 15 to 18 illustrate a balun transformer according to an eighth embodiment of the invention. FIG. 15 is a see-through perspective view, FIG. 16 is a cross-sectional view, FIG. 17 is an exploded plan view of respective constituent layers, and FIG. 18 is an equivalent circuit diagram.

In FIGS. 15 to 17, the balun transformer 40 includes a stack of constituent layers 40a to 40o of composite resin materials, internal GND conductors 45 disposed above, below and intermediate the stack, and internal conductors 43 formed between the internal GND conductors 45. The internal conductors 43 are spiral conductor sections 43 having a length of $\lambda g/4$ which are connected by via holes 44 so as to construct coupling lines 53a to 53d as shown in the equivalent circuit of FIG. 18.

The constituent layers 40a to 40o of the balun transformer 40 should preferably have a dielectric constant of 2.6 to 40 and a dielectric dissipation factor (tan $\delta$) of 0.0075 to 0.025. Then a choice may be made among the above-mentioned organic dielectric layers or the above-mentioned first and second composite dielectric layers. In some applications wherein a magnetic permeability of 3 to 20 is appropriate, use of the above-mentioned composite magnetic layers is preferred. The respective constituent layers may be identical or different and an optimum combination thereof may be selected.

Example 9

Figure 19:
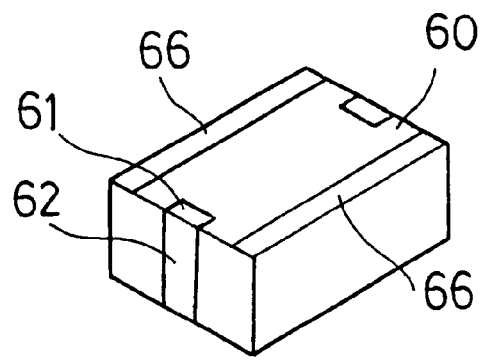
FIGS. 19 and 20 illustrate a multilayer filter as one exemplary electronic part of the invention.
Figure 20:
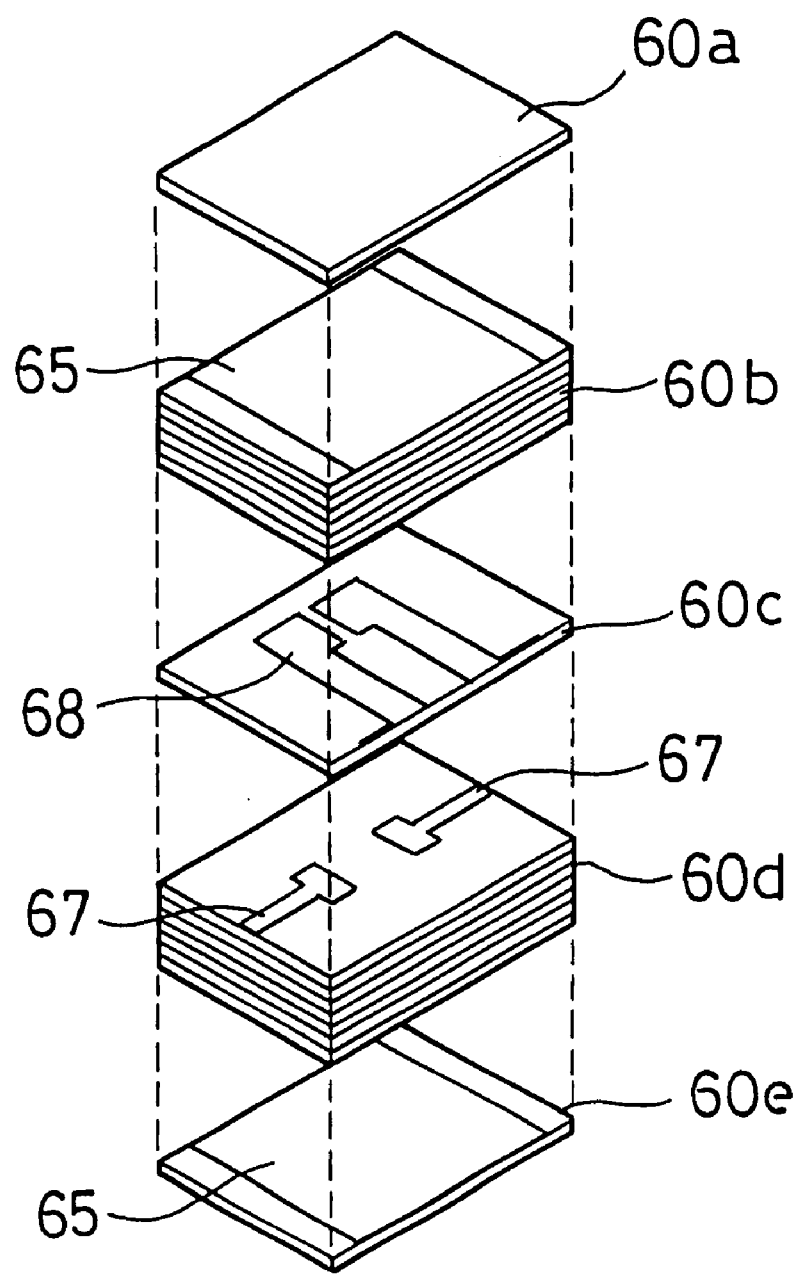
Figure 21:
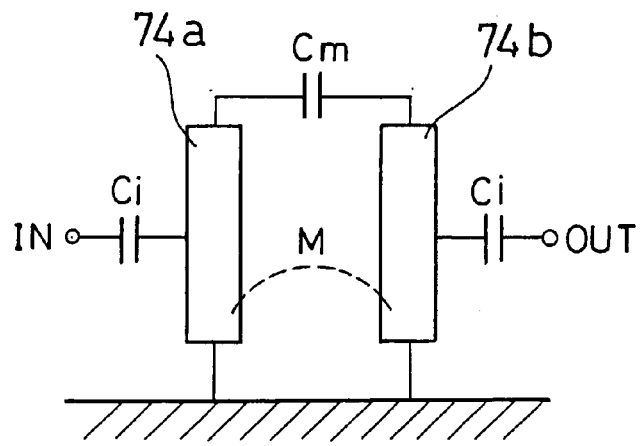
FIG. 21 is an equivalent circuit diagram of the multilayer filter.
Figure 22:
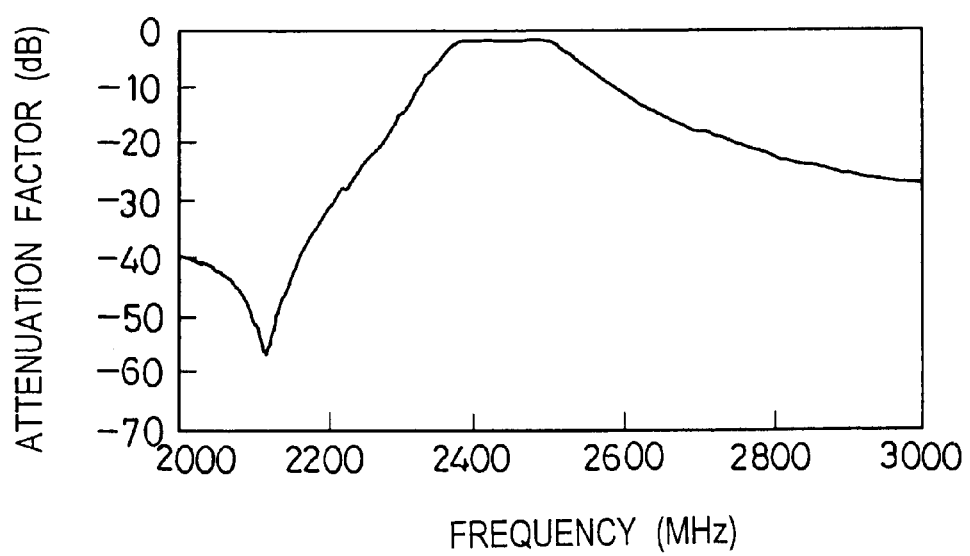
FIG. 22 is a graph showing transmission characteristics of the multilayer filter.

FIGS. 19 to 22 illustrate a multilayer filter according to a ninth embodiment of the invention. FIG. 19 is a perspective view, FIG. 20 is an exploded perspective view, FIG. 21 is an equivalent circuit diagram, and FIG. 22 is a transmission diagram. The multilayer filter is constructed as having two poles.

In FIGS. 19 to 21, the multilayer filter 60 includes a stack of constituent layers 60a to 60e, a pair of strip lines 68 and a pair of capacitor conductors 67 both disposed approximately at the center of the stack. The capacitor conductors 67 are formed on a lower constituent layer group 60d, and the strip lines 68 are formed on a constituent layer 60c thereon. GND conductors 65 are formed on upper and lower end surfaces of the constituent layers 60a to 60e so that the strip lines 68 and capacitor conductors 67 are interleaved therebetween. The strip lines 68, capacitor conductors 67 and GND conductors 65 are connected to end electrodes (external terminals) 62 formed on end sides and land patterns 61 formed slightly above or below the end electrodes 62. GND patterns 66 which are formed on opposite sides and slightly above or below therefrom are connected to GND conductors 65.

The strip lines 68 are strip lines 74a, 74b having a length of $\lambda g/4$ or shorter as shown in the equivalent circuit of FIG. 21. The capacitor conductors 67 constitute input and output coupling capacitances Ci. The strip lines 74a and 74b are coupled by a coupling capacitance Cm and a coupling coefficient M. Such an equivalent circuit indicates the implementation of a multilayer filter having transmission characteristics of the two pole type as shown in FIG. 22.

The multilayer filter 60 exhibits desired transmission characteristics in a frequency band of several hundreds of megahertz to several gigahertz when the constituent layers 60a to 60e have a dielectric constant of 2.6 to 40. It is desired to minimize the material loss of the strip line resonator, and hence, setting a dielectric dissipation factor (tan $\delta$) in the range of 0.0025 to 0.0075 is preferable. Then a choice may be made among the above-mentioned organic dielectric layers or the above-mentioned first and second composite dielectric layers. The respective constituent layers may be identical or different and an optimum combination thereof may be selected.

Example 10

Figure 23:
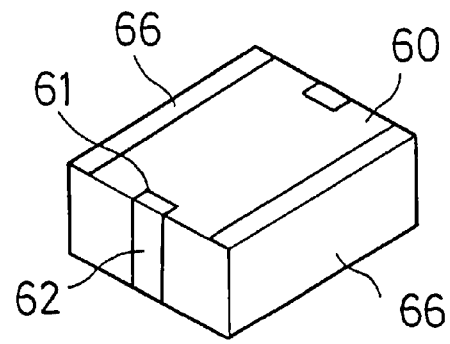
FIGS. 23 and 24 illustrate a multilayer filter as another exemplary electronic part of the invention.
Figure 24:
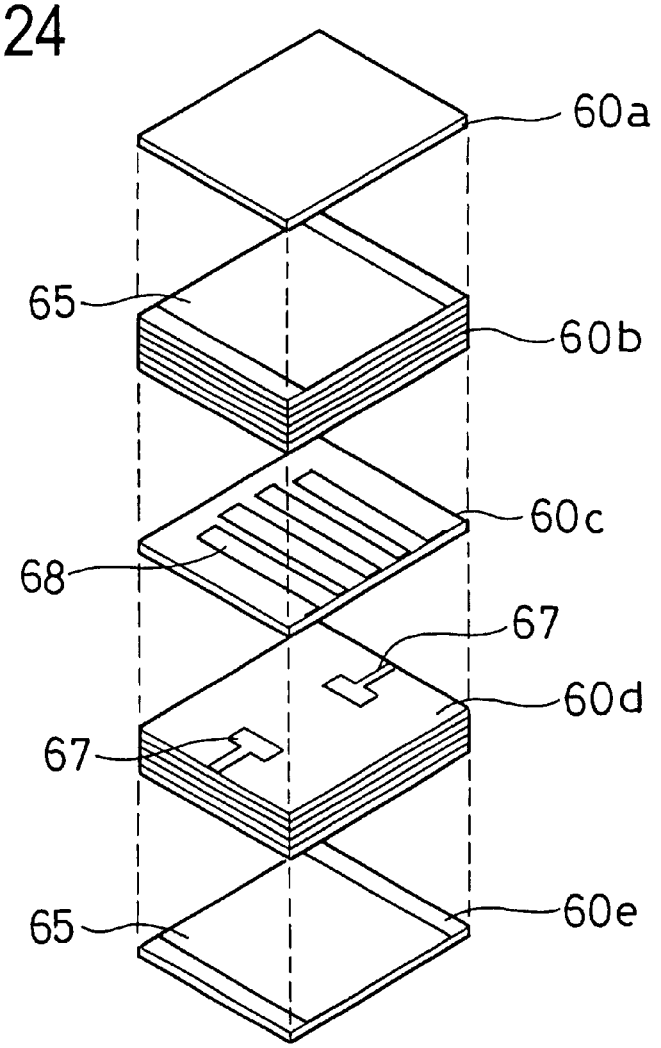
Figure 25:
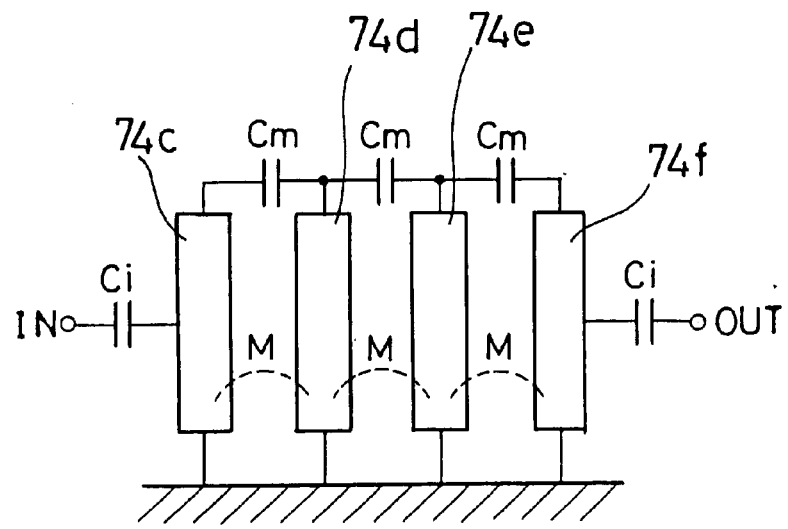
FIG. 25 is an equivalent circuit diagram of the multilayer filter.
Figure 26:
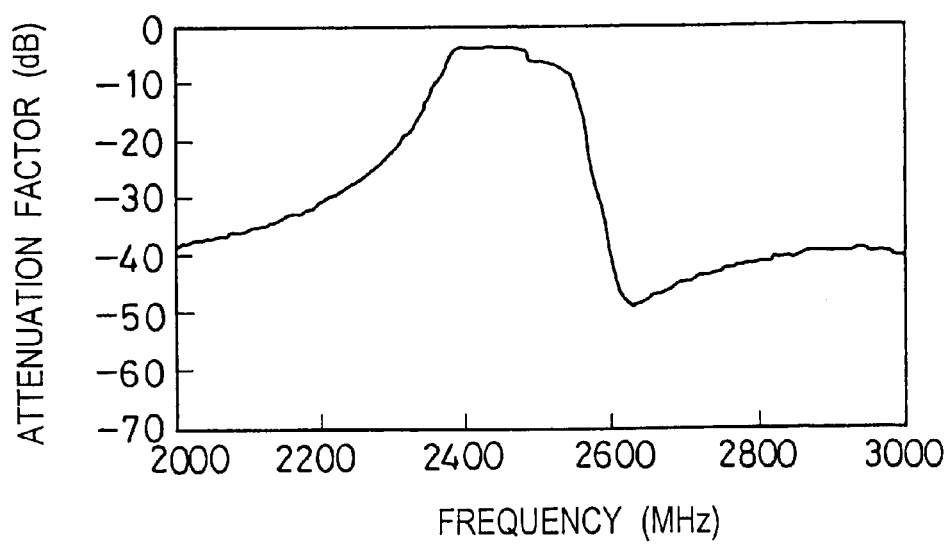
FIG. 26 is a graph showing transmission characteristics of the multilayer filter.

FIGS. 23 to 26 illustrate a multilayer filter according to a tenth embodiment of the invention. FIG. 23 is a perspective view, FIG. 24 is an exploded perspective view, FIG. 25 is an equivalent circuit diagram, and FIG. 26 is a transmission diagram. The multilayer filter is constructed as having four poles.

In FIGS. 23 to 26, the multilayer filter 60 includes a stack of constituent layers 60a to 60e, four strip lines 68 and a pair of capacitor conductors 67 both disposed approximately at the center of the stack. The four pole arrangement enables to produce sharp transmission characteristics as shown in FIG. 26. The remaining components are the same as in Example 9. The same components are designated by like numerals and their description is omitted.

Example 11

Figure 27:
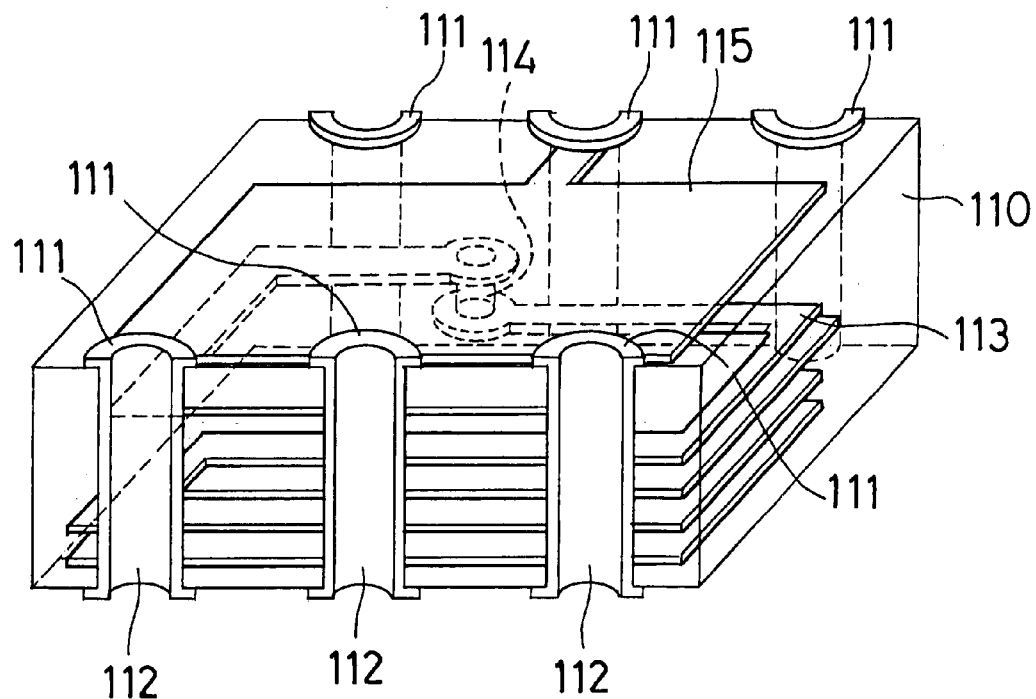
FIGS. 27 to 29 illustrate a coupler as one exemplary electronic part of the invention.
Figure 28:
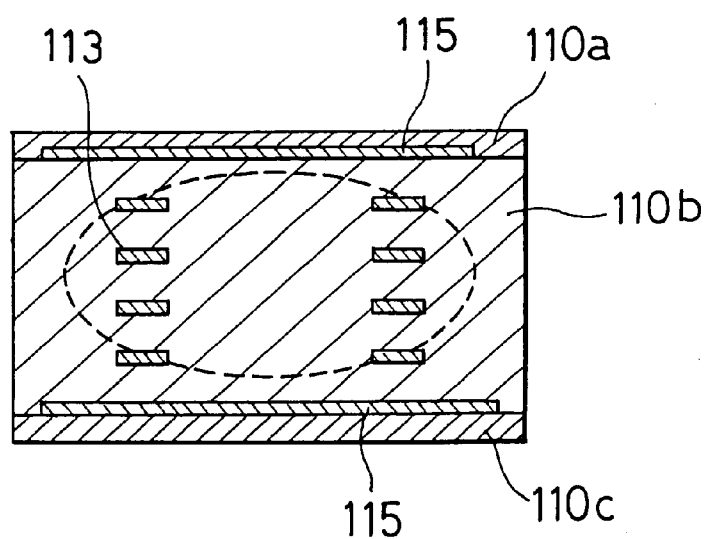
Figure 29:
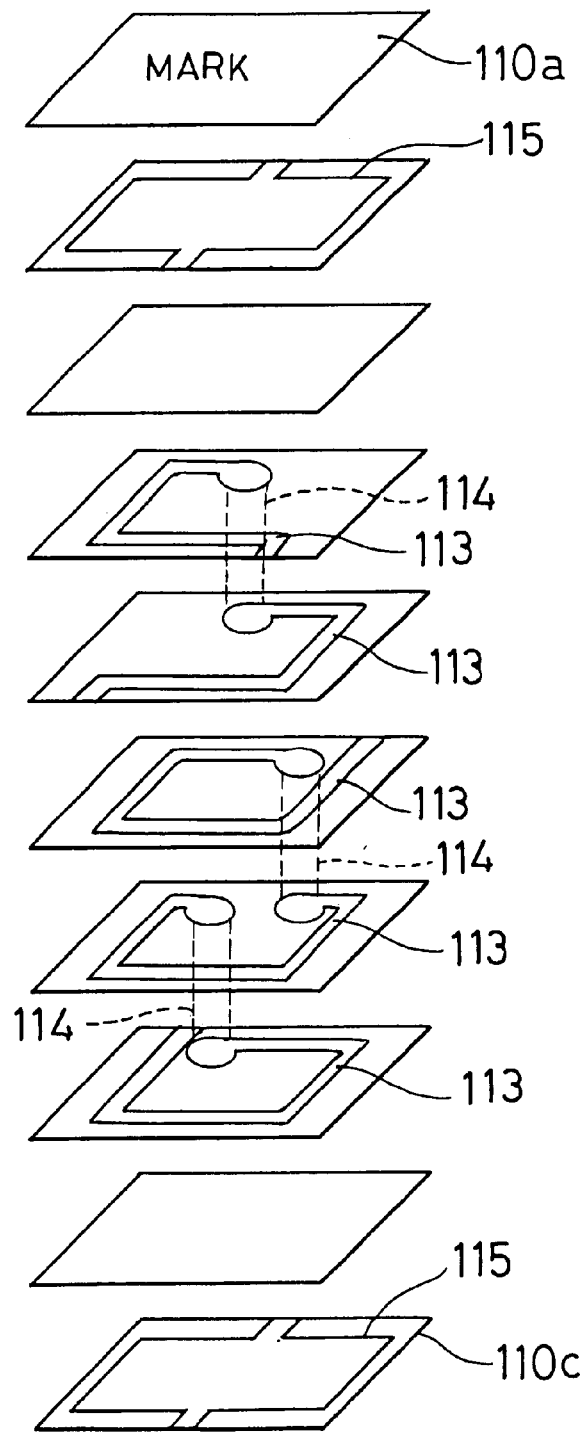
Figure 30:
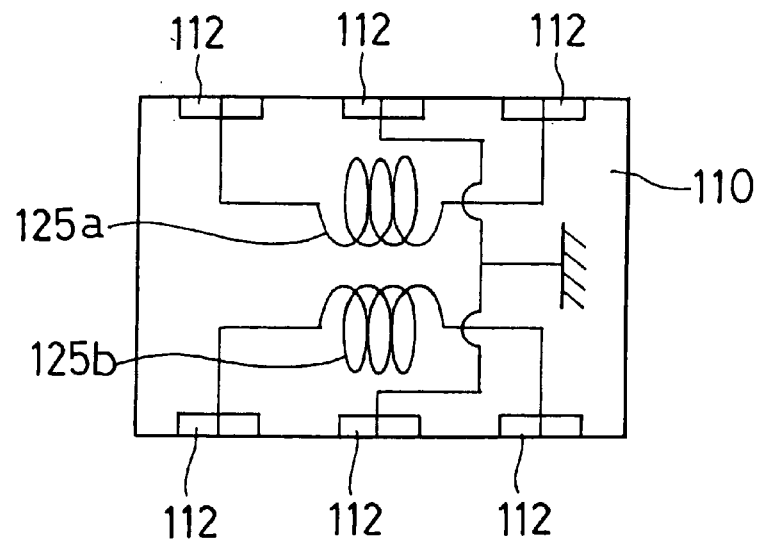
FIG. 30 illustrates the internal connections of the coupler.
Figure 31:
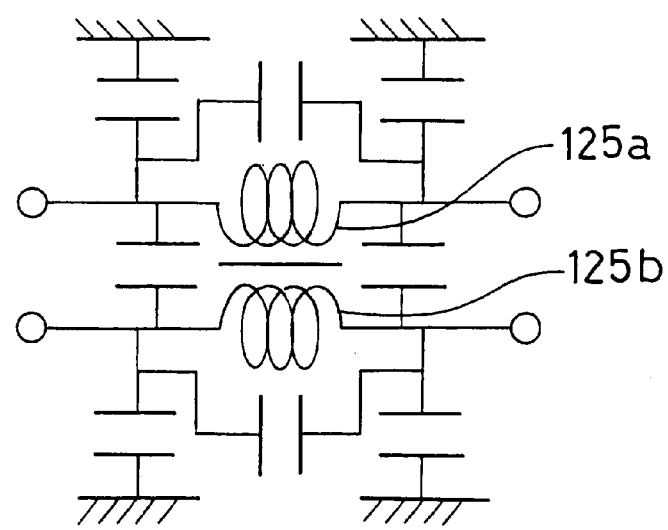
FIG. 31 is an equivalent circuit diagram of the coupler.

FIGS. 27 to 31 illustrate a coupler according to an 11th embodiment of the invention. FIG. 27 is a perspective view, FIG. 28 is a cross-sectional view, FIG. 29 is an exploded perspective view of respective constituent layers, FIG. 30 is a diagram of internal connection, and FIG. 31 is an equivalent circuit diagram.

In FIGS. 27 to 31, the coupler 110 includes a stack of constituent layers 110a to 110c of composite resin materials, internal GND conductors 115 formed and disposed on the top and bottom of the stack, and internal conductors 113 formed between the internal GND conductors 115. The internal conductors 113 are connected by via holes 114 in a spiral fashion so that two coils construct a transformer. Ends of the thus formed coils and internal GND conductors 115 are connected to through-vias 112 formed on end sides and land patterns 111 formed slightly above or below the through-vias 112 as shown in FIG. 30. With the above construction, a coupler 110 having two coils 125a and 125b coupled is obtained as shown in the equivalent circuit diagram of FIG. 31.

Where a wide band is to be realized, the constituent layers 110a to 110c of the coupler 110 should preferably have a minimized dielectric constant. For size reduction, on the other hand, a higher dielectric constant is desirable. Therefore, depending on the intended application, required performance and specifications, a material having an appropriate dielectric constant may be used. In most cases, setting a dielectric constant in the range of 2.6 to 40 ensures desired transmission characteristics in a band of several hundreds of megahertz to several gigahertz. For increasing the Q value of an internal inductor, a dielectric dissipation factor (tan $\delta$) of 0.0025 to 0.0075 is preferable. This choice enables to form an inductor having a minimized material loss and a high Q value, leading to a high performance coupler. Then a choice may be made among the above-mentioned organic dielectric layers or the above-mentioned first and second composite dielectric layers. The respective constituent layers may be identical or different and an optimum combination thereof may be selected.

Example 12

Figure 34:
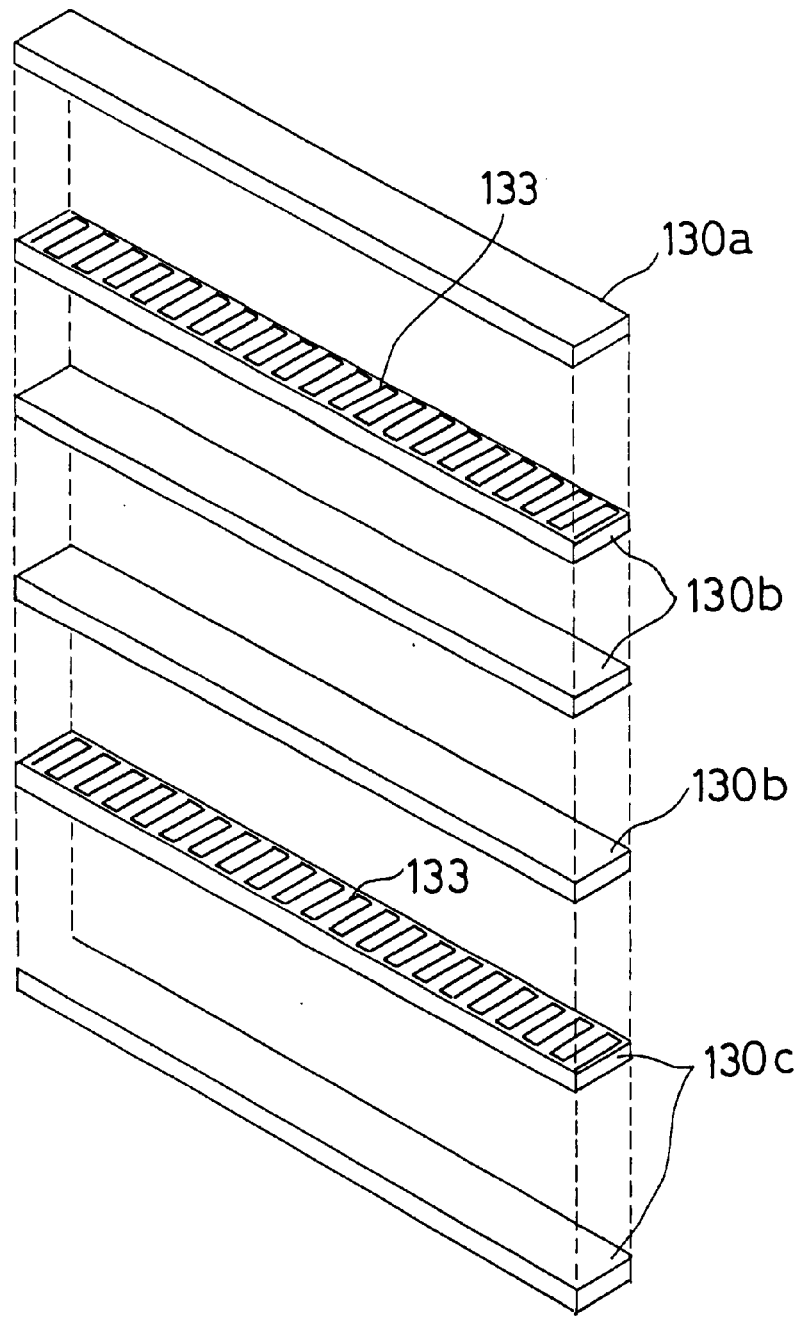

FIGS. 32 to 34 illustrate an antenna according to a 12th embodiment of the invention. FIG. 32 is a see-through perspective view, FIG. 33A is a plan view, FIG. 33B is a cross-sectional elevational view, FIG. 33C is a cross-sectional end view, and FIG. 34 is an exploded perspective view of respective constituent layers.

In FIGS. 32 to 34, the antenna 130 includes a stack of constituent layers (prepregs or substrates) 130a to 130c of composite resin materials, and internal conductors (antenna patterns) 133 formed on constituent layers 130b and 130c. Ends of the internal conductors 133 are connected to through-vias 132 formed at end sides of the antenna and land patterns 131 formed slightly above and below the through-vias 132. In this example, the internal conductor 133 is constructed as a reactance element having a length of about $\lambda g/4$ at the operating frequency and formed in a meander fashion.

Where a wide band is to be realized, the constituent layers 130a to 130c of the antenna 130 should preferably have a minimized dielectric constant. For size reduction, on the other hand, a higher dielectric constant is desirable. Therefore, depending on the intended application, required performance and specifications, a material having an appropriate dielectric constant may be used. In most cases, a dielectric constant in the range of 2.6 to 40 and a dielectric dissipation factor (tan δ) of 0.0075 to 0.025 are preferable. Then a choice may be made among the above-mentioned organic dielectric layers or the above-mentioned first and second composite dielectric layers. This choice enables to spread the frequency range and increase the precision of formation. It is also necessary to minimize the material loss. By setting a dielectric dissipation factor (tan δ) of 0.0025 to 0.0075, an antenna having a minimum material loss is achievable. In another application, it is preferable to have a magnetic permeability of 3 to 20, and a choice may be made of the above-mentioned composite magnetic layers. The respective constituent layers may be identical or different and an optimum combination thereof may be selected.

Example 13

Figure 35:
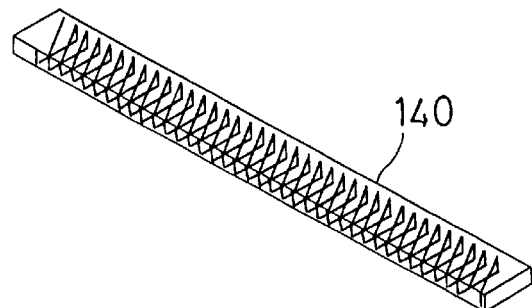
FIGS. 35 and 36 illustrate an antenna as another exemplary electronic part of the invention.
Figure 36:
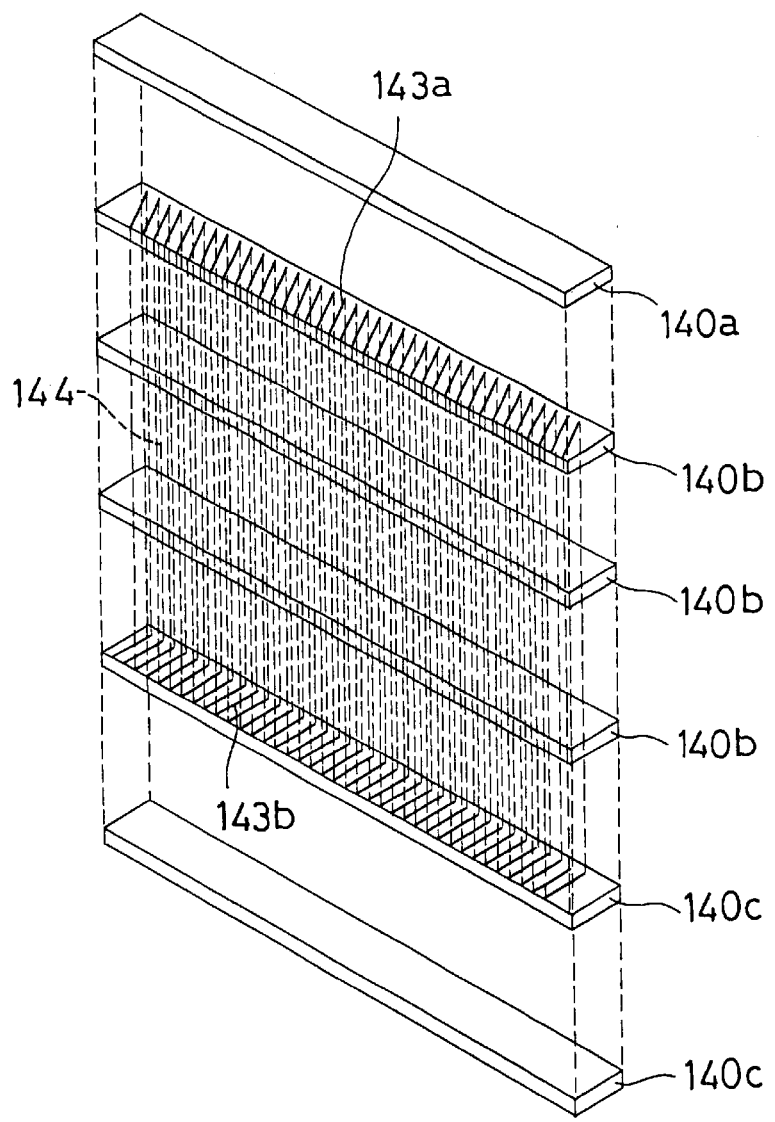

FIGS. 35 and 36 illustrate an antenna according to a 13th embodiment of the invention. FIG. 35 is a see-through perspective view, and FIG. 36 is an exploded perspective view of respective constituent layers. The antenna in this example is constructed as an antenna having a helical internal electrode.

In FIGS. 35 and 36, the antenna 140 includes a stack of constituent layers (prepregs or substrates) 140a to 140c of composite resin materials, and internal conductors (antenna patterns) 143a, 143b formed on constituent layers 140b and 140c. The upper and lower internal conductors 143a and 143b are connected by via holes 144 to form a helical inductance device. The remaining components are the same as in Example 12. The same components are designated by like numerals and their description is omitted.

Example 14

Figure 37:
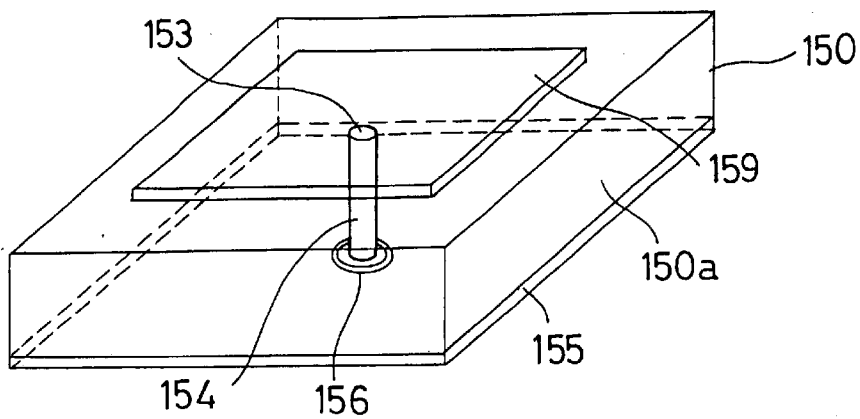
FIGS. 37 and 38 illustrate a patch antenna as one exemplary electronic part of the invention.
Figure 38:
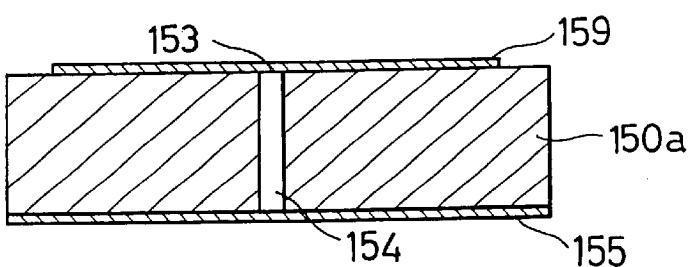

FIGS. 37 and 38 illustrate a patch antenna according to a 14th embodiment of the invention. FIG. 37 is a see-through perspective view, and FIG. 38 is a cross-sectional view.

In FIGS. 37 and 38, the patch antenna 150 includes a constituent layer (prepreg or substrate) 150a of composite resin material, a patch conductor (antenna pattern) 159 formed on the top of constituent layer 150a, and a GND conductor 155 formed on the bottom of constituent layer 150a so as to oppose to the patch conductor 159. A power supply through conductor 154 is connected to the patch conductor 159 at a power supply site 153. An annular gap 156 is provided between the through conductor 154 and the GND conductor 155 so that the through conductor 154 may not be connected to the GND conductor 155. Then power supply is provided from below the GND conductor 155 via the through conductor 154.

Where a wide band is to be realized, the constituent layer 150a of the patch antenna 150 should preferably have a minimized dielectric constant. For size reduction, on the other hand, a higher dielectric constant is desirable. Therefore, depending on the intended application, required performance and specifications, a material having an appropriate dielectric constant may be used. In most cases, a dielectric constant in the range of 2.6 to 40 and a dielectric dissipation factor (tan δ) of 0.0075 to 0.025 are preferable. Then a choice may be made among the above-mentioned organic dielectric layers or the above-mentioned first and second composite dielectric layers. This choice enables to spread the frequency range and increase the precision of formation. It is also necessary to minimize the material loss. By setting a dielectric dissipation factor (tan δ) of 0.0025 to 0.0075, an antenna having a minimum material loss and a high radiation efficiency is achievable.

In a frequency band of less than several hundreds of megahertz, a magnetic material exerts a wavelength reducing effect as a dielectric material does, which enables to increase the inductance of a radiation element. By matching the frequency peak of Q, a high Q value is available even at a relatively low frequency. Then a magnetic permeability of 3 to 20 is preferable in some applications and use of the above-mentioned composite magnetic layers is preferred. This enables performance improvement and size reduction in a frequency band of less than several hundreds of megahertz. The respective constituent layers may be identical or different and an optimum combination thereof may be selected.

The patch antenna becomes easy to design if the dielectric constant of the base substrate is finely adjustable. However, the use of many materials having different dielectric constants is awkward to manage. It is then recommended to combine several materials having different dielectric constants (to form a multilayer structure) so as to tailor the dielectric constant of the entire structure. This enables fine adjustment of a dielectric constant, increases the degree of freedom of design, and facilitates the design. An antenna featuring small size and high performance is obtainable.

Example 15

Figure 39:
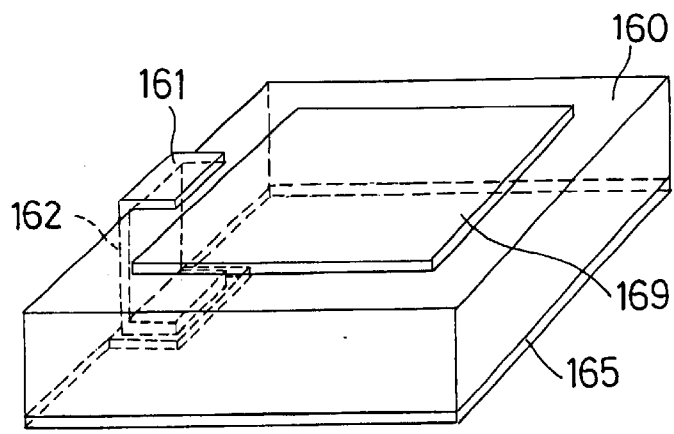
FIGS. 39 and 40 illustrate a patch antenna as another exemplary electronic part of the invention.
Figure 40:
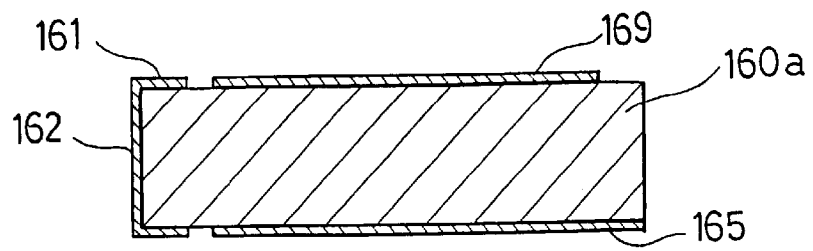

FIGS. 39 and 40 illustrate a patch antenna according to a 15th embodiment of the invention. FIG. 39 is a see-through perspective view, and FIG. 40 is a cross-sectional view.

In FIGS. 39 and 40, the patch antenna 160 includes a constituent layer (prepreg or substrate) 160a of composite resin material, a patch conductor (antenna pattern) 169 formed on the top of constituent layer 160a, and a GND conductor 165 formed on the bottom of constituent layer 160a so as to oppose to the patch conductor 169. A power supply conductor 161 is provided near the patch conductor 169, but spaced therefrom. Power supply is provided to the power supply conductor 161 via a power supply terminal 162. The power supply terminal 162 may be formed from copper, gold, palladium, platinum, aluminum or the like by effecting suitable treatment such as plating, termination, printing, sputtering or evaporation. The remaining components are the same as in Example 14. The same components are designated by like numerals and their description is omitted.

Example 16

Figure 41:
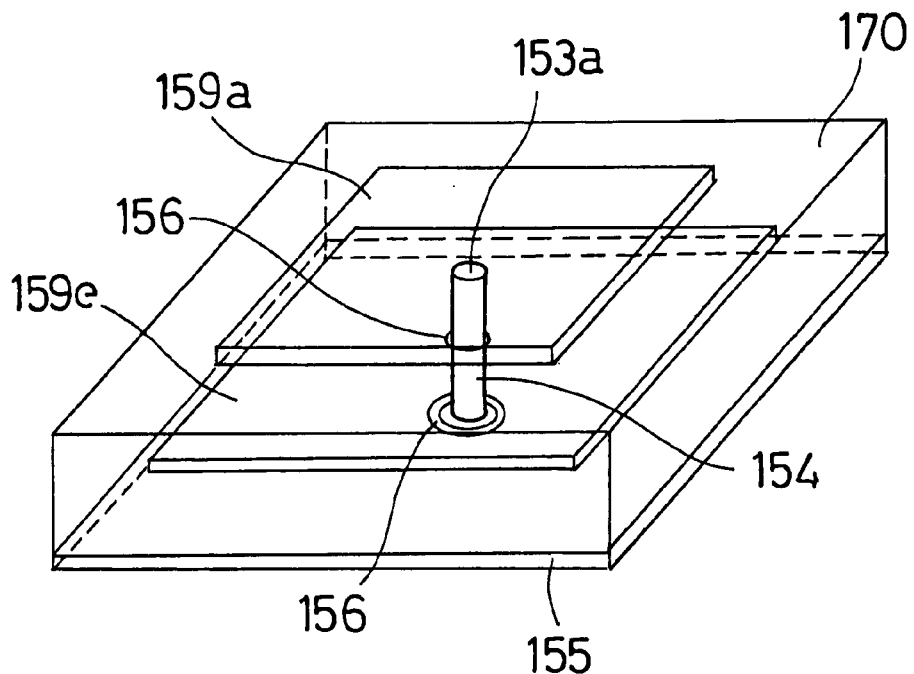
FIGS. 41 and 42 illustrate a patch antenna as a further exemplary electronic part of the invention.
Figure 42:
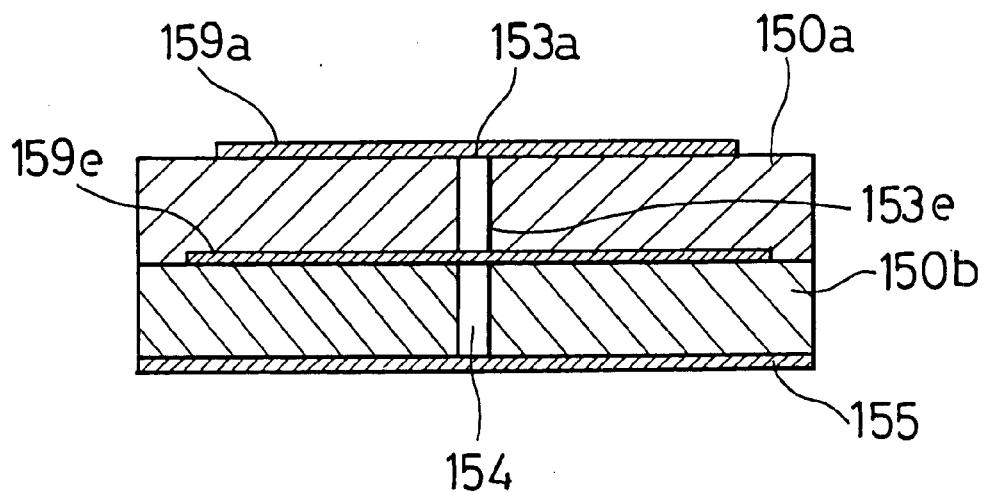

FIGS. 41 and 42 illustrate a patch antenna according to a 16th embodiment of the invention. FIG. 41 is a see-through perspective view, and FIG. 42 is a cross-sectional view.

In FIGS. 41 and 42, the patch antenna 170 includes constituent layers (prepregs or substrates) 150a, 150b of composite resin materials, patch conductors 159a, 159e formed on the constituent layers 150a, 150b, and a GND conductor 155 formed on the bottom of constituent layer 150b so as to oppose to the patch conductors 159a, 159e. A power supply through conductor 154 is connected to the patch conductor 159a at a power supply site 153a. A gap 156 is provided between the through conductor 154 and the GND conductor 155 and patch conductor 159e so that the through conductor 154 may not be connected to the GND conductor 155 and patch conductor 159e. Then power supply is provided to the patch conductor 159a from below the GND conductor 155 via the through conductor 154. At this point, power supply is provided to the patch conductor 159e by the capacitive coupling with the patch conductor 159a and the capacitance due to the gap with the through conductor 154. The remaining components are the same as in Example 15. The same components are designated by like numerals and their description is omitted.

Example 17

Figure 43:
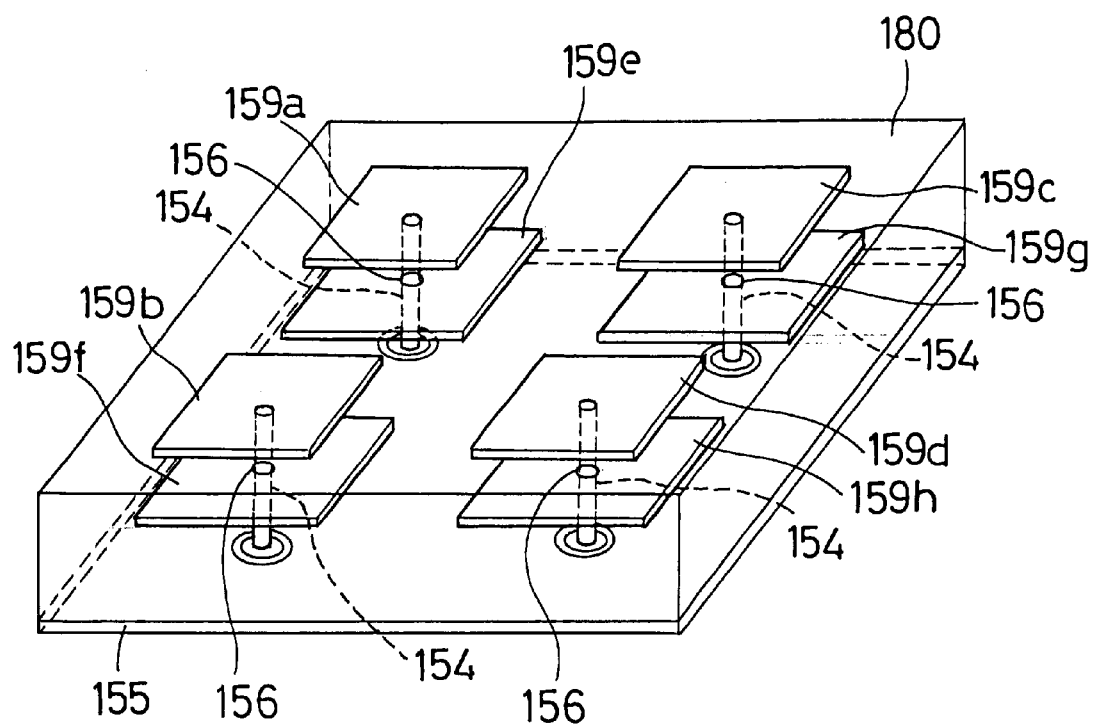
FIGS. 43 and 44 illustrate a patch antenna as a still further exemplary electronic part of the invention.
Figure 44:
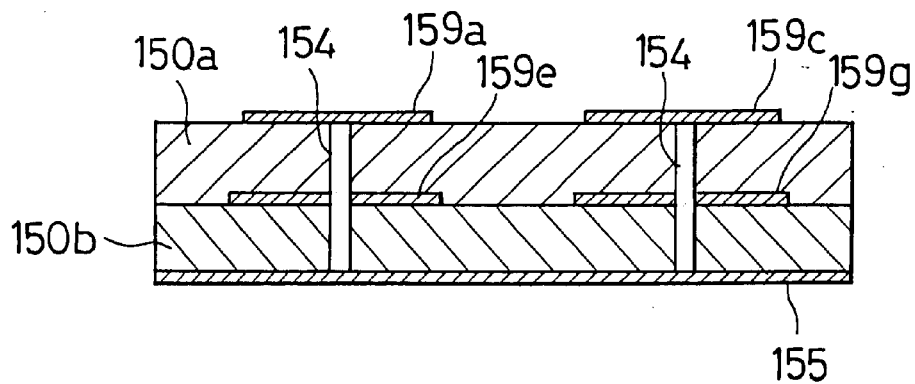

FIGS. 43 and 44 illustrate a multi-array patch antenna according to a 17th embodiment of the invention. FIG. 43 is a see-through perspective view, and FIG. 44 is a cross-sectional view.

As opposed to Example 16 in which the patch antenna is constructed singly, four patch antennas are arranged in an array in this example. In FIGS. 43 and 44, the array includes constituent layers 150a, 150b of composite resin materials, patch conductors 159a, 159b, 159c, 159d formed on the constituent layer 150a, patch conductors 159e, 159f, 159g, 159h formed on the constituent layer 150b, and a GND conductor 155 formed on the bottom of the constituent layer 150b so as to oppose to the patch conductors 159a, 159e. The remaining components are the same as in Example 16. The same components are designated by like numerals and their description is omitted.

The array formation enables to reduce the size of a set and the number of parts.

Example 18

Figure 45:
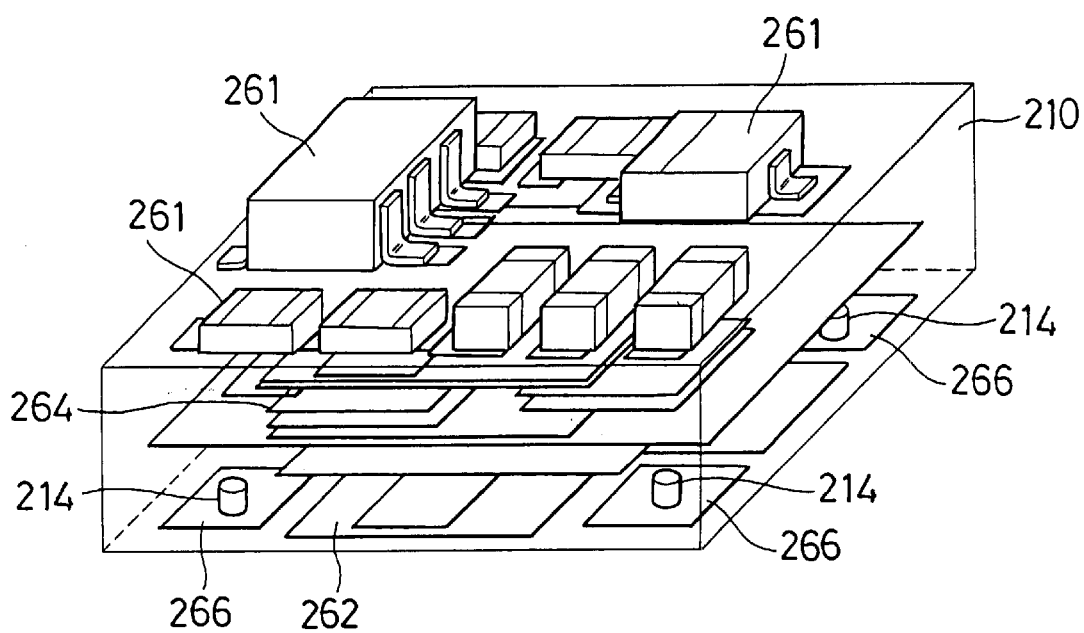
FIGS. 45 and 46 illustrate a VCO as one exemplary electronic part of the invention.
Figure 46:
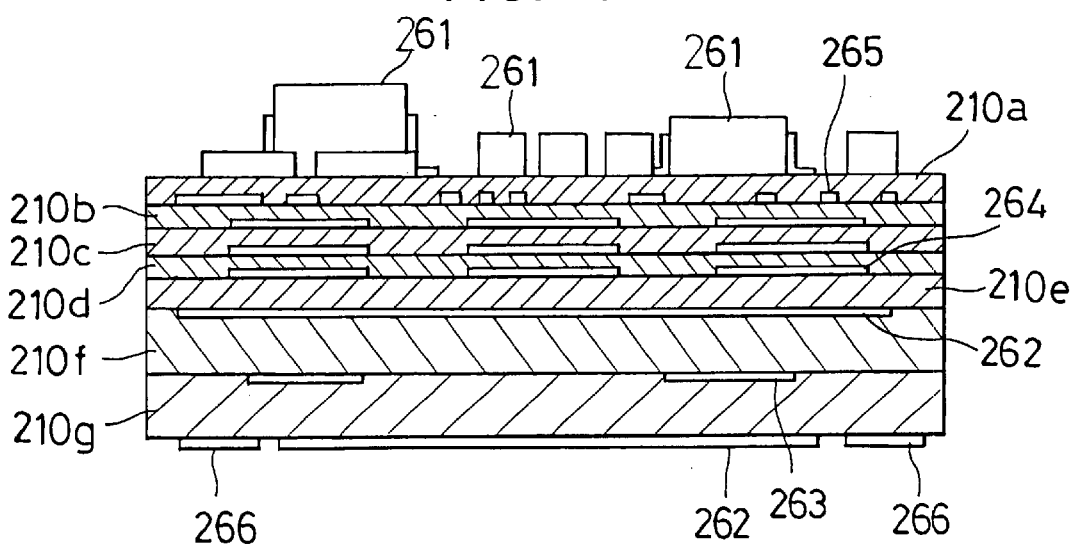
Figure 47:
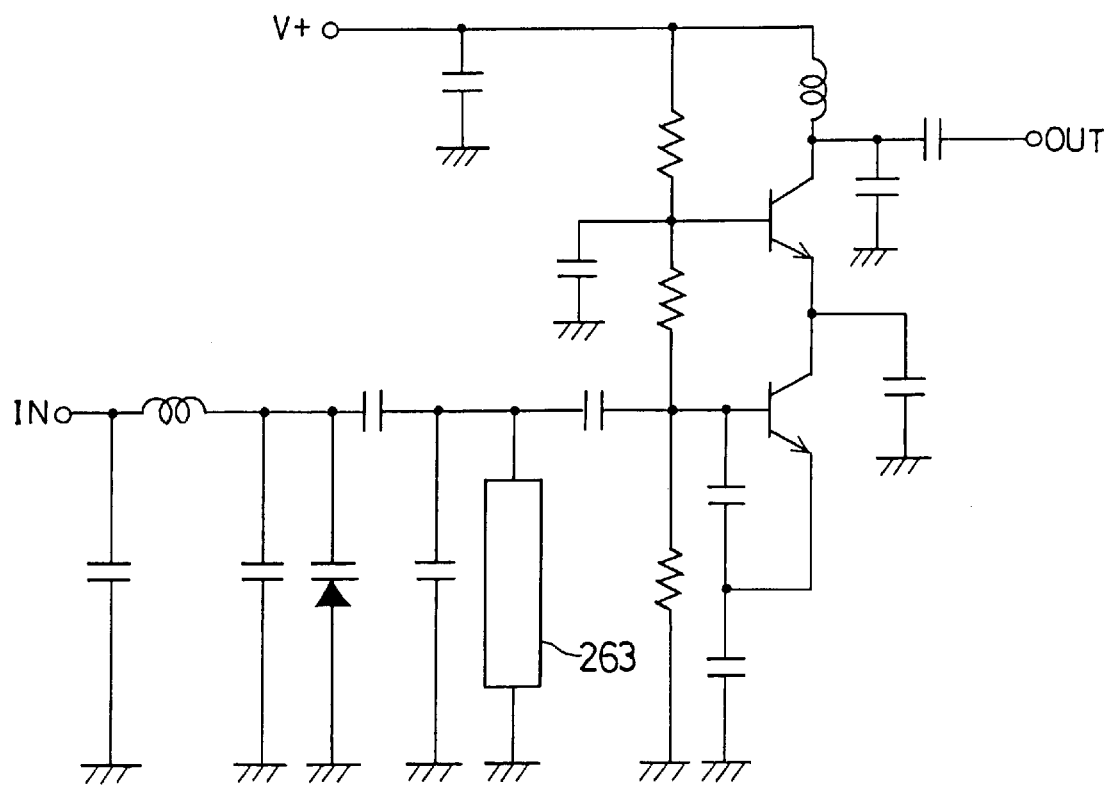
FIG. 47 is an equivalent circuit diagram of the VCO.

FIGS. 45 to 47 illustrate a voltage controlled oscillator (VCO) according to an 18th embodiment of the invention. FIG. 45 is a see-through perspective view, FIG. 46 is a cross-sectional view, and FIG. 47 is an equivalent circuit diagram.

In FIGS. 45 to 47, the VCO includes a stack of constituent layers 210a to 210g of composite resin materials, electronic parts 261 disposed and formed on the stack including capacitors, inductors, semiconductors and registers, and conductor patterns 262, 263, 264 formed above, below and intermediate the constituent layers 210a to 210g. Since the VCO is constructed to an equivalent circuit as shown in FIG. 47, it further includes strip lines 263, capacitors, signal lines, semiconductors and power supply lines. It is advantageous to form the respective constituent layers from materials selected appropriate for their function.

For the constituent layers 210f, 210g constructing a resonator in this example, it is preferred to use organic dielectric layers or first or second composite dielectric layers having a dielectric dissipation factor of 0.0025 to 0.0075. For the constituent layers 210c to 210e constructing a capacitor, it is preferred to use first or second composite dielectric layers so as to give a dielectric dissipation factor of 0.0075 to 0.025 and a dielectric constant of 5 to 40. For wiring and the constituent layers 210a, 210b constructing an inductor, it is preferred to use organic dielectric layers having a dielectric dissipation factor of 0.0025 to 0.0075 and a dielectric constant of 2.6 to 3.5.

On the surface of constituent layers 210a to 210g, there are provided internal conductors including strip line 263, GND conductor 262, capacitor conductor 264, wiring inductor conductor 265 and terminal conductor 266. Upper and lower internal conductors are connected by via holes 214. Electronic parts 261 are mounted on the surface, completing a VCO corresponding to the equivalent circuit of FIG. 47.

This construction enables to provide an appropriate dielectric constant, Q and dielectric dissipation factor for a distinct function, arriving at a high performance, small size, and thin part.

Example 19

Figure 48:
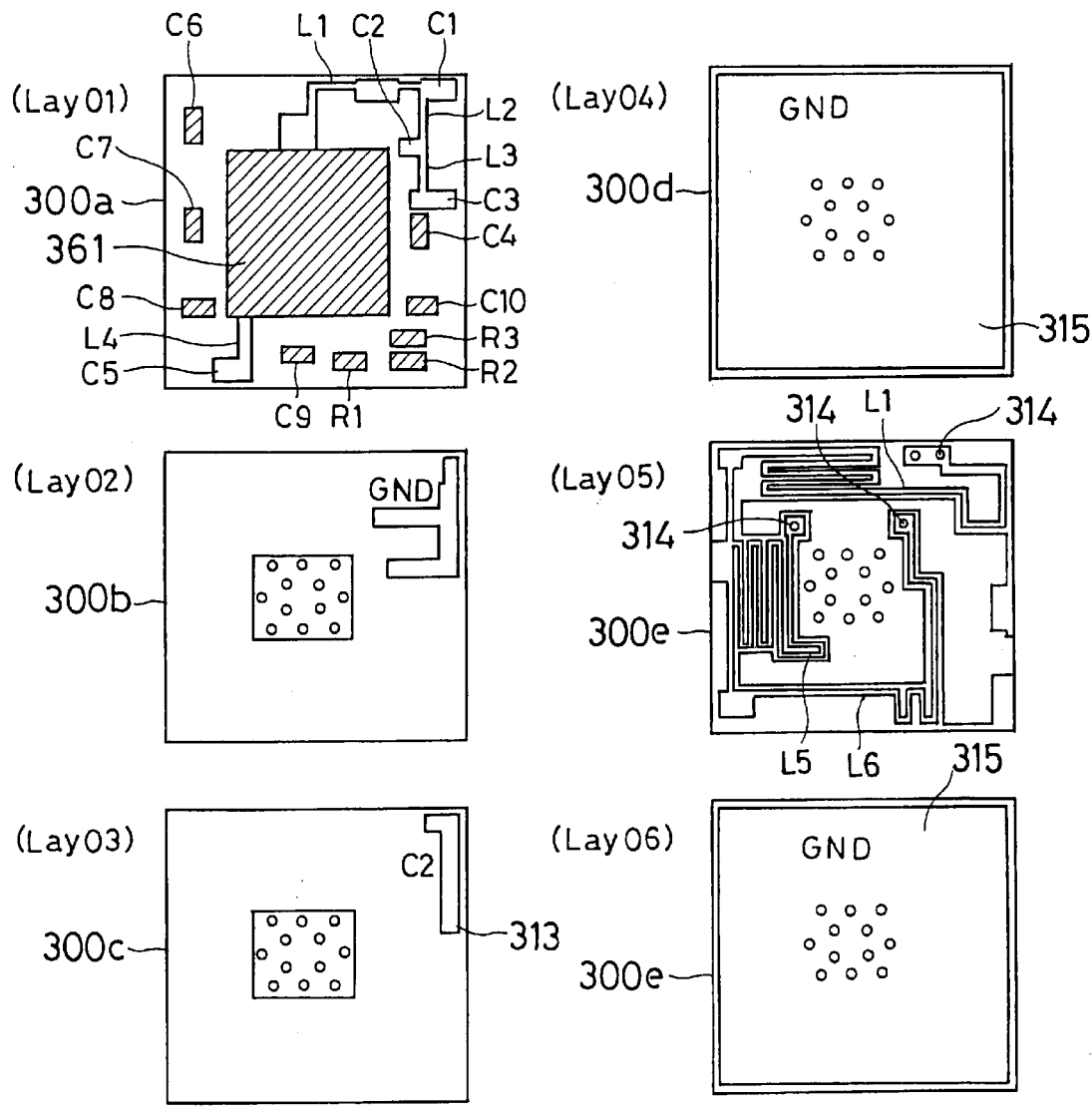
FIGS. 48 and 49 illustrate a power amplifier as one exemplary electronic part of the invention.
Figure 49:
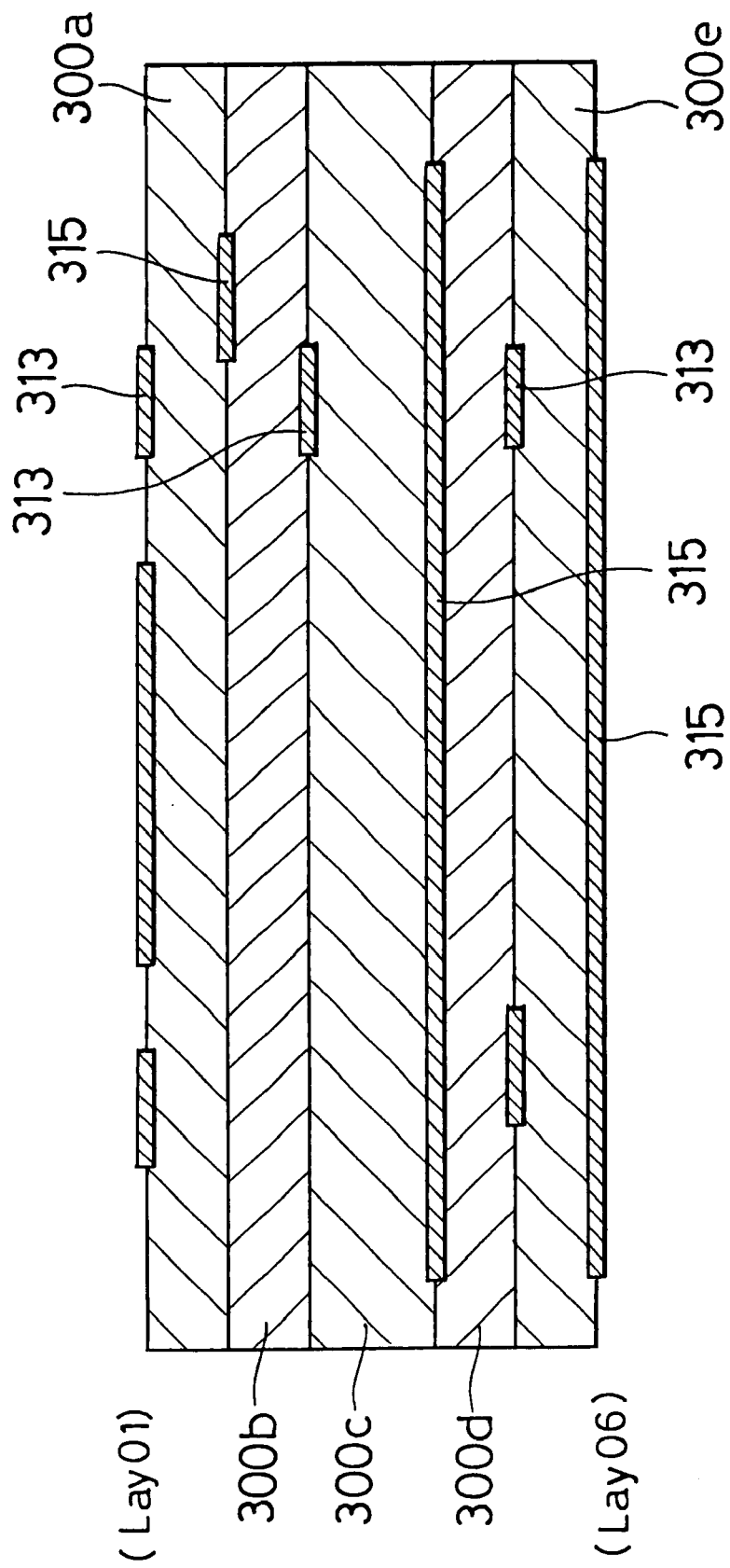
Figure 50:
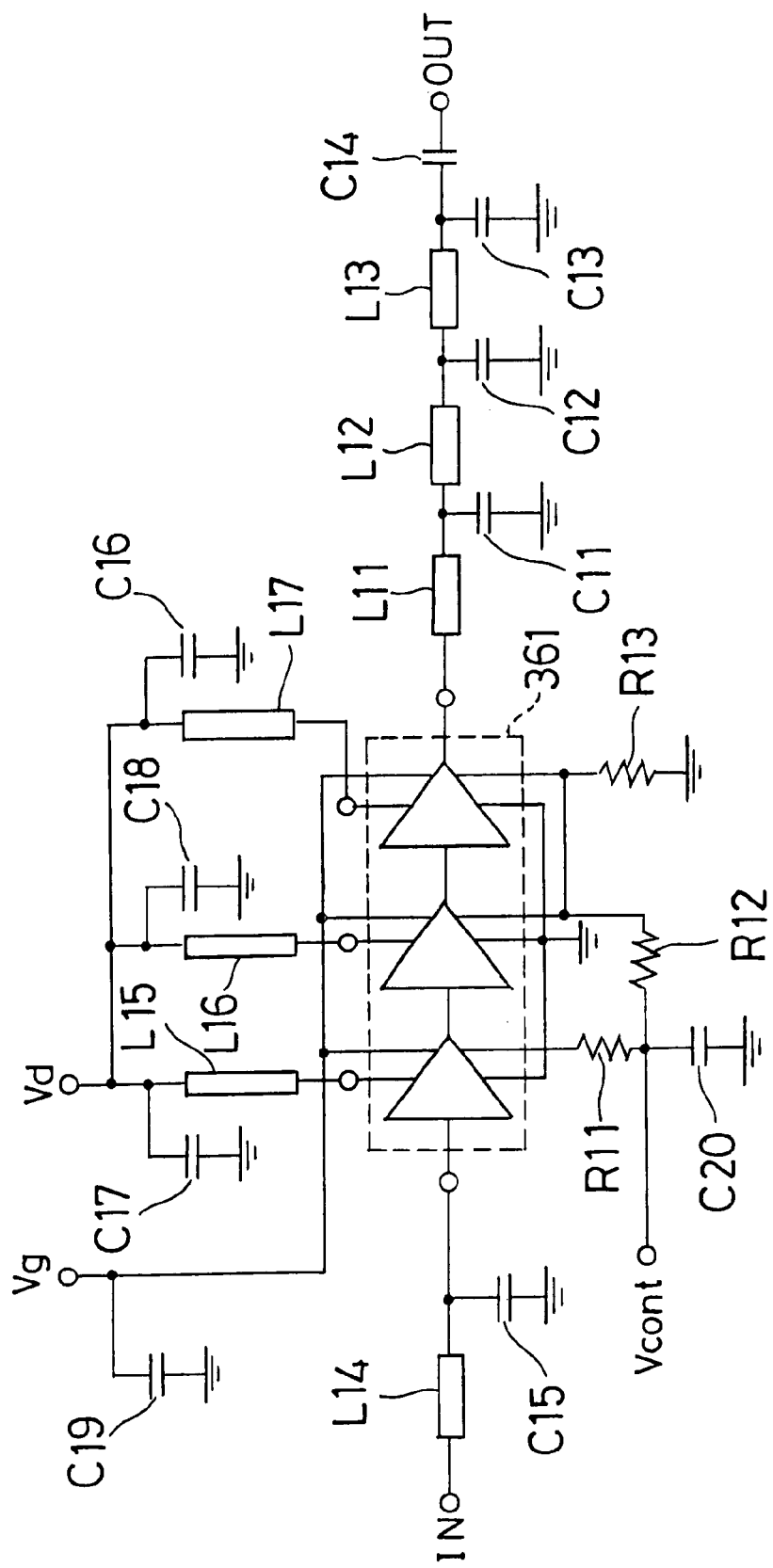
FIG. 50 is an equivalent circuit diagram of the power amplifier.

FIGS. 48 to 50 illustrate a power amplifier according to a 19th embodiment of the invention. FIG. 48 is an exploded plan view of respective constituent layers, FIG. 49 is a cross-sectional view, and FIG. 50 is an equivalent circuit diagram.

In FIGS. 48 to 50, the power amplifier includes a stack of constituent layers 300a to 300e, electronic parts 361 formed thereon including capacitors, inductors, semiconductors and registers, and conductor patterns 313, 315 formed above, below and intermediate the constituent layers 300a to 300e. Since the power amplifier is constructed to an equivalent circuit as shown in FIG. 50, it further includes strip lines L11 to L17, capacitors C11 to C20, signal lines, and power supply lines to semiconductor devices. It is advantageous to form the respective constituent layers from materials selected appropriate for their function.

For the constituent layers 300d, 300e constructing strip lines in this example, it is preferred to use organic dielectric layers or first or second composite dielectric layers having a dielectric dissipation factor of 0.0075 to 0.025 and a dielectric constant of 2.6 to 40. For the constituent layers 300a to 300c constructing a capacitor, it is preferred to use first or second composite dielectric layers so as to give a dielectric dissipation factor of 0.0075 to 0.025 and a dielectric constant of 5 to 40.

On the surface of constituent layers 300a to 300e, there are provided internal conductors 313, GND conductors 315, and the like. Upper and lower internal conductors are connected by via holes 314. Electronic parts 361 are mounted on the surface, completing a power amplifier corresponding to the equivalent circuit of FIG. 50.

This construction enables to provide an appropriate dielectric constant, Q and dielectric dissipation factor for a distinct function, arriving at a high performance, small size, and thin part.

Example 20

Figure 51:
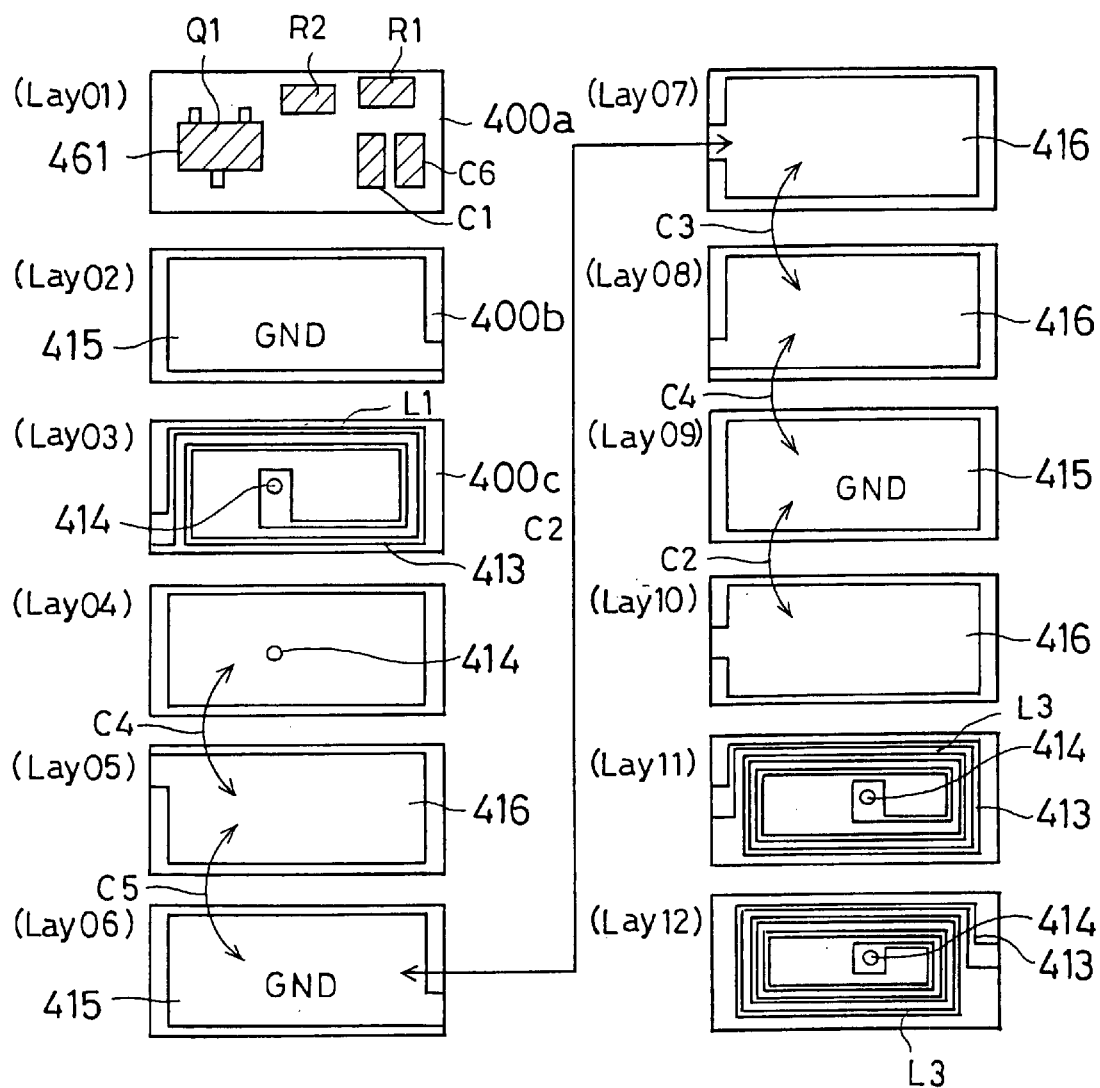
FIGS. 51 and 52 illustrate a superposed module as one exemplary electronic part of the invention.
Figure 52:
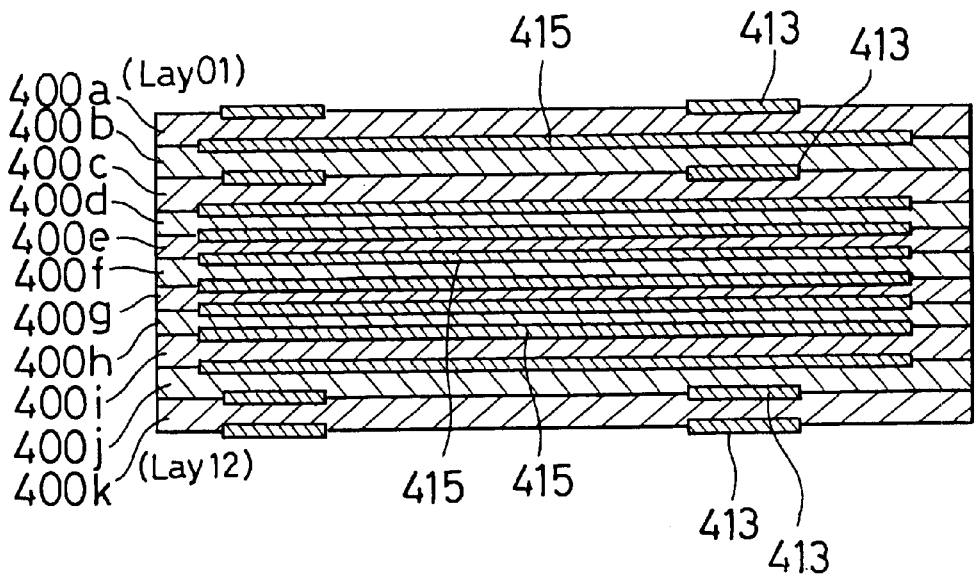
Figure 53:
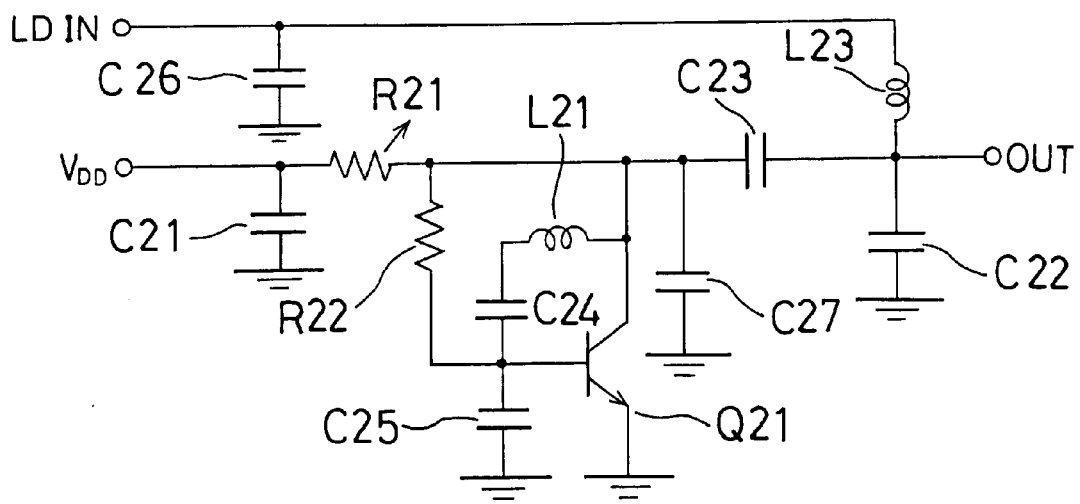
FIG. 53 is an equivalent circuit diagram of the superposed module.

FIGS. 51 to 53 illustrate a superposed module according to a 20th embodiment of the invention, the module finding use as an optical pickup or the like. FIG. 51 is an exploded plan view of respective constituent layers, FIG. 52 is a cross-sectional view, and FIG. 53 is an equivalent circuit diagram.

In FIGS. 51 to 53, the superposed module includes a stack of constituent layers 400*a* to 400*k*, electronic parts 461 formed thereon including capacitors, inductors, semiconductors and registers, and conductor patterns 413, 415 formed above, below and intermediate the constituent layers 400*a* to 400*k*. Since the superposed module is constructed to an equivalent circuit as shown in FIG. 53, it further includes inductors L21, L23, capacitors C21 to C27, signal lines, and power supply lines to semiconductor devices. It is advantageous to form the respective constituent layers from materials selected appropriate for their function.

For the constituent layers 400*d* to 400*h* constructing capacitors in this example, it is preferred to use second composite dielectric layers so as to give a dielectric dissipation factor of 0.0075 to 0.025 and a dielectric constant of 10 to 40. For the constituent layers 400*a* to 400*c*, 400*j* to 400*k* constructing inductors, it is preferred to use organic dielectric layers having a dielectric dissipation factor of 0.0025 to 0.0075 and a dielectric constant of 2.6 to 3.5.

On the surface of constituent layers 400*a* to 400*k*, there are provided internal conductors 413, GND conductors 415, and the like. Upper and lower internal conductors are connected by via holes 414. Electronic parts 461 are mounted on the surface, completing a superposed module corresponding to the equivalent circuit of FIG. 53.

This construction enables to provide an appropriate dielectric constant, Q and dielectric dissipation factor for a distinct function, arriving at a high performance, small size, and thin part.

Example 21

Figure 54:
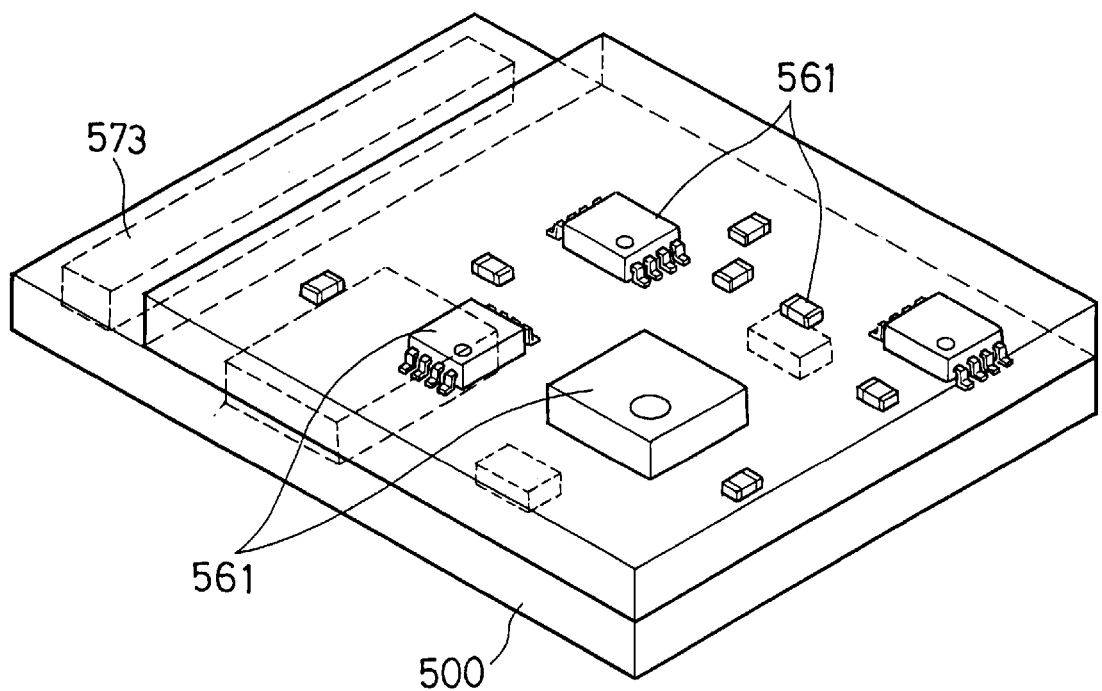
FIGS. 54 to 57 illustrate an RF unit as one exemplary electronic part of the invention, FIG. 54 being a perspective view of the unit, FIG. 55 being a perspective view of the substrate, FIG. 56 being an exploded perspective view, and FIG. 57 being a cross-sectional view.
Figure 55:
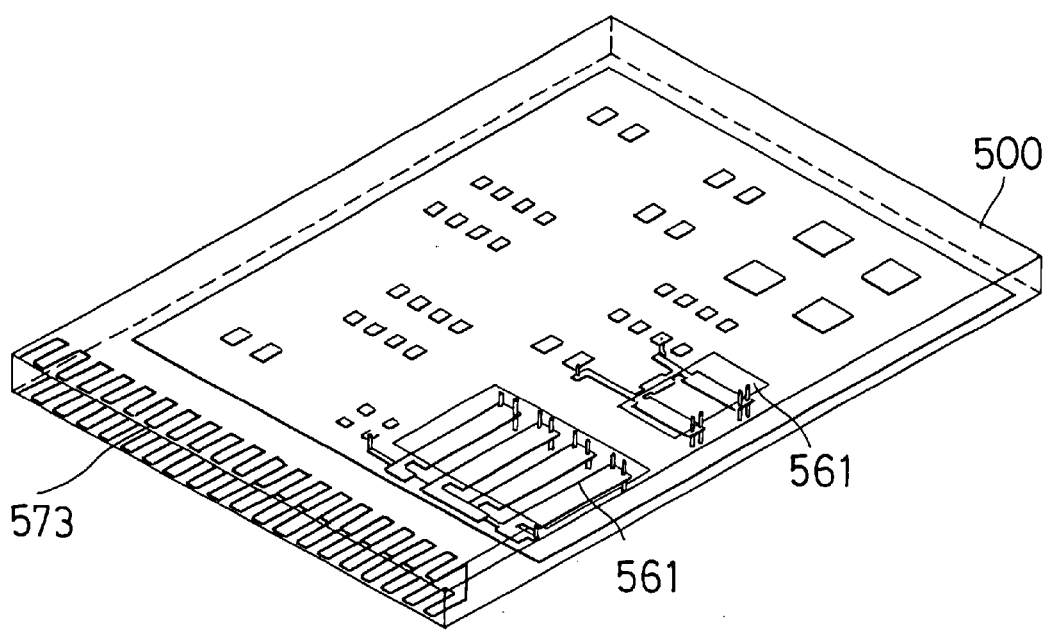
Figure 56:
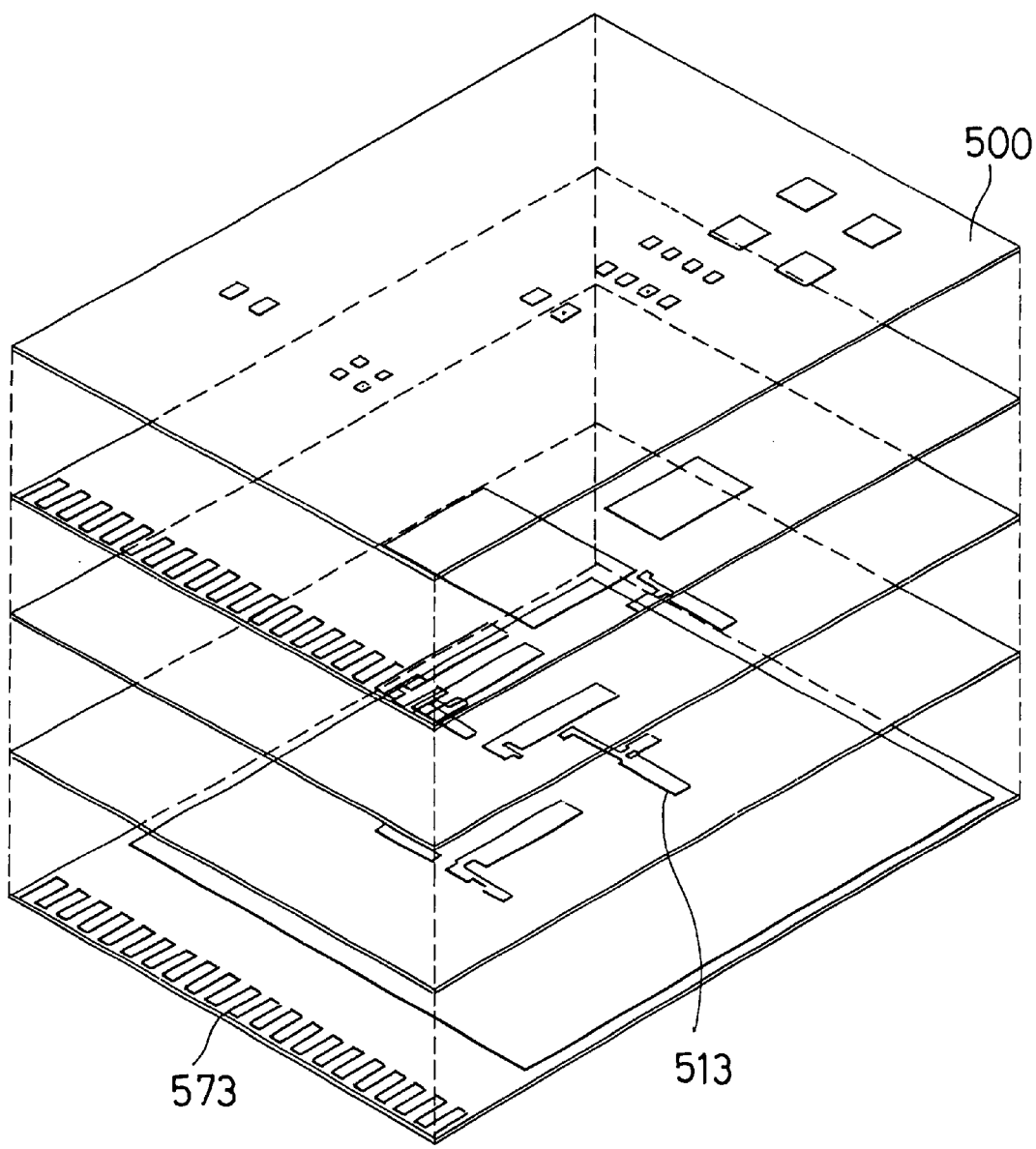
Figure 57:
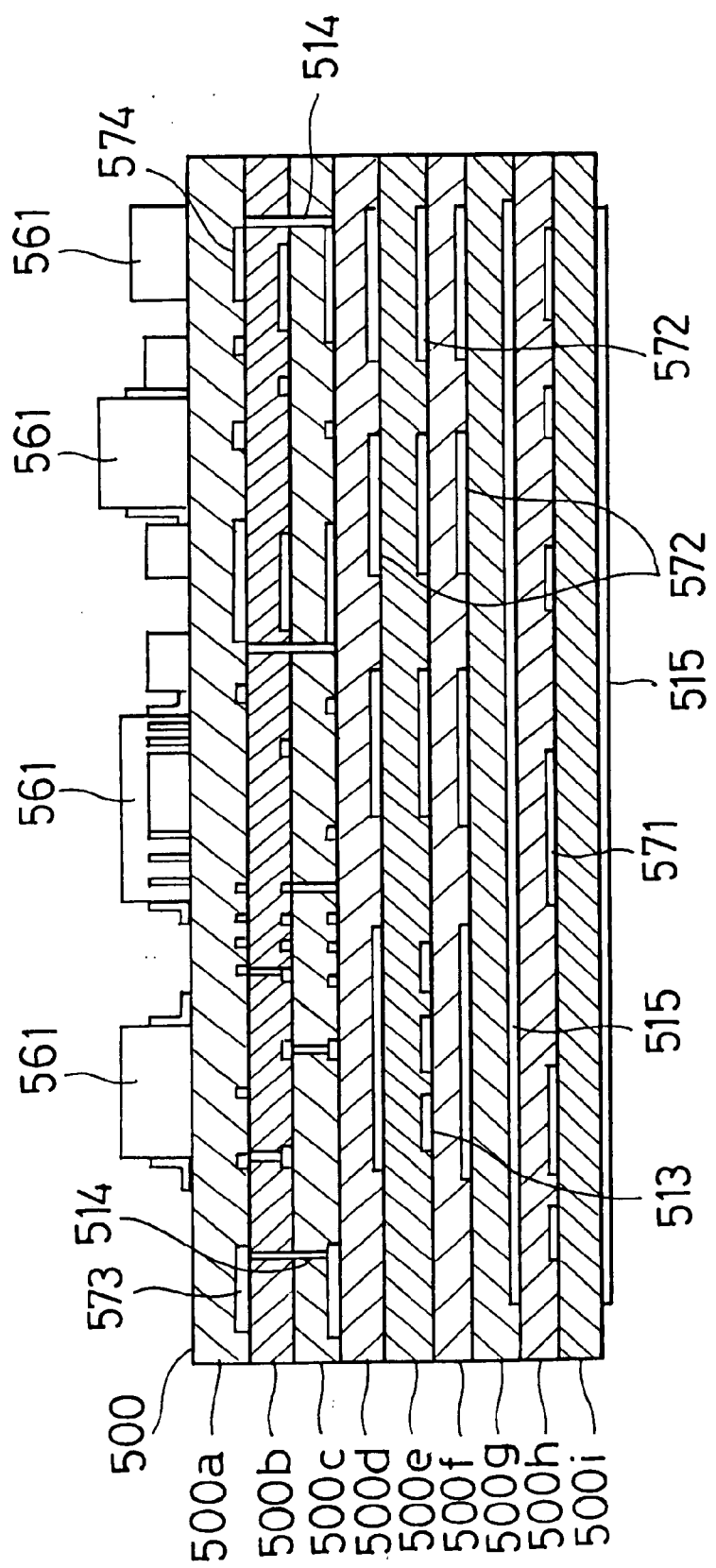

FIGS. 54 to 57 illustrate a RF module according to a 21st embodiment of the invention. FIG. 54 is a perspective view, FIG. 55 is a perspective view with an outer housing removed, FIG. 56 is an exploded perspective view of respective constituent layers, and FIG. 57 is a cross-sectional view.

In FIGS. 54 to 57, the RF module includes a stack of constituent layers 500*a* to 500*i*, electronic parts 561 formed and disposed thereon including capacitors, inductors, semiconductors and registers, conductor patterns 513, 515, 572 formed above, below and intermediate the constituent layers 500*a* to 500*i*, and an antenna pattern 573. As mentioned just above, the RF module includes inductors, capacitors, signal lines, and power supply lines to semiconductor devices. It is advantageous to form the respective constituent layers from materials selected appropriate for their function.

For the constituent layers 500*d* to 500*d*, 500*g* constructing the antenna, strip lines and wiring in this example, it is preferred to use organic dielectric layers having a dielectric dissipation factor of 0.0025 to 0.0075 and a dielectric constant of 2.6 to 3.5. For the constituent layers 500*e* to 500*f* constructing capacitors, it is preferred to use second composite dielectric layers so as to give a dielectric dissipation factor of 0.0075 to 0.025 and a dielectric constant of 10 to 40. For the constituent layers 500*h* to 500*i* constructing the power supply line, it is preferred to use composite magnetic layers having a magnetic permeability of 3 to 20.

On the surface of constituent layers 500*a* to 500*i*, there are provided internal conductors 513, GND conductors 515, antenna conductors 573, and the like. Upper and lower internal conductors are connected by via holes 514. Electronic parts 561 are mounted on the surface, completing a RF module.

This construction enables to provide an appropriate dielectric constant, Q and dielectric dissipation factor for a distinct function, arriving at a high performance, small size, and thin part.

Example 22

Figure 58:
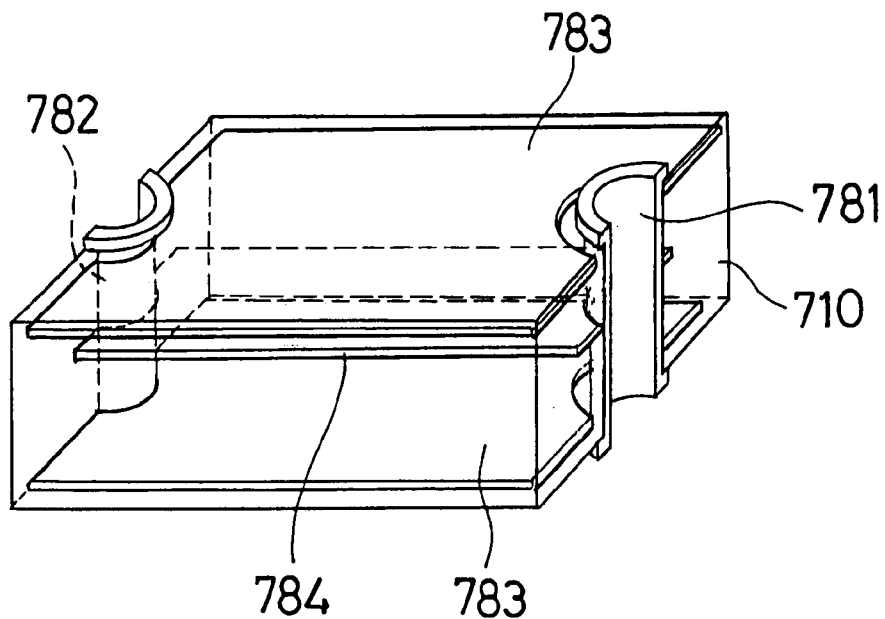
FIGS. 58 and 59 illustrate a resonator as one exemplary electronic part of the invention.
Figure 59:
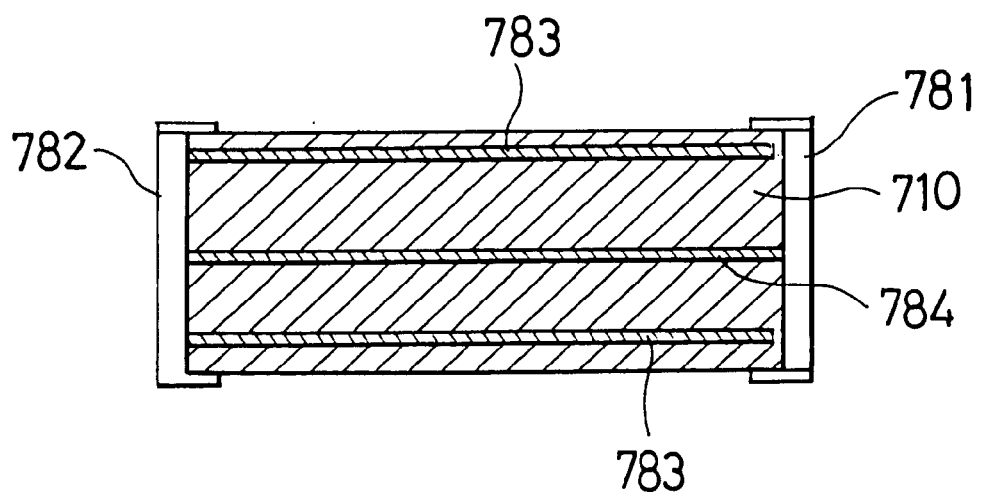

FIGS. 58 and 59 illustrate a strip resonator according to a 22nd embodiment of the invention. FIG. 58 is a see-through perspective view, and FIG. 59 is a cross-sectional view.

In FIGS. 58 and 59, the strip resonator includes an intermediate rectangular strip conductor 784, upper and lower rectangular GND conductors 783, and constituent layers 710 sandwiched therebetween. To the opposite ends of the strip conductor 784, a HOT terminal 781 and a GND terminal 782 for a resonator are formed and connected. The method of forming the remaining components is the same as in the inductor of Example 1.

With respect to the material of the constituent layers 710 of the resonator, desired resonant characteristics are available in a band of several hundreds of megahertz to several gigahertz when the dielectric constant is in the range of 2.6 to 40. Since it is desired to minimize the material loss of the resonator, a dielectric dissipation factor (tan δ) of 0.0025 to 0.0075 is preferred. Then a choice is preferably made of the above-mentioned organic dielectric layers or first or second composite dielectric layers.

Example 23

Figure 60:
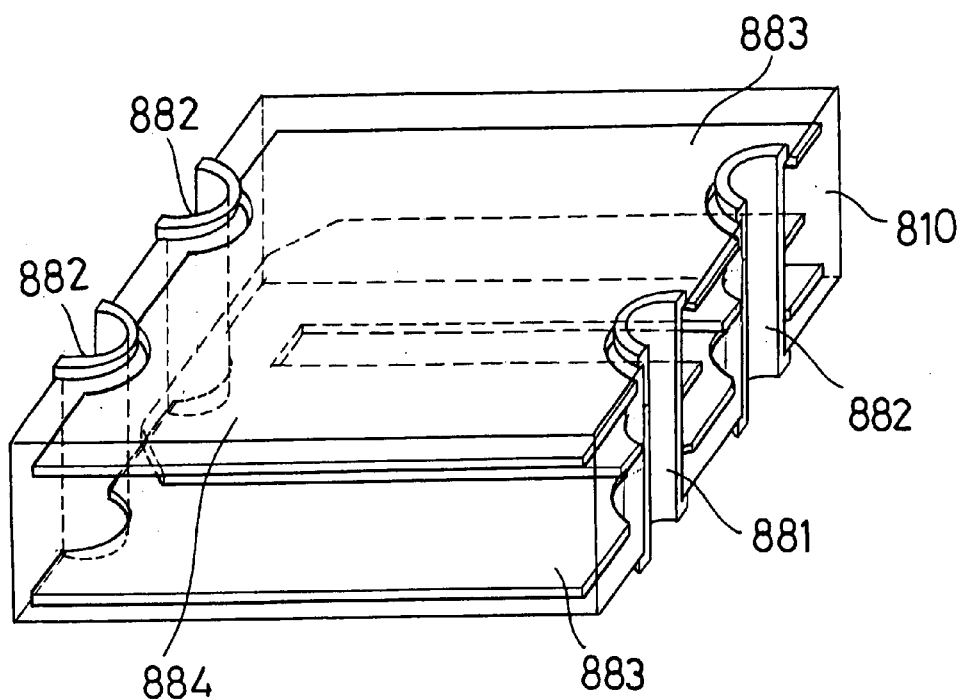
FIG. 60 illustrates a resonator as another exemplary electronic part of the invention.

FIG. 60 is a see-through perspective view of a strip resonator according to a 23rd embodiment of the invention.

Like Example 22, the strip resonator in FIG. 60 includes an intermediate U-shaped strip conductor 884, upper and lower rectangular GND conductors 883, and constituent layers 810 sandwiched therebetween. To the opposite ends of the strip conductor 884, a HOT terminal 881 and a GND terminal 882 for a resonator are formed and connected. The method of forming the remaining components is the same as in the inductor of Example 1.

With respect to the material of the constituent layers 810 of the resonator, desired resonant characteristics are available in a band of several hundreds of megahertz to several gigahertz when the dielectric constant is in the range of 2.6 to 40. Since it is desired to minimize the material loss of the resonator, a dielectric dissipation factor (tan δ) of 0.0025 to 0.0075 is preferred. Then a choice is preferably made of the above-mentioned organic dielectric layers or first or second composite dielectric layers.

Figure 61:
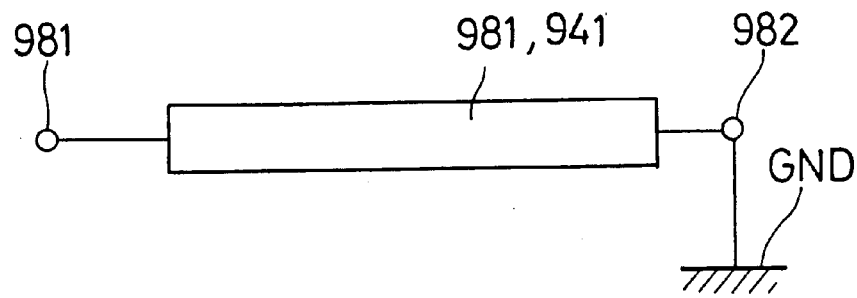
FIG. 61 is an equivalent circuit diagram of the resonator.

FIG. 61 is an equivalent circuit diagram of the resonators in the foregoing Examples 22 and 23. In the diagram, a HOT terminal 981 for the resonator is connected to one end of a resonator 984, 941 constructed by a coaxial path or strip line, and a GND terminal 982 is connected to the other end thereof.

Example 24

Figure 62:
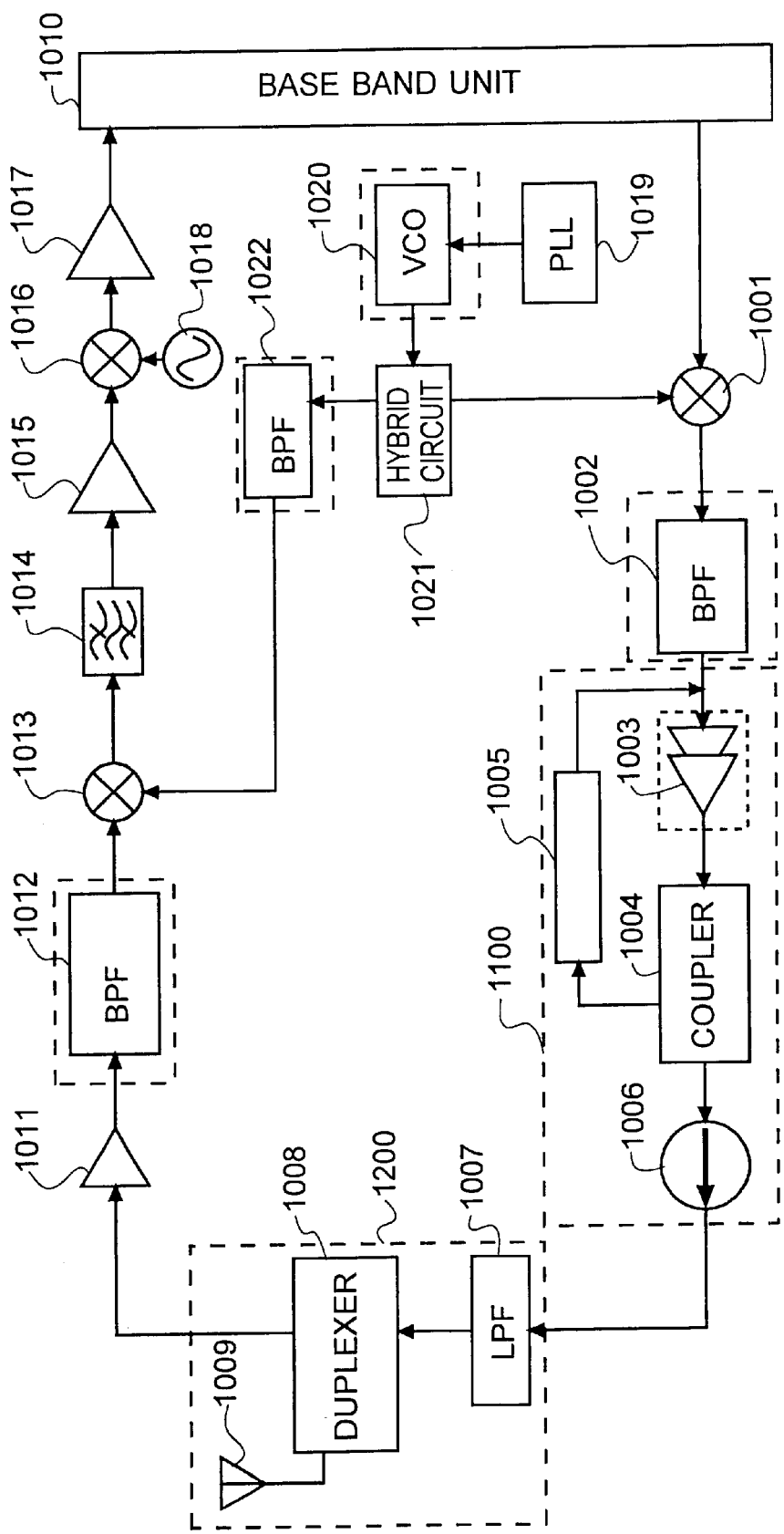
FIG. 62 is a block diagram showing a high-frequency portion of a portable equipment as one exemplary electronic part of the invention.

FIG. 62 is a block diagram showing a high-frequency portion of a portable terminal equipment according to a 24th embodiment of the invention.

In FIG. 62, a base band unit 1010 delivers a transmission signal to a mixer 1001 where the signal is mixed with an RF signal from a hybrid circuit 1021. A voltage controlled oscillator (VCO) 1020 is connected to the hybrid circuit 1021 to construct a synthesizer circuit with a phase lock loop circuit 1019 so that the hybrid circuit 1021 may deliver an RF signal of a predetermined frequency.

The transmission signal which has been RF modulated by the mixer 1001 is passed through a band-pass filter (BPF) 1002 and amplified by a power amplifier 1003. An output of the power amplifier 1003 is partially taken out of a coupler 1004, adjusted to a predetermined level by an attenuator 1005, and fed back to the power amplifier 1003 for adjusting so that the power amplifier may have a constant gain. The coupler 1004 delivers a transmission signal to a duplexer 1008 through an isolator 1006 for precluding reverse current and a low-pass filter 1007. The signal is transmitted from an antenna 1009 connected to the duplexer 1008.

An input signal received by the antenna 1009 is fed from the duplexer 1008 to an amplifier 1011 and amplified to a predetermined level. The received signal delivered from the amplifier 1011 is fed to a mixer 1013 through a band-pass filter 1012. The mixer 1013 receives an RF signal from the hybrid circuit 1021 whereby the RF signal component is removed to effect demodulation. The received signal delivered from the mixer 1013 is passed through a SAW filter 1014, amplified by an amplifier 1015, and fed to a mixer 1016. The mixer 1016 also receives a local transmission signal of a predetermined frequency from a local transmitter circuit 1018. The received signal is converted to a desired frequency, amplified to a predetermined level by an amplifier 1017 and sent to the base band unit 1010.

According to the invention, an antenna front end module 1200 including the antenna 1009, duplexer 1008, and low-pass filter 1007, and an isolator power amplifier module 1100 including the isolator 1006, coupler 1004, attenuator 1005 and power amplifier 1003 can be constructed as a hybrid module by the same procedure as above. Further, a unit including other components can be constructed as an RF unit as demonstrated in Example 21. BPF, VCO, etc. can be constructed in accordance with the procedures shown in Examples 9 to 11 and 18.

In addition to the above-exemplified electronic parts, the invention is also applicable by a similar procedure to coil cores, troidal cores, disk capacitors, lead-through capacitors, clamp filters, common mode filters, EMC filters, power supply filters, pulse transformers, deflection coils, choke coils, DC-DC converters, delay lines, diplexers, duplexers, antenna switch modules, antenna front end modules, isolator/power amplifier modules, PLL modules, front end modules, tuner units, directional couplers, double balanced mixers (DBM), power synthesizers, power distributors, toner sensors, current sensors, actuators, sounders (piezoelectric sound generators), microphones, receivers, buzzers, PTC thermistors, temperature fuses, ferrite magnets, etc.

In each of the foregoing Examples, any of flame retardants, for example, halides such as halogenated phosphates and brominated epoxy resins, organic compounds such as phosphate amides, and inorganic materials such as antimony trioxide and aluminum hydride may be added to the constituent layers.

Using any one of resinous substrates having improved high-frequency characteristics, magnetic substrates having improved high-frequency characteristics, and dielectric substrates having improved high-frequency characteristics, the invention provides high-frequency electronic parts having improved high-frequency characteristics and hence, improved overall electrical characteristics.

Japanese Patent Application No. 2000-163418 is incorporated herein by reference.

What is claimed is:

1. A multilayer electronic part comprising:
   constituent layers formed of composite materials including at least two layers, said at least two layers being different in a value of at least one of a dielectric constant, a quality factor, and a magnetic permeability; and
   a conductor layer formed on at least one composite material layer of said constituent layers, said conductor layer constructing a predetermined electric circuit.

2. The multilayer electronic part of claim 1, wherein said constituent layers comprise a frequency band of at least 100 MHZ.

3. The multilayer electronic part of claim 1, wherein said constituent layers include a layer comprising at least reinforcing fibers.

4. The multilayer electronic part of claim 1 wherein said constituent layers include at least one first composite dielectric layer in which a dielectric powder having a dielectric constant of 5 to 10,000 and a dielectric dissipation factor of 0.00002 to 0.01 is dispersed in an amount of 10 to 65% by volume such that the first composite dielectric layer has a dielectric constant of 5 to 20 and a dielectric dissipation factor of 0.0025 to 0.0075.

5. The multilayer electronic part of claim 4 wherein said constituent layers include at least one second composite dielectric layer in which a dielectric powder having a dielectric constant of 20 to 20,000 and a dielectric dissipation factor of 0.01 to 0.0001 is dispersed in an amount of 10 to 65% by volume such that the second composite dielectric layer has a dielectric constant of 10 to 40 and a dielectric dissipation factor of 0.0075 to 0.025.

6. The multilayer electronic part of claim 1 wherein said constituent layers include at least one composite magnetic layer in which a magnetic powder is dispersed in an amount of 10 to 65% by volume such that the composite magnetic layer has a magnetic permeability of 3 to 20.

7. The multilayer electronic part of claim 1, wherein said constituent layers include at least one layer comprising at least one flame retardant material.

* * * * *